United States Patent
Gao et al.

(10) Patent No.: US 11,465,129 B2
(45) Date of Patent: Oct. 11, 2022

(54) MICROWAVE ASSISTED AND LOW-TEMPERATURE FABRICATION OF NANOWIRE ARRAYS ON SCALABLE 2D AND 3D SUBSTRATES

(71) Applicant: University of Connecticut, Farmington, CT (US)

(72) Inventors: Pu-Xian Gao, Coventry, CT (US); Xingxu Lu, Storrs, CT (US); Son Hoang, Corona, NY (US)

(73) Assignee: UNIVERSITY OF CONNECTICUT, Farmington, CT (US)

( * ) Notice: Subject to any disclaimer, the term of this patent is extended or adjusted under 35 U.S.C. 154(b) by 607 days.

(21) Appl. No.: 16/465,969

(22) PCT Filed: Jun. 1, 2018

(86) PCT No.: PCT/US2018/035756
§ 371 (c)(1),
(2) Date: May 31, 2019

(87) PCT Pub. No.: WO2018/226543
PCT Pub. Date: Dec. 13, 2018

(65) Prior Publication Data
US 2019/0314790 A1    Oct. 17, 2019

Related U.S. Application Data

(60) Provisional application No. 62/515,802, filed on Jun. 6, 2017.

(51) Int. Cl.
*B01J 23/42* (2006.01)
*B01D 53/86* (2006.01)
(Continued)

(52) U.S. Cl.
CPC ............ *B01J 23/42* (2013.01); *B01D 53/864* (2013.01); *B01D 53/8628* (2013.01);
(Continued)

(58) Field of Classification Search
CPC .............. B01D 53/8628; B01D 53/864; B01D 53/944; C01G 23/003; C01G 23/0534;
(Continued)

(56) References Cited

U.S. PATENT DOCUMENTS 4,795,616 A   1/1989  Mondt et al.
7,115,305 B2  10/2006 Bronikowski et al.
(Continued)

FOREIGN PATENT DOCUMENTS

CN    101456580 B   1/2009
CN    102417201 A   4/2012
(Continued)

OTHER PUBLICATIONS

International Search Report and Written Opinion for Int'l Appl. No. PCT/US2018/035756, titled: Microwave Assisted and Low-Temperature Fabrication of Nanowire Arrays on Scalable 2D and 3D Substrates, dated Aug. 28, 2018.
(Continued)

*Primary Examiner* — James A Fiorito
(74) *Attorney, Agent, or Firm* — Ballard Spahr LLP

(57) ABSTRACT

A method of making a titanium dioxide nanowire array includes contacting a substrate with a solvent comprising a titanium (III) precursor, an acid, and an oxidant while microwave heating the solvent, thereby forming a hydrogen titanate $H_2Ti_2O_5 \cdot H_2O$ nanowire array. The hydrogen titanate nanowire array is annealed to form a titanium dioxide nanowire array. The substrate is seeded with titanium dioxide before starting the hydrothermal synthesis of the hydrogen titanate nanowire array. The titanium dioxide nanowire
(Continued)

array is loaded with a platinum group metal to form an exhaust gas catalyst. The titanium dioxide nanowire array can be used to catalyze oxidation of combustion exhaust.

35 Claims, 34 Drawing Sheets

(51) Int. Cl.
| | |
|---|---|
| B01D 53/94 | (2006.01) |
| B01J 21/06 | (2006.01) |
| B01J 35/00 | (2006.01) |
| B01J 35/04 | (2006.01) |
| B01J 37/02 | (2006.01) |
| B01J 37/08 | (2006.01) |
| B01J 37/18 | (2006.01) |
| B01J 37/34 | (2006.01) |
| C01G 23/00 | (2006.01) |
| C01G 23/053 | (2006.01) |
| F01N 3/20 | (2006.01) |
| F01N 3/28 | (2006.01) |
| B01J 35/10 | (2006.01) |
| B81C 1/00 | (2006.01) |
| B82Y 40/00 | (2011.01) |

(52) U.S. Cl.
CPC .......... *B01D 53/944* (2013.01); *B01J 21/063* (2013.01); *B01J 35/0013* (2013.01); *B01J 35/04* (2013.01); *B01J 37/0217* (2013.01); *B01J 37/0228* (2013.01); *B01J 37/0236* (2013.01); *B01J 37/08* (2013.01); *B01J 37/18* (2013.01); *B01J 37/343* (2013.01); *B01J 37/346* (2013.01); *C01G 23/003* (2013.01); *C01G 23/0534* (2013.01); *C01G 23/0538* (2013.01); *F01N 3/202* (2013.01); *F01N 3/281* (2013.01); B01D 2255/1021 (2013.01); B01D 2255/20707 (2013.01); B01D 2255/9207 (2013.01); *B01J 35/1004* (2013.01); *B81C 1/00031* (2013.01); *B82Y 40/00* (2013.01); C01P 2002/72 (2013.01); C01P 2002/82 (2013.01); C01P 2002/85 (2013.01); C01P 2002/88 (2013.01); C01P 2004/03 (2013.01); C01P 2004/04 (2013.01); C01P 2004/16 (2013.01); C01P 2006/12 (2013.01); F01N 2370/02 (2013.01); F01N 2570/10 (2013.01); F01N 2570/12 (2013.01); F01N 2570/14 (2013.01)

(58) Field of Classification Search
CPC ..... C01G 23/0538; F01N 3/202; F01N 3/281; B01J 23/42; B01J 21/063; B01J 35/0013; B01J 35/04; B01J 37/0217; B01J 37/0236; B01J 37/08; B01J 37/18; B01J 37/343; B01J 37/346
See application file for complete search history.

(56) References Cited

U.S. PATENT DOCUMENTS

| 8,704,210 | B2 | 4/2014 | Gao |
|---|---|---|---|
| 8,835,285 | B2 | 9/2014 | Grimes et al. |
| 9,855,549 | B2 | 1/2018 | Gao et al. |
| 2004/0175844 | A1 | 9/2004 | Yang et al. |
| 2005/0019799 | A1 | 1/2005 | Grasso et al. |
| 2005/0223969 | A1 | 10/2005 | Chen et al. |
| 2006/0270229 | A1 | 11/2006 | Corderman et al. |
| 2007/0273264 | A1 | 11/2007 | Choi et al. |
| 2007/0275499 | A1 | 11/2007 | Corderman et al. |
| 2009/0242416 | A1 | 10/2009 | Yun et al. |
| 2010/0180950 | A1 | 7/2010 | Gao et al. |
| 2010/0230286 | A1 | 9/2010 | Lifchits |
| 2013/0034472 | A1 | 2/2013 | Cantrell et al. |
| 2013/0175499 | A1 | 7/2013 | Gao |
| 2014/0256534 | A1 | 9/2014 | Gao et al. |
| 2015/0258531 | A1 | 9/2015 | Gao et al. |
| 2020/0030774 | A1 | 1/2020 | Gao et al. |
| 2020/0061591 | A1 | 2/2020 | Gao et al. |

FOREIGN PATENT DOCUMENTS

| EP | 1 015 384 | 7/2005 |
|---|---|---|
| KR | 10-2007-0113763 A | 11/2007 |
| WO | WO 2006/138071 A1 | 12/2006 |
| WO | 2012052624 A1 | 4/2012 |
| WO | WO 2012/052624 A1 | 4/2012 |
| WO | WO 2013/049606 A2 | 4/2013 |
| WO | WO 2014/043514 A1 | 3/2014 |
| WO | WO 2018/223054 A1 | 12/2018 |
| WO | WO 2018/223099 A1 | 12/2018 |
| WO | WO 2018/226543 A1 | 12/2018 |

OTHER PUBLICATIONS

Andonova, S.M., et al., "Fine-Tuning the Dispersion and the Mobility of BaO Domains on $NO_x$ Storage Materials via $TiO_2$ Anchoring Sites," *J. Phys. Chem.*, 114: 17003-17016 (2010).

Banerjee, "Reduction kinetics of porous zinc oxide pellet with $CO$—$N_2$ gas mixture," *Mineral Processing and Extractive Metallurgy: Transactions of the Institution of Mining and Metallurgy, Section C*, vol. 117, No. 4, pp. 221-230 (Dec. 2008).

Buonsanti, R., et al., "Nonhydrolytic Synthesis of High-Quality Anisotropically Shaped Brookite $TiO_2$ Nanocrystals," *J. Am. Chem. Soc.*, 130: 11223-11233 (2008).

Chen, C.A. et al., "Growth and characterization of well-aligned densely-packed rutile $TiO_2$ nanocrystals on sapphire substrates via metal-organic chemical vapor deposition," *Nanotechnology*, 19: 075611, 6 pages (2008).

Chen, S.Y., et al., "Formation of Core/Shell-Type $ZnO/CeO_2$ Nanorods and $CeO_2$ Nanotube Arrays by Aqueous Synthesis and Wet-Etching," *Advanced Science Letters*, 1: 123-127 (2008).

Chung, et al., "Structural and optical properties of Be-doped ZnO nanocrystalline films by pulsed laser deposition," *Thin solid films*, 516: 4190-4193 (2007).

Despres, J., et al., "Storage of $NO_2$ on $BaO/TiO_2$ and the influence of NO," *Applied Catalysis B: Environmental*, 43: 389-395 (2003).

Du, S., et al., "Cu-Decorated ZnO Nanorod Array Integrated Structured Catalysts for Low-Pressure $CO_2$ Hydrogenation to Methanol," *Advanced Materials Interfaces*, 5, 11 pages (2018).

Feng, X., et al., "Vertically Aligned Single Crystal $TiO_2$ Nanowire Arrays Grown Directly on Transparent Conducting Oxide Coated Glass: Synthesis Details and Applications," *Nano Letters*, 8(11): 3781-3786 (2008).

Feng, Y., et al., "Hydrothermal synthesis and automotive exhaust catalytic performance of $CeO_2$ nanotube arrays," *J. of Materials Chemistry*, 21(39): 15442-15448 (Sep. 6, 2011).

Fierro, G., et al., "A Study of Anomalous Temperature-Programmed Reduction Profiles of $Cu_2O$, CuO, and CuO—ZnO Catalysts," *Journal of Catalysis*, 148: 709-721 (1994).

Gao, P.X., et al., "Nanowire Piezoelectric Nanogenerators on Plastic Substrates as Flexible Power Sources for Nanodevices," *Adv. Mater.*, 19: 67-72 (2007).

Gayen, R. et al., "Zinc magnesium oxide nanofibers on glass substrate by solution growth technique," *Journal of Crystal Growth*, 310: 4073-4080 (2008).

Guo, Y., et al., "Ultrahigh Surface Area Titanium Dioxide Nanorod Arrays Rooted on Monoliths." Poster presentation at 22nd North American Catalysis Society Meeting, Detroit, Michigan (Jun. 5-10, 2011).

Guo, Y., et al., "Single crystalline brookite titanium dioxide nanorod arrays rooted on ceramic monoliths: A hybrid nanocatalyst support

(56) References Cited

OTHER PUBLICATIONS with ultra-high surface area and thermal stability," *Crystengcomm*, vol. 15, No. 41: 8345-8352 (Aug. 19, 2013).
Guo, Y., et al., "Robust 3-D configurated metal oxide nano-array based monolithic catalysts with ultrahigh materials usage efficiency and catalytic performance tunability," *Nano Energy*, 2: 873-881 (2013).
Han, et al., "Transition Metal Oxide Core-Shell Nanowires: Generic Synthesis and Transport Studies," *Nano Letters 2004*, vol. 4, No. 7., pp. 1241-1246 (2004).
Hoang, S., et al., "High performance diesel oxidation catalysts using ultra-low Pt loading on titania nanowire array integrated cordierite honeycombs," *Catalysis Today*, Nov. 1, 2017.
Hosono, E., et al., "Growth of Submicrometer-Scale Rectangular Parallelepiped Rutile $TiO_2$ Films in Aqueous $TiCl_3$ Solutions under Hydrothermal Conditions," *J. Am. Chem. Soc.* 126: 7790-7791 (2004).
Hsu, H.C., et al., "Band gap engineering and stimulated emission of ZnMgO nanowires," *Applied Physics Letters*, 89: 3 pages (2006).
Hu, W., et al., "High-Quality Brookite $TiO_2$ Flowers: Synthesis, Characterization, and Dielectric Performance," *Crystal, Growth and Design*, 9(8): 3676-3682 (2009).
Hwang, D.K., et al., "Effects of deposition temperature on the properties of $Zn_{1-x}Mg_xO$ thin films," *Applied Surface Sciences*, 225: 217-222 (2004).
Jian, D., et al., "Synthesis, characterization, and photocatalytic properties of ZnO/(La,Sr)CoO$_3$ composite nanorod arrays," *J. Mater. Chem.*, 19: 970-975 (2009).
Jiang, S., et al., "High-performance binder-free supercapacitor electrode by direct growth of cobalt-manganese composite oxide nansostructures on nickel foam," *Nanoscale Research Letters*, 9: 492, 8 pages (2014).
Joshi, et al., "Au Decorated Zinc Oxide Nanowires for CO Sensing," *J. Phys. Chem. C.*, 113: 16199-16202 (2009).
Kar, J.P., et al., "Fabrication and characterization of vertically aligned ZnMgO/ZnO nanowire arrays," *Materials Science and Engineering B*, 147: 74-78 (2008).
Kim, "Calculation of Formation Energy of Oxygen Vacancy in ZnO Based on Photoluminescence Measurements," *J. Phys. Chem. B*, 114: 7874-7878 (2010).
Kim, C. H., et al., "Strontium-Doped Perovskites Rival Platinum Catalysts for Treating $NO_x$ in Simulated Diesel Exhaust," *Science*, 327: 1624-1626 (2010).
Kling, R., et al., "Analysis of ZnO and ZnMgO nanopillars grown by self-organization," *Nanotechnology*, 15: 1043-1046 (2004).
Li, L., et al., "One-dimension $MnCO_2O_4$ nanowire arrays for electrochemical energy storage," *Electrochimica Acta*, 116: 467-474 (2014).
Lin, C, et al., "Effect of Calcination Temperature on the Structure of a Pt/$TiO_2$ (B) Nanofiber and Its Photocatalytic Activity in Generating $H_2$," *Langmuir*, 24: 9907-9915 (2008).
Liu, W., et al., "The deposition and annealing study of MOCVD ZnMgO," *Journal of Crystal Growth*, 227: 416-421 (2005).
Liu, B. et al., "Oriented single crystalline titanium dioxide nanowires," *Nanotechnology*, 19(50): 505604 (2008).
Lorenz, M., et al., "$Mg_xZn_{1-x}O(<x<0.2)$ nanowire arrays on sapphire grown by high-pressure pulsed-laser deposition," *Applied Physics Letters*, 86: 3 pages (2005).
Ohtomo, A., et al., "Structure and optical properties of ZnO/$Mg_{0.2}Zn_{0.8}O$ superlattices," *Applied Physics Letters*, 75(7): 980-982 (1999).
Plank, et al., "A simple low temperature synthesis route for ZnO—MgO core-shell nanowires," *Nanotechnology*, 19, 8 pages, 465603 (2008).
Qiu, M., et al., "Facile preparation of ordered mesoporous $MnCo_2O_4$ for low-temperature selective catalytic reduction of NO with $NH_3$," *Nanoscale*, 7: 2568-2577 (2015).
Satterfield, C.W., *Heterogeneous Catalysis in Industrial Practice*, 2nd Edition, McGraw-Hill, Inc., New York, 1991.
Shaikh, et al., "Thermal conductivity of an aligned carbon nanotube array," *Carbon*, 45: 2608-2613 (2007).
Shan, et al., "A Simple Route to Porous ZnO and ZnCdO Nanowires," *J. Phys. Chem. B*, 110: 11176-11179 (2006).
Shimpi, P., et al., "Annealing induced nanostructure and photoluminescence property evolution in solution-processed Mg-Alloyed ZnO nanowires," *Applied Physics Letters*, 97: 103104, 3 pages (2010).
Shimpi, P., et al., "Low temperature synthesis and characterization of MgO/ZnO composite nanowire arrays," *Nanotechnology*, 20: 125608, 1-8 (2009).
Sridharan, K., et al., "Anomalous growth of multi-phased and multi-dimensional Manganese oxide-Metal (Fe, Co and Ni) oxide nanostructures: Synthesis and optical limiting properties," *Journal of Alloys and Compounds*, 611: 82-90 (2014).
Tang, et al., "ZnO nanowires grown along the non-polar direction," *Materials Letters*, 62: 1393-1395 (2007).
Tang, W., et al., "Synergistic Effects in Porous Mn—Co Mixed Oxide Nanorods Enhance Catalytic Deep Oxidation of Benzene," *Catal Lett*, 144: 1900-1910 (2014).
Tang, W., et al., "Scalable Integration of Highly Uniform $Mn_xCo_{3-x}O_4$ Nanosheet Array onto Ceramic Monolithic Substrates for Low-Temperature Propane Oxidation," *ChemCatChem*, 9: 4112-4119 (2017).
Tang, W., et al., "Pre-surface leached corierite honeycombs for $Mn_xCO_{3-x}O_4$ nano-sheet array integration with enhanced hydrocarbons combustion," *Catalysis Today*, Nov. 1, 2017.
Wang, G., et al., "Growth and properties of ZnO/Hexagonal ZnMgO/Cubic ZnMgO nanopagoda heterostructures," *J. Phys. D: Appl. Phys.*, 40: 5287-5290 (2007).
Wang, Q., et al., "Compacted nanoscale sensors by merging ZnO nanorods with interdigitated electrodes," Proc. of SPIE 8031, Micro- and Nanotechnology Sensors, Systems, and Applications III, 80312J (2011).
Wang, Y., et al., "Preparation of Tractable Platinum, Rhodium, and Ruthenium Nanoclusters with Small Particle Size in Organic Media," *Chem. Matter.*, 12(6): 1622-1627 (2000).
Williams, J.L., "Monolith structures, materials, properties and uses," *Catalysis Today*, 69: 3-9 (2001).
Xie, X., et al., "Low-temperature oxidation of CO catalyzed by $Co_3O_4$ Nanorods," *Nature*, 458: 746-749 (2009).
Yu, L., et al., "Controlled synthesis of hierarchical $Co_xMn_{3-x}O_4$ array micro-/nanostructures with tunable morphology and composition as integrated electrodes for lithium-ion batteries," *Energy & Environmental Science*, 6: 2664-2671 (2013).
Yuhas, et al., "Transition-Metal Doped Zinc Oxide Nanowires," *Angew. Chem.*, 118: 434-437 (2006).
Zhang, "One-dimensional metal oxide nanostructures for heterogeneous catalysis," *Nanoscale*, 5: 7175 (2013).
Zhang, Z., et al., "In situ TPR Removal: a generic method for fabricating tubular array devices with mechanical and structural soundness, and functional robustness on various substrates," *J. of Materials Chemistry*, 22(43): 23098-23105 (Sep. 6, 2012).
Zhou, H.P., et al., "Thermally Stable Pt/$CeO_2$ Hetero-Nanocomposities with High Catalytic Activity," *J. Am. Chem. Soc.*, 132(14): 4998-4999 (2010).
Zhu, "Perovskite oxide nanotubes: synthesis, structural characterization, properties and applications," *Journal of Materials Chemistry*, 20: 4015-4030 (Feb. 2010).
Zhu, L., et al., "Catalyst-free two-step growth of quasialigned ZnMgO nanorods and their properties," *Applied Physics Letters*, 88: 3 pages (2006).
International Application No. PCT/US2018/035756 International Search Report and the Written Opinion for application titled "Microwave Assisted and Low-Temperature Fabrication of Nanowire Arrays on Scalable 2D and 3D Substrates" dated Aug. 28, 2018.
Feng et al., "Vertically Aligned Single Crystal TiO2 Nanowire Arrays Grown Directly on Transparent Conducting Oxide Coated Glass: Synthesis Details and Applications", Nano Leters, 8(11):3781-3786; Nov. 12, 2008.

(56) References Cited

OTHER PUBLICATIONS

Guo et al., "Robust 3-D Configured Metal Oxide Nano-Array Based Monolithic Catalysts with Ultrahigh Materials Usage Efficiency and Catalytic Performance Tunability", Nano Energy, 2(5):873-881; Sep. 1, 2013.
Hoang et al., "High Performance Diesel Oxidation Catalysts Using Ultra-Low Pt Loading on Titania Nanowire Array Integrated Cordierite Honeycombs", Catalysis Today, pp. 1-9, Nov. 1, 2017.
Lin et al., "Effect of Calcination Temperature on the Structure of a Pt/TiO2 (B) Nanofiber and Its Photocatalytic Activity in Generating H2", Langmuir, 24(17):9907-9915, Sep. 2, 2008.
Liu et al., "Oriented single crystalline titanium dioxide nanowires," Nanotechnology, vol. 19, No. 50, Dec. 17, 2008.
International Preliminary Report on Patentability for Int'l Appl. No. PCT/US2018/035756, entitled "Microwave Assisted and Low-Temperature Fabrication of Nanowire Arrays on Scalable 2D and 3D Substrates," dated Dec. 19, 2019.

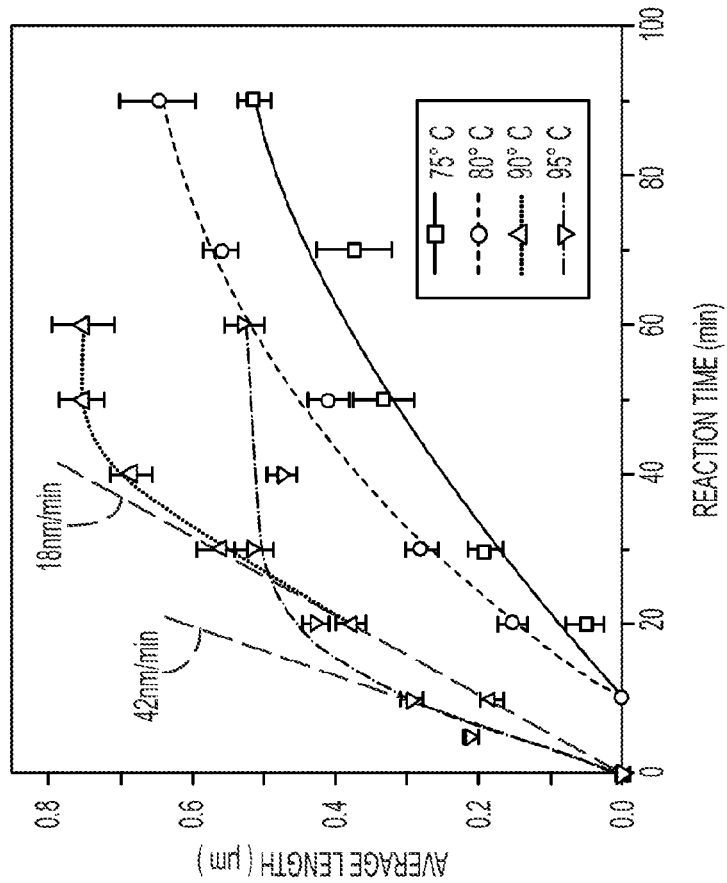
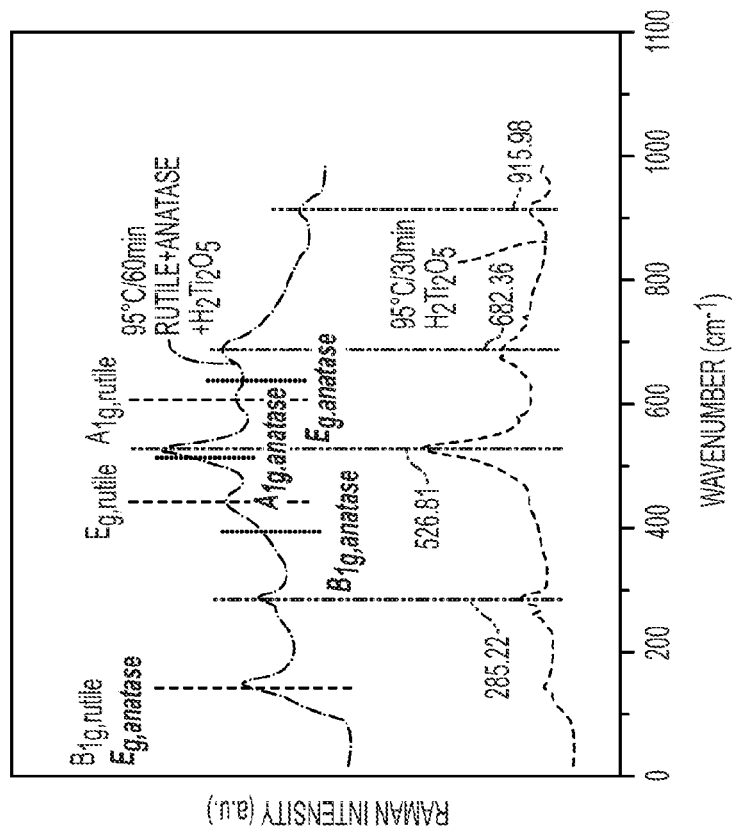
FIG. 5A
FIG. 5B

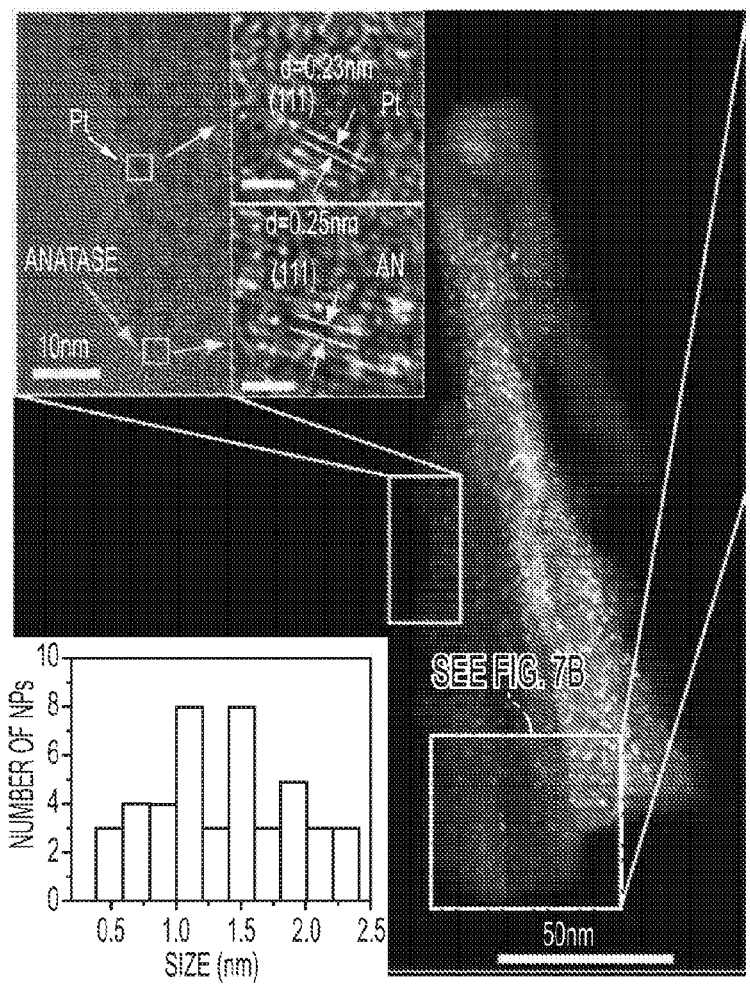
FIG. 7A
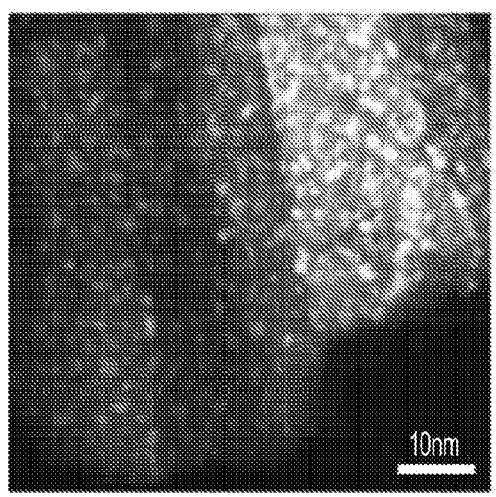 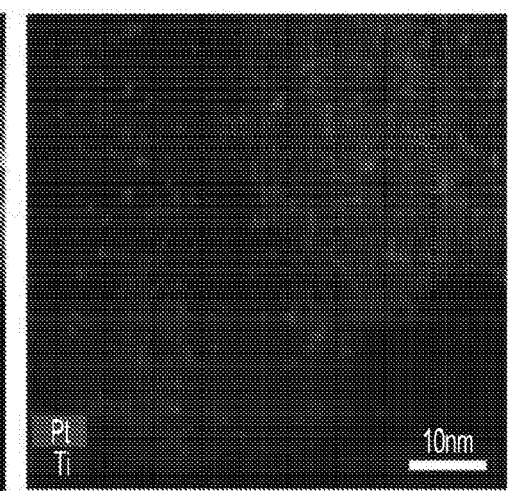
FIG. 7B FIG. 7C

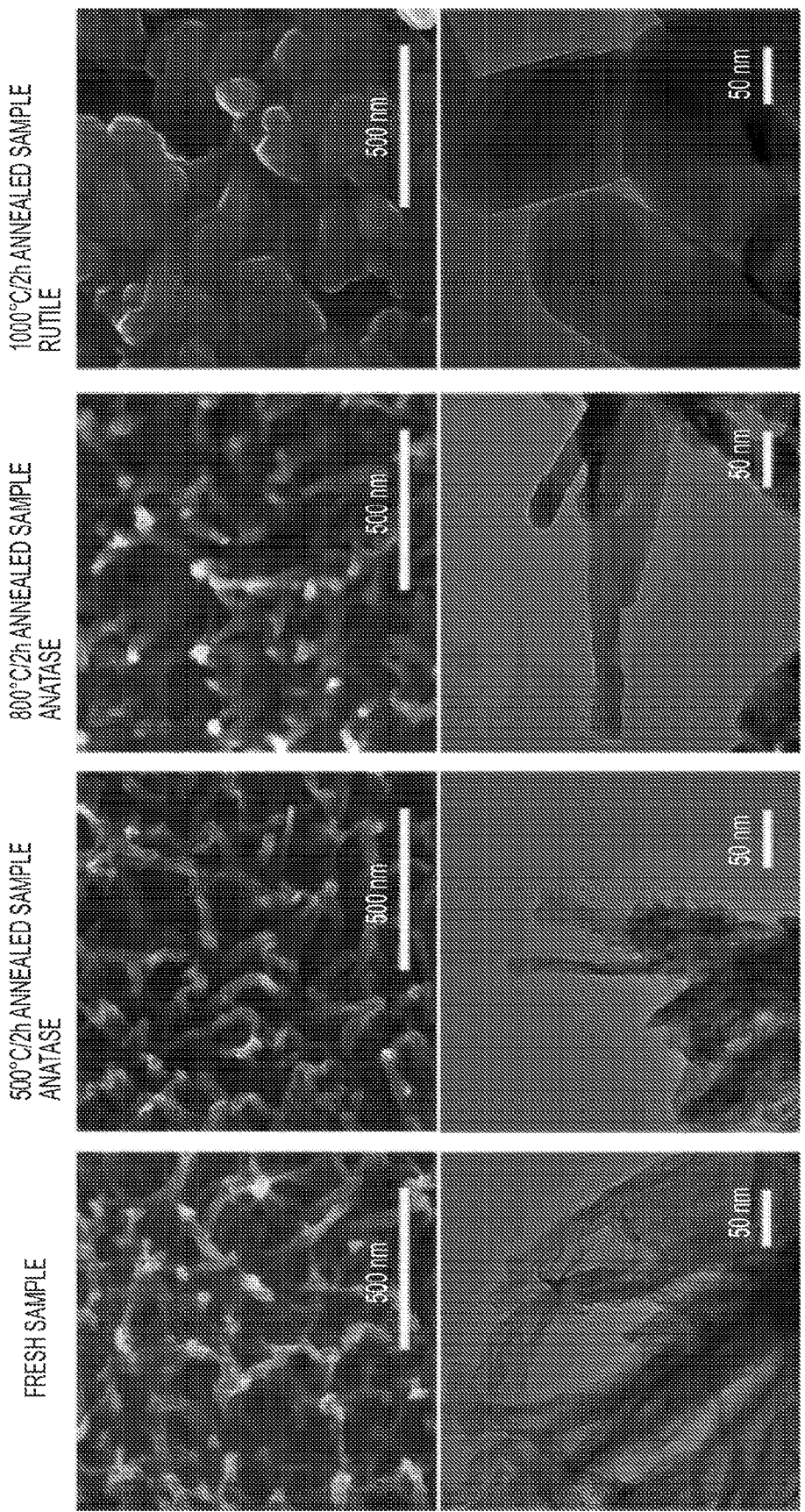

| | TOP VIEW | CROSS-SECTIONAL VIEW |
|---|---|---|
| RT-1<br>0.20 wt.% TiCl₃ | 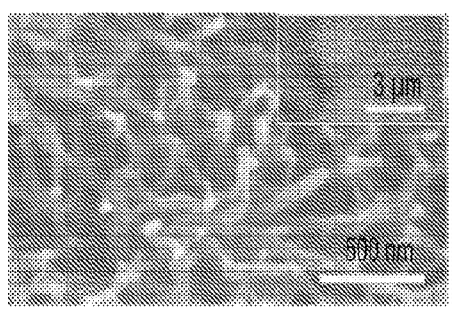<br>FIG. 14A | <br>FIG. 14B |
| RT-2<br>0.35 wt.% TiCl₃ | 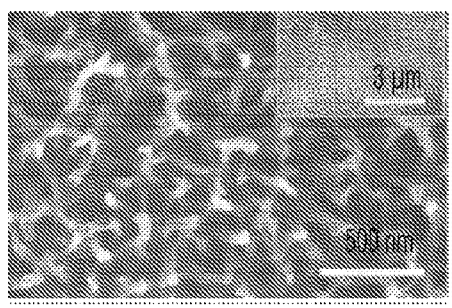<br>FIG. 14C | <br>FIG. 14D |
| RT-3<br>0.50 wt.% TiCl₃ | 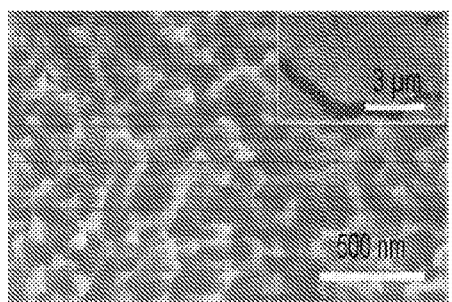<br>FIG. 14E | <br>FIG. 14F |
| RT-4<br>0.70 wt.% TiCl₃ | 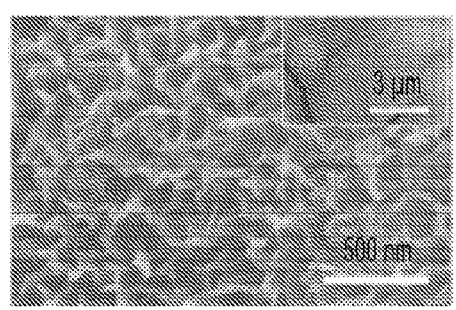<br>FIG. 14G | 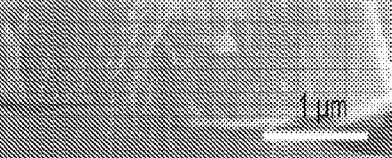<br>FIG. 14H |

| TOP VIEW | CROSS-SECTIONAL VIEW |
RO-1
0 mL H₂O₂
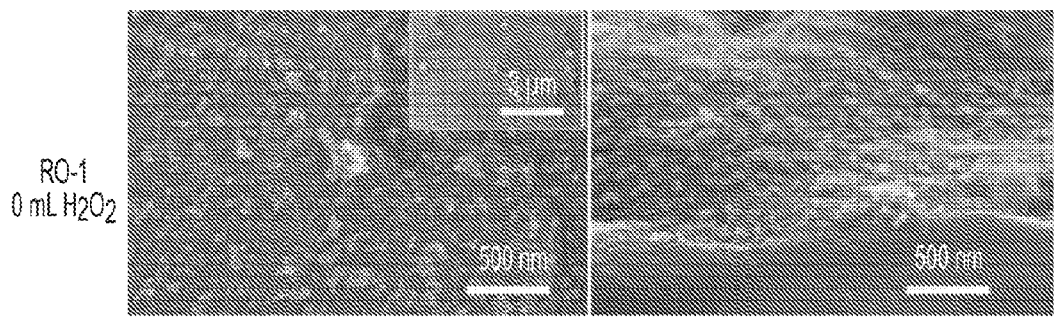
FIG. 15A  FIG. 15B
RO-2
9 mL H₂O₂
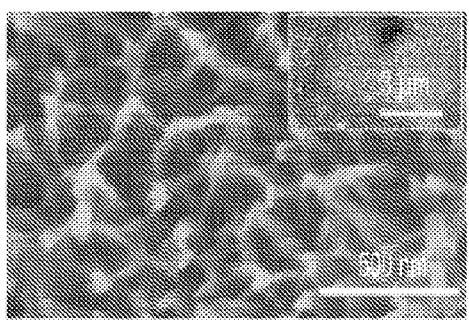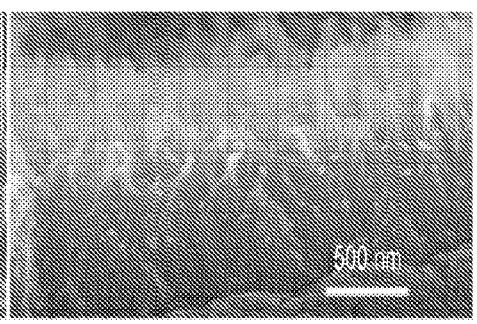
FIG. 15C  FIG. 15D
RO-3
15 mL H₂O₂
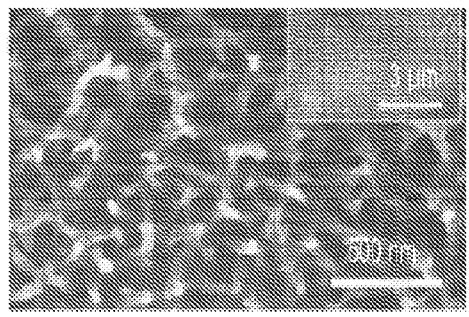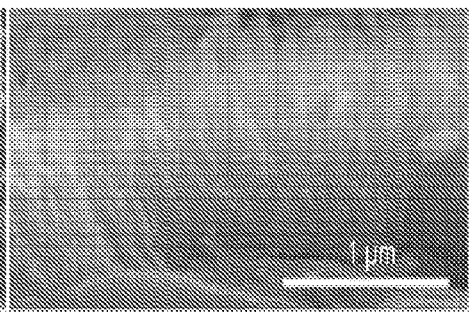
FIG. 15E  FIG. 15F
RO-4
20 mL H₂O₂
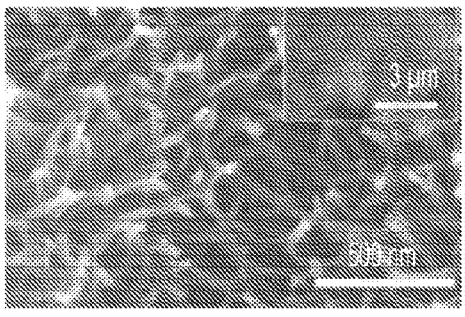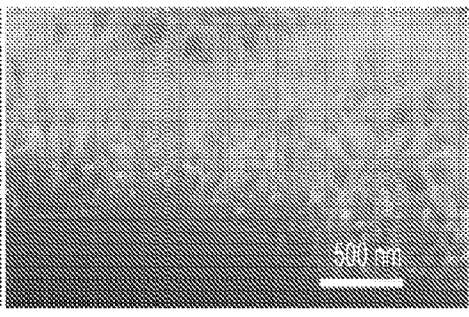
FIG. 15G  FIG. 15H

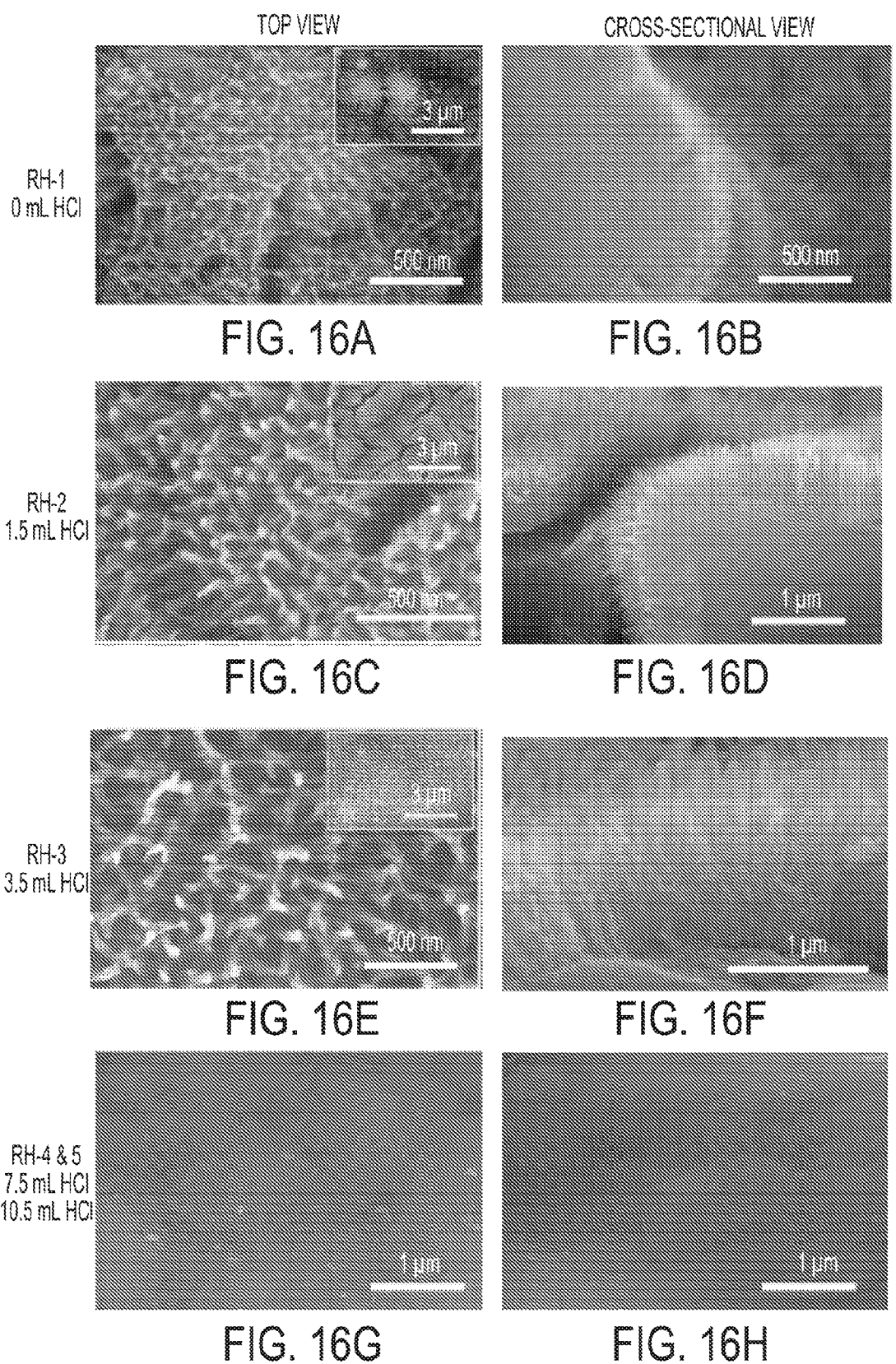

| SAMPLE | BET SURFACE AREA ($m^2 g^{-1}$) |
|---|---|
| $TiO_2$ NA | 92.3 |
| $Pt/TiO_2$ NA | 7.7 |
| HT AGED $Pt/TiO_2$ NA | 6.1 |

MICROWAVE ASSISTED AND LOW-TEMPERATURE FABRICATION OF NANOWIRE ARRAYS ON SCALABLE 2D AND 3D SUBSTRATES

RELATED APPLICATION

This application is the U.S. National Stage of International Application No. PCT/US2018/035756, filed Jun. 1, 2018, which designates the U.S., published in English, and claims the benefit of U.S. Provisional Application No. 62/515,802, filed on Jun. 6, 2017. The entire teachings of the above applications are incorporated herein by reference.

GOVERNMENT SUPPORT

This invention was made with government support under Grant No. CBET-1344792 from the United States National Science Foundation; and Grant No. DE-EE0006854 from the United States Department of Energy. The government has certain rights in the invention.

BACKGROUND

Combustion exhaust, particularly from diesel combustion, contributes to emission of a variety of gases, including carbon monoxide (CO), nitric oxide (NO), and hydrocarbons. Such gases are emitted from a variety of diesel engines, such as automobiles, marine engines, and generators. Catalysts are employed to catalyze oxidation of these gases, but traditional solvothermal processes can require heating to temperatures from about 150° C. to about 200° C. for about 5-10 hours.

Additional background information is provided U.S. Patent Publication No. 2014/0256534 and U.S. Pat. No. 9,561,494.

SUMMARY

The disclosure contained herein is in the general field of nanostructured materials comprising metal oxides, for example, nanostructured arrays comprising titanium dioxide.

Disclosed herein is a method of making a hydrogen titanate ($H_2Ti_2O_5.H_2O$) nanowire array. The method can include contacting a substrate with a solvent comprising a titanium (III) precursor, an acid, and an oxidant while microwave heating the solvent, thereby forming a hydrogen titanate ($H_2Ti_2O_5.H_2O$) nanowire array. The substrate can be a cordierite honeycomb monolith. The solvent can be a polar solvent. The solvent can be a protic solvent. The solvent can be water. The titanium (III) precursor can be $TiCl_3$. The titanium (III) precursor can be $Ti_2(SO_4)_3$. The titanium (III) precursor can be a titanium (III) alkoxide. The acid can be hydrochloric acid (HCl). The acid can be from about 25 wt. % to about 40 wt. % HCl. The acid can be sulfuric acid ($H_2SO_4$). The oxidant can be hydrogen peroxide. The hydrogen peroxide can be from about 20 wt. % to about 40 wt. % in water.

The solvent can be heated by microwave heating to a temperature from about 75° C. to about 95° C. The solvent can be heated by microwave heating for a duration from about 10 minutes to about 180 minutes.

The method can further include annealing the hydrogen titanate nanowire array to form a $TiO_2$ nanowire array. Annealing can be performed at a temperature from about 300° C. to about 800° C.

The solvent can be a second solvent, and the method further include contacting the substrate with a first solvent that includes a titanium (IV) precursor and a first acid prior to contacting the substrate with the second solvent. The method can further include sonicating while contacting the substrate with the first solvent.

The titanium (IV) precursor can include one or more of titanium (IV) isopropoxide, titanium (IV) n-butoxide, and titanium (IV) chloride. The titanium (IV) precursor can include titanium (IV) isopropoxide.

The first solvent can be a polar solvent. The first solvent can be a protic solvent. The first solvent can be an alcohol. The first solvent can be ethanol. The first acid can be $HNO_3$. The method can further include drying the substrate after contacting the substrate with the first solvent, and subsequently contacting the substrate with the first solvent prior to contacting the substrate with the second solvent. The method can further include annealing the substrate after contacting the substrate with the first solvent and prior to contacting the substrate with the second solvent.

Described herein is a method of loading a platinum group metal onto a titanium dioxide ($TiO_2$) nanowire array. The method can include contacting the $TiO_2$ nanowire array with a third solvent comprising a platinum group metal precursor, wherein the platinum group metal precursor comprises one or more of platinum, palladium, and rhodium; drying the $TiO_2$ nanowire array; calcining the $TiO_2$ nanowire array; and annealing the $TiO_2$ nanowire array in the presence of hydrogen. The platinum group metal precursor can include platinum, such as platinum (II). The platinum group metal precursor include tetraammineplatinum (II) nitrate. The method can further include sonicating while contacting the $TiO_2$ nanowire array with the third solvent. The method can further include contacting the $TiO_2$ nanowire array with a third solvent, drying the $TiO_2$ nanowire array, and calcining the $TiO_2$ nanowire array a plurality of times prior to annealing the $TiO_2$ nanowire array.

Described herein is a titanium dioxide ($TiO_2$) nanowire array made by any of the methods described herein.

Described herein is a method of oxidizing a combustion exhaust. The method can include contacting a source of combustion exhaust with a titanium dioxide ($TiO_2$) nanowire made by any of the methods described herein. The combustion exhaust can include one or more of carbon monoxide (CO), nitric oxide (NO), and hydrocarbons, such as ethylene, propylene, propane, and methane. The source of combustion exhaust can be diesel combustion exhaust. The diesel combustion exhaust can be emitted from a land-based vehicle (e.g., a car or a truck), a water-based vessel (e.g., a boat or a ship), a diesel-fueled power plant, a diesel generator, or a diesel-fueled power plant.

In this work, we report a facile microwave-assisted hydrothermal method for the synthesis and manufacturing of $H_2Ti_2O_5.H_2O$ and $TiO_2$ based nanostructure arrays (nano-arrays) rooted honeycomb monoliths for high performance automotive catalytic converters. A two-step sustained-release reaction strategy was designed to achieve the heterogeneous nucleation and growth of $H_2Ti_2O_5.H_2O$ nano-arrays on cordierite honeycomb channel surfaces, which can be converted to $TiO_2$ nano-arrays through post annealing at a temperature range of 300-800° C. Using $TiCl_3$ as the titanium source, $H_2O_2$ as the oxidizer to promote the oxidation of $Ti^{3+}$, and hydrochloride acid to control the hydrolysis rate in solution, a growth rate of 42 nm/min was achieved, rivaling the highest growth rate (17.5 nm/min) reported in literature. This approach provides a new pathway for the low-temperature scalable synthesis and manufacturing of $TiO_2$ nano-array integrated catalytic reactors with good production rates and enhanced material utilization efficiency. With 50 $g/ft^3$ Pt loading, the $TiO_2$ nano-array integrated monoliths have been demonstrated with excellent low light-off temperatures for CO and HCs as low as below 150° C. under simulated exhaust conditions. After sonication in water for 4 hours and hydrothermal aging at 700° C. for 100 hours, few changes of the light-off temperatures were observed on the sonicated samples, and a small increase of ~50° C. was found on the hydrothermal aged samples in comparison with the fresh samples. This new type of robust and efficient nano-array integrated automotive catalytic converters could be a promising candidate for low temperature automotive emission control devices.

Disclosed herein are methods for microwave-assisted, low-temperature fabrication of $H_2Ti_2O_5.H_2O$ and $TiO_2$ nanostructured films on scalable 2D and 3D substrates.

A facile, scalable, low cost hydrothermal method for microwave-assisted and low-temperature fabrication of $H_2Ti_2O_5.H_2O$ and $TiO_2$ nano-arrays on scalable 2D and 3D substrates is disclosed herein. The resulting improved materials have a wide range of applications.

The $TiO_2$ nano-arrays disclosed herein can be used as support for the catalytic active materials on 3D monolithic catalysts, which are the essential parts of catalytic reactors for automotive emission control systems, such as, diesel oxidation catalysts (DOC), diesel particulate filters (DPF) and $NO_x$ storage/reduction (NSR). $TiO_2$ nano-array supported 3D monolithic catalyst materials can also be used for indoor air purification and water filtration.

The $H_2Ti_2O_5.H_2O$ and $TiO_2$ nano-arrays supported active materials disclosed herein can be integrated onto various 2D and 3D substrates, such as silicon, glass, ceramic and polymer substrates, and thereby used as gas sensor devices for monitoring the toxic air pollutants such as $SO_2$, CO, $NO_2$, and volatile organic compounds originating from various sources in the environment. The $H_2Ti_2O_5.H_2O$ and $TiO_2$ nano-arrays integrated on 2D and 3D substrates disclosed herein can be directly used as catalytic devices in a variety of applications and products in the environmental and energy fields, including self-cleaning surfaces, air and water purification systems, sterilization, hydrogen evolution, and photoelectrochemical conversion.

In other examples of application of titanium dioxide nano-arrays made as disclosed herein, photoanodes in high-efficiency dye-sensitized solar cells (DSCs) are composed of $TiO_2$ anatase nanoparticles because of their large surface area for the loading of dye molecules. There are numerous grain boundaries in these $TiO_2$ nanoparticles, leading to faster charge recombination at the $TiO_2$/electrolyte interface. To increase the electron mobility, 1D $TiO_2$ nano-arrays are directly grown on transparent, conductive fluorine-doped tin oxide (FTO) glass to provide direct pathways for electron transport and to suppress charge recombination.

$H_2Ti_2O_5.H_2O$ and $TiO_2$ nano-arrays made as disclosed herein can also be used as a photoanode for photoelectrochemical (PEC) water splitting. Currently, the solar-to-hydrogen (STH) efficiency of $TiO_2$ nanoparticles is substantially limited by its large band gap energy and usually fast electron-hole recombination due to a high density of trap states. 1D $TiO_2$ nano-array photoanodes made as disclosed herein, however, with large surface area and short diffusion distance for photogenerated minority carriers are able to facilitate the charge separation and, thus, reduce the loss due to electron-hole recombination.

For synthesis of $H_2Ti_2O_5.H_2O$ and $TiO_2$ nano arrays, the current state of the art method is to use solvothermal method under high temperature and high pressure with long reaction times, which is very energy and time consuming, low in production rate, and difficult to achieve industrial-scale fabrication.

For fabrication of monolithic catalysts, the current state of the art method is to create a supporting layer for the catalytically active material on channel walls of 3D cordierite honeycomb substrates through use of a wash-coating procedure. $\gamma$-$Al_2O_3$ is the most widely used as washcoat material, and Pt, Pd and Rh are the major catalytic active materials for auto emission control. There are a number of known problems with wash-coating methods including: (i) the less-than-ideal wash-coating process usually does not ensure uniform catalyst deposition with precisely and optimally controlled microstructures, therefore compromising materials utilization efficiency; and (ii) the compromised materials utilization efficiency then results in a heavy loading ratio of catalytic active materials, which thereby requires a greater amount of noble metal and makes catalytic converters expensive, for example, for automotive emission control.

Compared with the known solvothermal method for the synthesis of $TiO_2$ nano-arrays, the method disclosed herein for microwave-assisted synthesis is achieved at low temperature and low pressure with high production rate. For example, $TiO_2$ nano-arrays with comparable length can be obtained through a microwave-assisted hydrothermal method as disclosed herein at 80° C. for 1 hour, instead of about 150~200° C. for about 5~10 hours by a conventional solvothermal procedure.

Compared with conventional wash-coated monolithic catalysts, advantages of the $TiO_2$ nano-array based monolithic catalysts prepared as disclosed herein include:

A) The growth of $TiO_2$ nano arrays on monolithic substrates is an in-situ, binder free and environmentally benign process, instead of the conventional multi-step, complex wash coating process. It is an object of the methods disclosed herein to simplify the fabrication procedure and save costs.

B) The $TiO_2$ nano-arrays have good adherence to deposition substrates since crystal growth starts with the nucleation on the substrate, which can enhance the mechanical stability of the nano-arrays and extend the life expectancy of the materials, for example as catalysts.

C) The $TiO_2$ nano-arrays have well defined structure with good uniformity on the monolithic substrates, rather than the random microstructure of the wash-coated particulates. This provides the possibility to control and build precise and optimum structure-property correlations for catalysts and other nano-array materials.

D) The well-defined structure of the $TiO_2$ nano-arrays based monolithic catalysts can increase the diffusion path of gas molecules during reaction, thereby promoting interaction between the gas molecules and the catalysts. Also, material utilization efficiency for noble metal catalysts is enhanced.

The novel microwave-assisted hydrothermal method disclosed herein provides important advantages for synthesis of $TiO_2$ nanostructured films over the conventional solvothermal methods in terms of low production temperature and pressure, high production rate and environmentally benign starting materials. The low temperature and pressure process simplifies the specifications for reactors to be used in production. The high production rate makes it possible to scale up the process for industrial level manufacturing.

The novel microwave-assisted hydrothermal method disclosed herein also provides important advantages for production of monolithic catalysts. The resulting uniform $TiO_2$ nano-arrays on monolithic cordierite substrates provide an advantageous platform as carrier for noble metal catalysts over the conventional wash-coating particulates. The well-defined structure of the resulting $TiO_2$ nano-array based monolithic catalysts ensure uniform catalyst deposition with precisely and optimally controlled microstructures, therefore increasing the materials utilization efficiency. It has been proved that, compared with the reported washcoated powder catalysts with comparable performance, the materials utilization efficiency of embodiments of the disclosed nano-array monolithic catalysts is ~10-40 times higher with extremely small loadings of precious metal and metal oxide nano-arrays used.

An embodiment of the microwave-assisted hydrothermal method disclosed herein can provide increased material utilization efficiency, especially for the use of noble metals and thereby provide commercial value.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 4A: hot-plate heating, 60 min; FIG. 4B: microwave-assisted heating, 30 min; FIG. 4C: microwave-assisted heating, 60 min.

FIG. 5A is a graph showing the evolution of the average length of $TiO_2$ nano-arrays along the reaction time at different temperatures. FIG. 5B is a Raman spectra of the nano-arrays samples synthesized at 95° C. for 60 and 30 min.

FIGS. 6A-B: fresh samples; FIGS. 6C-D: hydrothermal aged samples at 700° C. for 100 hr.; FIGS. 6E-F: sonicated samples in water for 240 min. The light-off curves show the conversion rate of different gas components along the temperature; the T10, T50 and T90 in the histograms indicate the temperatures at which the conversion of each components reached 10%, 50% and 90%, respectively; the columns marked with Pt/$TiO_2$ means our samples, while those marked with DOC represent the commercial DOC sample from Ford F250.

FIGS. 7A-F are HAADF, HRTEM, EDX mapping and Pt particle size distribution of the Pt integrated $TiO_2$ nanowires: FIG. 7A: HAADF image of the fresh catalyst with HRTEM images and particle size distribution inserted; FIGS. 7B-C: HAADF and EDX mapping of the fresh catalyst indicating the detailed morphology and elemental distribution; FIG. 7D: HAADF image of the 700° C./100 hr. hydrothermal aged catalyst with HRTEM images and particle size distribution inserted; FIGS. 7E-F: HAADF and EDX mapping of the hydrothermal aged catalyst indicating the detailed morphology and elemental distribution.

FIGS. 11A-D are top-view SEM images and bright field TEM images of $TiO_2$ nano arrays annealed at different temperatures: FIG. 11A: Fresh nanoarrays; FIG. 11B: annealed at 500° C. for 2 h; FIG. 11C: annealed at 800° C. for 2 h; FIG. 11D: annealed at 1000° C. for 2 h.

FIG. 14A-H are SEM images of $TiO_2$ nano-arrays grown on seeded cordierite substrates with different concentrations of $TiCl_3$: FIGS. 14A and 14B: 0.20 wt. %; FIGS. 14C and 14D: 0.35 wt. %; FIGS. 14E and 14F: 0.50 wt. %; FIGS. 14G and 14H: 0.70 wt. %. FIGS. 14A, 14C, 14E, and 14G are top-view images with low-magnification images inserted. FIGS. 14B, 14D, 14F, and 14H are cross-sectional view images. The reactions were carried out at 80° C. for 60 min, and the volume of $H_2O_2$ (30%) was fixed to be 15 mL for all reactions. The volume of DIW and HCl (37%) were adjusted according to the amount of $TiCl_3$ (20%) used to keep the concentration of HCl constant at 0.2335 mol/L.

FIG. 15A-H are SEM images of $TiO_2$ nano-arrays grown on seeded cordierite substrates with different volume of $H_2O_2$ (30%): FIGS. 15A and 15B: 0 mL; FIGS. 15C and 15D: 9 mL; FIGS. 15E and 15F: 15 mL; FIGS. 15G and 15H: 20 mL. FIGS. 15A, 15C, 15E, and 15G are top-view images with low-magnification images inserted. FIGS. 15B, 15D, 15F, and 15H are cross-sectional view images. The reactions were carried out at 80° C. for 60 min, and the volume of $TiCl_3$ (20%) and HCl (37%) were fixed to be 3 and 3.5 mL, respectively. The volume of DIW was adjusted according to the amount of $H_2O_2$ (30%) used to keep the total volume of solution constant at 206.5 mL.

FIGS. 16A-H are SEM images of $TiO_2$ nano-arrays grown on seeded cordierite substrates with different volume of HCl (37%): FIGS. 16A and 16B: 0 mL; FIGS. 16C and 16D: 1.5 mL; FIGS. 16E and 16F: 3.5 mL; FIG. 16G: 7.5 mL; FIG. 16H: 10.5 mL. FIGS. 16A, 16C, 16E, 16G, and 16H are top-view images with low-magnification images inserted. FIGS. 16B, 16D, and 16F are cross-sectional view images. The reactions were carried out at 80° C. for 60 min, and the volume of $TiCl_3$ (20%) and $H_2O_2$ (30%) were fixed to be 3 and 15 mL, respectively. The volume of DIW was adjusted according to the amount of HCl (37%) used to keep the total volume of solution constant at 206.5 mL.

FIG. 17A: Unseeded sample, 80° C. for 30 min; FIG. 17B: Unseeded sample, 80° C. for 60 min; FIG. 17C: Seeded sample, 80° C. for 10 min; FIG. 17D: Seeded sample, 80° C. for 60 min. Low-magnification top-view images are inserted into FIGS. 17B and 17D. The reactions were carried out at 80° C. using the optimized recipe of 3 mL $TiCl_3$ (20%), 15 mL $H_2O_2$ (30%), 3.5 mL hydrochloride acid (37%) in 185 mL DI water.

FIGS. 18A-D: 75° C.; FIGS. 18M-P: 95° C. The scale bars in the inserts correspond to 1 µm.

FIG. 23A: Cordierite monolith; FIG. 23B: SiC monolith; FIG. 23C: FTO coated glass; FIG. 23D: Ti metal foil; FIG. 23E: ITO coated PET film; and FIG. 23F: carbon fibers.

FIG. 24A: pristine glass; FIG. 24B: nanoarray@glass; FIG. 24C: pristine FTO surface; FIG. 24D: nanoarray@FTO; FIG. 24E: pristine PET film; FIG. 24F: nanoarray@PET film; FIG. 24G: pristine ITO surface; FIG. 24H: nanoarray@ITO surface.

DETAILED DESCRIPTION

Figure 1A:
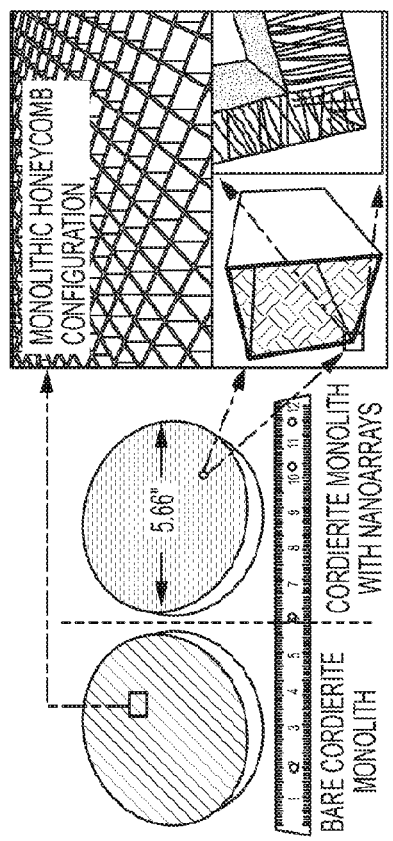
FIG. 1A is a photograph and schematic illustration of $TiO_2$ nano-arrays rooted cordierite monoliths.
Figure 1B:
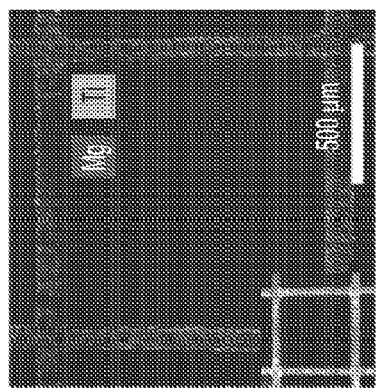
FIG. 1B is an elemental distribution of Ti and Mg by EDX mapping, indicating the $TiO_2$ nano-array layers and cordierite substrate, respectively.

A description of example embodiments follows.

As used herein, the term platinum group metal (PGM) refers to platinum, palladium, rhodium, osmium, iridium, and ruthenium.

One of skill in the art will appreciate that different PGMs can have different catalytic activity and can be useful for different applications.

The increasingly stringent regulations on stationary and automobile emissions and the rapid consumption of platinum-group metal (PGM) resources call for the development of highly efficient and low-cost catalysts for energy and pollutant conversion processes.[1-2] Three-dimensional (3D) monolithic catalyst devices, by integrating catalysts, filters and reactors, represent an ideal solution to meet these demands.[3-5] For example, the commercial automotive catalytic converters, by incorporating the honeycomb cordierite ($2MgO.5SiO_2.2Al_2O_3$) monoliths with PGM-based catalysts supported by highly porous metal oxide particulates, have been primarily used in automobile emission control systems.[6-7] However, the merit features of monolith configurations are not fully developed due to the less-than-ideal wash-coating methods for integrating the metal oxides supported catalysts onto the monoliths. The randomly stacked wash-coating particle layers lack effective control over the structure and uniformity of the catalysts, resulting in compromised catalytic performance, low materials utilization efficiency and poor mechanical stability.[8-9]

In order to meet these challenges, a novel one-dimensional (1D) nanostructure array (nano-array) based monolithic catalyst configuration has been developed by our group in the past few years.[8-18] By using low-cost and robust hydrothermal process, hierarchically arranged metal oxide nano-arrays, including ZnO, $TiO_2$, $CeO_2$, $Co_3O_4$, $MnO_2$ and perovskite in forms of nanorods (NRs), nanowires (NWs), nanotubes (NTs) or composite core-shell structures, have been in situ grown onto the channel surfaces of commercial honeycomb monoliths. These nano-arrays either function as ready-made catalysts to catalyze reactions or act as supports for loading catalytically active materials.[9, 19-27] The nano-array based monolithic catalysts have been proved to be advantageous over the conventional wash-coating catalysts in terms of enhanced materials utilization efficiency, higher thermal stability and mechanical robustness as well as tunable structures and catalytic performance.[8-9]

Among these metal oxide nano-arrays, $TiO_2$ is a promising candidate for inexpensive mass production of nano-array based monolithic catalysts due to its abundant, low-cost, environmentally benign and chemically stable characteristics.[28-31] The feasibility of using $TiO_2$ nano-arrays in automotive catalytic devices have been demonstrated in our previous work.[9, 13, 25-26] Conventional synthetic methods for $TiO_2$ nano-arrays include chemical vapor deposition (CVD),[32-33] pulsed DC magnetron sputtering,[34] anodic aluminium oxide (AAO) templating technique,[35-37] metal-organic chemical vapor deposition (MOCVD),[38-39] electrospinning,[40] and solution based methods.[41-45] Among them, solution based methods, including hydrothermal and solvothermal syntheses, are considered to be promising for industrial level production due to their advantages in low temperature operation, substrate compatibility and flexibility, low equipment capital investment, and continuous manufacturing viability[29, 46-47]. However, the reported solution based methods for $TiO_2$ nano-array synthesis are mainly based on the hydrolysis of titanium (IV) alkoxides in acid environment with a relatively high temperature (150~200° C.), high pressure, and extended reaction time (3~48 hr.) using Teflon-lined stainless steel autoclaves.[41-45] Moreover, due to the vigorous hydrolysis of $Ti^{4+}$ with water, a large portion of precursors precipitate homogeneously during the reaction, resulting in a low material utilization efficiency. Therefore, a facile method with high production rate and enhanced material utilization efficiency is essential to achieve the inexpensive mass production of $TiO_2$ nano-array integrated monolithic catalysts.

Microwave-assisted synthesis is an increasingly important method for the preparation of technologically critical nanomaterials.[48-54] By applying alternating electromagnetic field onto the polar molecules, microwave irradiation can achieve rapid and uniform volumetric heating throughout the solution, which results in a better energy saving and narrower size distribution of the nanomaterials than the conventional heating methods.[55] Microwave irradiation was also used in the synthesis of $TiO_2$ nanomaterials,[56-64] but only limited to nanoparticles, and no success on the low temperature synthesis of $TiO_2$ nano-arrays has been reported so far. Meanwhile, $TiCl_3$ was reported to be a better titanium source than titanium (IV) alkoxides for scalable synthesis of $TiO_2$ nanomaterials due to its higher stability in water and lower cost.[25, 65-67] However, the weak hydrolysis of $TiCl_3$ and slow transition from $Ti^{3+}$ to $Ti^{4+}$ in aqueous environment result in a usually low reaction rate to form $TiO_2$, and thus, proper strategies are necessary to control the hydrolysis rates and accelerate the oxidation of $Ti^{3+}$ in order to achieve a reasonable reaction rate.

Herein, a facile microwave-assisted hydrothermal method was developed for the synthesis of $TiO_2$ nano-arrays on commercial honeycomb monoliths. Compared with the conventional one-step hydrolysis method, a novel one-pot and two-step sustained-release reacting strategy was designed, in which, $TiCl_3$ was used as titanium source, $H_2O_2$ as an oxidizer to promote the oxidation of $Ti^{3+}$, and hydrochloride acid to control the hydrolysis rate in solution. An optimized set of synthetic conditions have been obtained by adjusting the concentrations of reactants and other synthetic parameters. This approach provides a new pathway to the low temperature and scalable synthesis of $TiO_2$ nano-arrays with good production rate and enhanced material utilization efficiency. When loaded with 50 g/ft³ Pt, the $Pt/TiO_2$ nano-array based monolith catalysts showed excellent low-temperature catalytic performance and hydrothermal stability as well as superior mechanical robustness compared with commercial diesel oxidation catalysts (DOC) samples. This new type of $TiO_2$ nano-array integrated automotive catalytic converter was demonstrated to be a promising candidate for low temperature automotive emission control.

In some embodiments, the method includes seeding a substrate with $TiO_2$ polymeric sol (0.025 mol/L) by dip-coating method. In some embodiments, the method includes submerging the seeded substrate into a mixture of deionized water, 37% hydrochloric acid, Titanium (III) chloride 20% w/w solution in 2N Hydrochloric acid, and Hydrogen peroxide 30% aqueous solution. In some embodiments, the method includes heating the submerged seeded substrate in a microwave and heating to 80° C. for 1 hour. In some embodiments, the method includes calcining the resulting titanium oxide nano-array at about 500 to about 950° C. for 2 hours with a ramp rate of 5° C./min.

In some embodiments, the method includes seeding a substrate with $TiO_2$ polymeric sol (about 0.01 to about 0.1 mol/L) by dip-coating method. In some embodiments, the method includes submerging the seeded substrate into a mixture of deionized water, about 25% to about 40% hydrochloric acid, Titanium (III) chloride, about 5 to about 40% w/w solution, in about 0.5 to about 3.5 N Hydrochloric acid, and Hydrogen peroxide about 10% to about 45% aqueous solution. In some embodiments, the method includes heating the submerged seeded substrate in a microwave, heating to about 70 to about 90° C. for about 45 min to about 90 min. In some embodiments, the method includes calcining the resulting titanium oxide nano-array at about 500 to about 950° C. for 2 hours with a ramp rate of about 3-5° C./min.

In some embodiments, the method includes loading a platinum group metals onto the $TiO_2$ nanowire array by dip-coating and subsequently calcining in air at about 5000° C. for 3 hours to about 4 hours to about 5 hours with a ramp rate of about 1.5 to about 2 to about 2.5° C./min.

In some embodiments, the substrate is a 2D substrate or a 3D substrate. In some embodiments, the substrate is cordierite. In some embodiments, the substrate is a cordierite honeycomb monolith. In some embodiments, the substrate is a 2D ceramic (e.g., glass, Si, etc.). In some embodiments, the substrate a fiber surface.

In some embodiments, the Ti (III) precursor is an Ti (III) alkoxide precursor. A wide variety of alkoxide precursors are suitable, such as C1 through C10 alkoxides. In some instances, a Ti (III) alkoxide can be a mixed Ti (III) alkoxide, in that the molecule has different alkoxides groups (e.g., having differing numbers of carbons, positional isomers, stereoisomers). Some examples of alkoxides include butoxide, methoxide ($Ti(CH_3O)_3$), and ethoxide ($Ti(OCH(CH_3)_2)_3$).

In some embodiments, the Ti (IV) precursor is an Ti (IV) alkoxide precursor. A wide variety of alkoxide precursors are suitable, such as C1 through C10 alkoxides. In some instances, a Ti (IV) alkoxide can be a mixed Ti (IV) alkoxide, in that the molecule has different alkoxides groups (e.g., having differing numbers of carbons, positional isomers, stereoisomers). Some examples of alkoxides include butoxide, methoxide ($Ti(CH_3O)_4$), and ethoxide ($Ti(OCH(CH_3)_2)_4$).

Example #1

Example Materials

Substrate Example 3D cordierite substrates seeded with $TiO_2$ polymeric sol (0.025 mol/L) by dip-coating method—range of seeding: about 0.01 to about 0.1 mol/L 4.66" (diameter)×2.5" (length)

Example of Reaction Materials

Deionized (DI) water

Hydrochloric acid (37%)—range: about 25 to about 40% HCl

Titanium (III) chloride 20% w/w solution in 2N Hydrochloric acid; Range of Titanium (III) chloride: about 5 to about 40% w/w; Range of HCL: about 0.5 to about 3.5 N HCl Hydrogen peroxide 30% aqueous solution; Range of Hydrogen peroxide: about 10% to about 45% aqueous solution

Example Method

Suitable Microwave Oven

Model: BP-125 Laboratory Microwave from Microwave Research & Applications, Inc.; Rated current/voltage/power: 15 A/120 V/1800 kW Example of Synthesis Conditions Microwave heating, 80° C. for 60 min; Range—about 50 to about 90° C. for about 30 min to about 120 min Example of Calcination Conditions 500/900/1000° C. for 2 hours Range—about 500° C. for about 2 to about 4 hours; about 800° C. for about 1 to about 3 hours; about 850 to about 950° C. for about 0.5 to about 2.5 hours Ramp=about 3 to about 5° C./min Examples of Reaction Volume, Reaction Time, and Energy Consumption Volume of solution: 2 L/cycle×4 cycle=8 L Reaction time: 30 min/cycle×4 cycle=2 h Energy consumption: 3.6 kW-h

Catalyst Formation

In another embodiment a mesoporous $TiO_2$ nano-array was integrated onto cordierite honeycomb monolith via a solvothermal synthetic method followed by loading with platinum. The resulting catalyst has excellent activity as a diesel oxidation catalyst.

EXEMPLIFICATION

A typical synthesis process of $TiO_2$ nano-arrays onto the commercial cordierite honeycombs can be divided into two steps, i.e., (i) the substrate surface seeding $TiO_2$ and (ii) hydrothermal $TiO_2$ NW arrays growth. The seeding process was conducted by a dip-coating method assisted with sonication, which helps to create a uniform pre-seeding layer on the substrate channel surfaces to promote the heterogeneous growth of $TiO_2$ nano-arrays. For the growth process, a two-step sustained-release strategy was designed by using $TiCl_3$ as Ti source, $H_2O_2$ as an oxidizer to accelerate the oxidation from $Ti^{3+}$ to $Ti^{4+}$, and hydrochloride acid as pH controller to adjust the hydrolysis rate in solution. Cordierite honeycomb substrates in different sizes were used for different demonstrations.

The crystal structure, morphology, composition, specific surface area and thermal stability information of the catalysts as well as the bare $TiO_2$ nano-arrays were obtained through X-ray Diffraction (XRD), Raman spectroscopy, scanning electron microscope (SEM), transmission electron microscopy (TEM), X-ray photoelectron spectroscopy (XPS), Brunauer-Emmett-Teller (BET) surface area analysis and a combined thermogravimetry-differential thermal (TGA-DTA)—mass spectroscopy analysis.

The $Pt/TiO_2$ nano-array based monolithic catalyst devices were prepared by dip-coating method with a controlled PGM loading of 50 g-Pt/ft$^3$ (1.766 g-Pt/L). The catalytic performance of the catalysts was tested under the simulated exhaust protocol by the low temperature combustion-diesel (LTC-D) condition.[68] The tests were conducted from room temperature to 600° C. with a ramping rate of 2° C./min and a space velocity of 60000 h$^{-1}$. The catalytic performance, together with mechanical robustness and hydrothermal stability, were compared with the bench mark commercial DOC. Detailed description of the experimental procedures can be found below.

1.1. Chemicals and Materials

All chemicals used for the synthesis of $TiO_2$ NW arrays in this work were used as received without further purification, including titanium (IV) isopropoxide (TTIP, 98+%, ACROS Organics™), nitric acid ($HNO_3$, 70%, SIGMA-ALDRICH), ethanol ($C_2H_6O$, Reagent Alcohol 200 Proof, PHARMCO-AAPER™), titanium (III) chloride ($TiCl_3$, 20% w/w solution in 2N Hydrochloric acid, ACROS Organics™), hydrogen peroxide solution ($H_2O_2$, 30% w/w in $H_2O$, contains inhibitor, SIGMA-ALDRICH), and hydrochloric acid (HCl, 37%, SIGMA-ALDRICH) and Tetraammineplatinum (II) nitrate ($H_{12}N_6O_6Pt$, M.W.=387.21, 99.99% metals basis, Alfa Aesar™).

The cordierite monolithic substrates (600 cpsi) were provided by Corning Inc. (Corning, N.Y.). The cordierite monoliths had 1 mm×1 mm square channels and a channel wall thickness of 100 μm, and the substrates were cut into different dimensions for different demonstrations. The commercial diesel oxidation catalyst (DOC) was obtained from an as received 2010 Ford F-250 DOC.

1.2. Synthesis of $TiO_2$ NW Arrays on Cordierite Monoliths

In order to achieve uniformly distributed $TiO_2$ NW arrays throughout the multichannel cordierite monolith, we introduced two major steps in the nanostructure growth process: (i) substrate surface seeding $TiO_2$ and (ii) hydrothermal $TiO_2$ NW arrays growth.

In the seeding process, a $TiO_2$ polymeric sol of 0.025 mol/L was prepared by dissolving 7.1 g TTIP (0.025 mol) and 1.8 mL 0.01M diluted $HNO_3$ solution into 1000 mL ethanol during magnetic stirring. Monolithic cordierite substrates of 4.66 in. diameter and 2.5 in. length were first rinsed with acetone, ethanol and deionized water in an ultrasonic bath and then dried overnight at 110° C. The as-cleaned cordierite substrates were first dipped into the $TiO_2$ polymeric sol while being sonicated for 1 min and then the liquid was removed from the channels by air gun. The dip-coated substrates were first dried in a domestic microwave oven for 2 minutes and then further dried in a muffle furnace at 200° C. for 10 minutes. The sonicated dip-coating process was repeated 5 times to ensure that sufficient seeding nanoparticles stuck to the substrate channel surfaces. Afterwards, the dip-coated substrates were then annealed at 500° C. for 2 hours to enhance the crystallinity of the $TiO_2$ seeds, and finally, the seeded substrates were cut into desired dimensions for further synthesis.

In the subsequent hydrothermal process, a microwave-assisted hydrothermal synthesis method was used to integrate uniform $TiO_2$ NW arrays onto the seeded cordierite monolithic substrate in the present work. In a typical synthesis, 0-10.5 mL concentrated hydrochloride acid (37 wt. %) was firstly mixed with 180-200 mL deionized water (DIW) in a 200 mL beaker; then 1.732-6.061 mL $TiCl_3$ (20 wt. % in 2N HCl acid) was added in to the mixture as titanium precursors during stirring; after stirring for another 1 min, 0-20 mL $H_2O_2$ (30 wt. % in $H_2O$) was added as oxidizer to promote the transition from $Ti^{3+}$ to $Ti^{4+}$ ions. Hydrochloride acid in the recipe is added to control the hydrolysis rate of the precursors by ensuring an acidic solution pH. After stirring for another 1 min, seeded cordierite substrates were soaked into the mixture with the channels perpendicular to the bottom of the beaker to facilitate the mass transfer of the solutions during the synthesis. The synthesis was carried out in a BP-125 Laboratory Microwave from Microwave Research & Applications, Inc. equipped with a 1/16" PFA coated temperature probe (Type K) from OMEGA. The reactions were conducted at 75-95° C. for 10-180 min, and the desired temperatures can be reached within 2 minutes with microwave radiation, and controlled within ±2° C. during the reactions. After synthesis, the samples were removed from the reactant solutions and soaked into DIW immediately to stop the reactions; then the cooled samples were rinsed extensively with DI water and dried overnight at 100° C. in oven. Some samples were further annealed at different temperatures to investigate the thermal stability of the as-grown $TiO_2$ NW arrays. In some control experiments, hot plate was used as heating source to study the effect of heating methods on the growth of $TiO_2$ NW arrays. Effects of initial reactant solutions, including the concentration of $TiCl_3$, $H_2O_2$, and acidity, and the effects of experimental conditions, including temperature, pre-seeding, reaction time and multi-batches, were also studied in the present work.

1.3. Preparation of $TiO_2$ Nano-Array Based Monolithic Catalyst Devices

The $Pt/TiO_2$ nano-array based cordierite monolithic catalysts with a loading ratio of 50 g-Pt/ft³ (1.766 g-Pt/L) were prepared by dip-coating method. Platinum aqueous solution with a nominal composition of 1 mg-Pt/mL was prepared by dissolving 0.0397 g Tetraammineplatinum (II) nitrate (M.W.=387.21, 99.99% metals basis) into 20 mL DI water and sonicated for 30 min. The solution was sonicated for another 30 min before use each time. $TiO_2$ NW arrays (average length of ~1 μm) rooted cordierite substrates were used for Pt catalyst deposition to achieve the $Pt/TiO_2$ nano-array based cordierite monolithic catalyst. First, 3.532 mL of the prepared $Pt^{2+}$ aqueous solution was transferred into a sample vial (20 mL), and one piece of sample with dimension of 2 cm×1 cm×1 cm was soaked in solution under sonication. Then the liquid was removed from the channels by air gun before the sample was transferred to a domestic microwave oven and dried under the microwave irradiation. After the sample became completely dry, it was calcined at 200° C. for 5 minutes before next dip-coating process. This deposition procedure was repeated for several cycles until all the solution in the vial was used up. Afterwards, the dip-coated catalyst samples were annealed at 500° C. for 2 h with ramping rate of 2° C./min. The final heat treatment was carried out in $H_2/Ar$ (4 vol. % $H_2$) mixed gas atmosphere at 500° C. for 2 h with a flow rate of 50 sccm.

1.4. Characterization of the Materials

The X-ray diffraction (XRD) patterns on the prepared nano-array structures was acquired using a BRUKER D2 X-ray diffractometer (Cu Kα radiation, λ=1.540598 Å) with an operating beam voltage of 30.0 kV, and a beam current of 10 mA. The morphology and structure of nano-array catalysts were characterized using a field-emission SEM (FEI TeneoLoVac) at an accelerating voltage of 20.0 kV, and a high resolution TEM (FEI Talos F200X S/TEM, 200 kV). The XPS measurements were performed by Quantum 2000 Scanning ESCA Microprobe, using monochromatic Al Kα X-ray source. The shift of binding energy due to relative surface charging was corrected using C 1s level at 284.8 eV as an internal standard. TGA-MS was conducted using a Netzsch TG 209 F1 Libra thermogravimetric analyzer coupled to a QMS 403C quadrupole mass spectrometer. The samples were heated from 27 to 900° C. under 50 ml/min in argon. Raman spectra were taken with a Renishaw 2000 Raman microscope with an $Ar^+$ ion laser (514 nm) as the excitation source The surface areas were calculated by the Brunauer-Emmett-Teller (BET) method, and the pore size distributions were obtained by the Barrett-Joyner-Halenda (BJH) method from the nitrogen adsorption-desorption isotherms measured at 77 K using a Micromeritics ASAP 2020 Automatic Chemisorption Analyzer.

1.5. Hydrothermal Stability and Mechanical Robustness

The hydrothermal stability and mechanical robustness were characterized on both the nano-array based catalysts and the commercial DOC samples.

To evaluate the hydrothermal stability of the catalysts, the samples were hydrothermally aged in the following atmosphere at 700° C. for 100 hr.

TABLE 4

Hydrothermal aging parameters

| Component | Concentration (vol. %) |
|---|---|
| $O_2$ | 10 |
| $H_2O$ | 5 |
| $CO_2$ | 5 |
| $N_2$ | Balanced |

Figure 8:
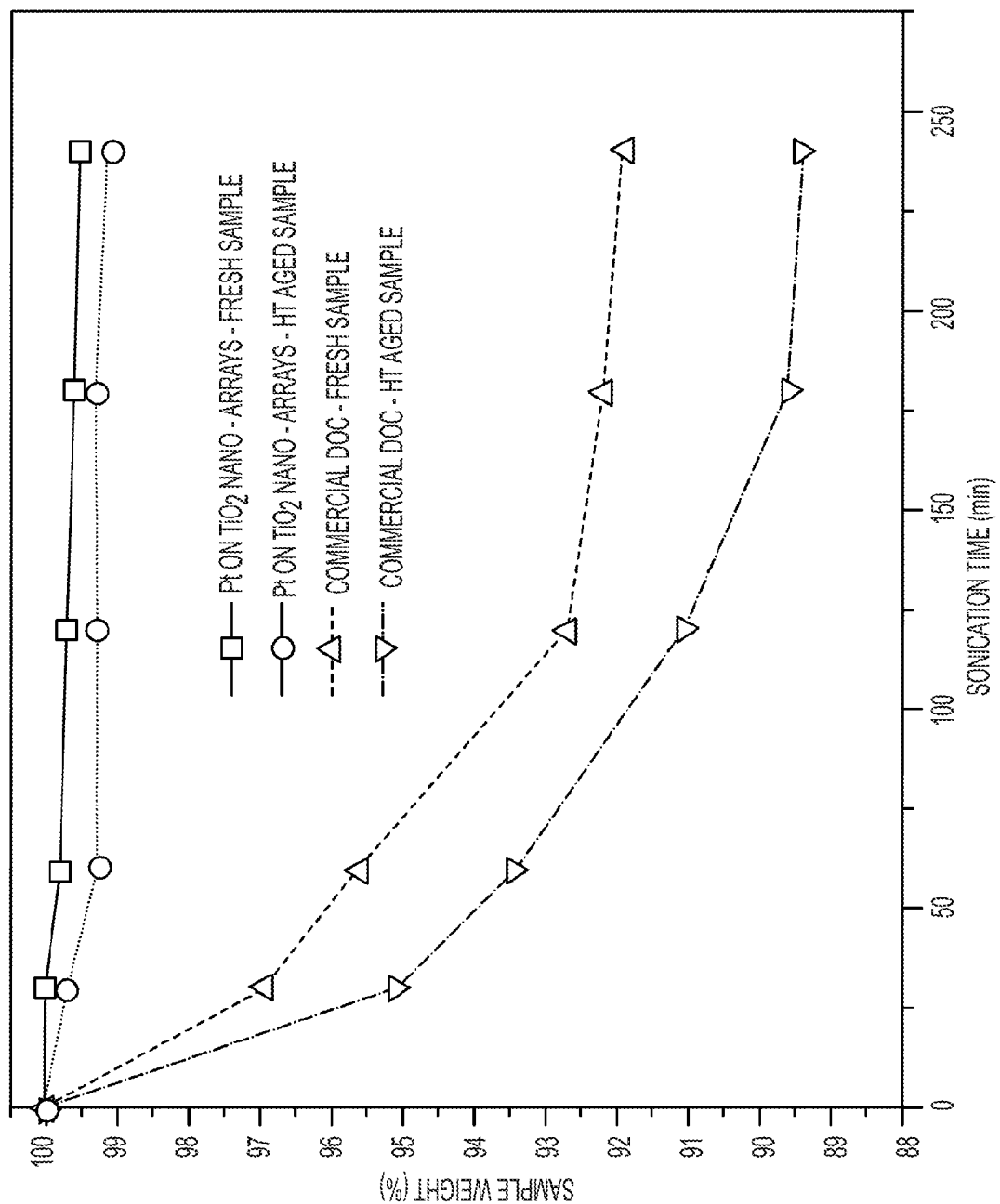
FIG. 8 is a graph showing evolution of sample weight in percentage of the Pt on $TiO_2$ nano-array based monolithic catalysts and the commercial DOC samples before and after hydrothermal aging at 700° C./100 hr. along the sonication time.

To evaluate the mechanical robustness of the catalysts, each sample was sonicated in water for 4 hr., during which, the samples were taken out, dried and weighted at 30, 60, 120, 180 and 240 min. The changes in sample weight were used to characterize the mechanical stability of the catalysts, as shown in FIG. 8.

1.6. Catalytic Performance Evaluation

The catalytic performance of the $Pt/TiO_2$ nano-array based monolithic catalysts were studied and compared with commercial DOC samples under the Low Temperature Diesel Combustion (LTC-D) simulated exhausted conditions.[68] The compositions of the simulated gasses are listed in Table 5.

TABLE 5

LTC-D simulated exhaust gas parameters

| Component | Concentration (vol. %) |
|---|---|
| $O_2$ | 12 |
| $H_2O$ | 6 |
| $CO_2$ | 6 |
| $H_2$ | 0.04 |
| CO | 0.2 |
| NO | 0.01 |
| Ethylene ($C_2H_4$) | 0.0833 |
| Propylene ($C_3H_6$) | 0.0333 |
| Propane ($C_3H_8$) | 0.0111 |
| $N_2$ | Balanced |

Figure 9:
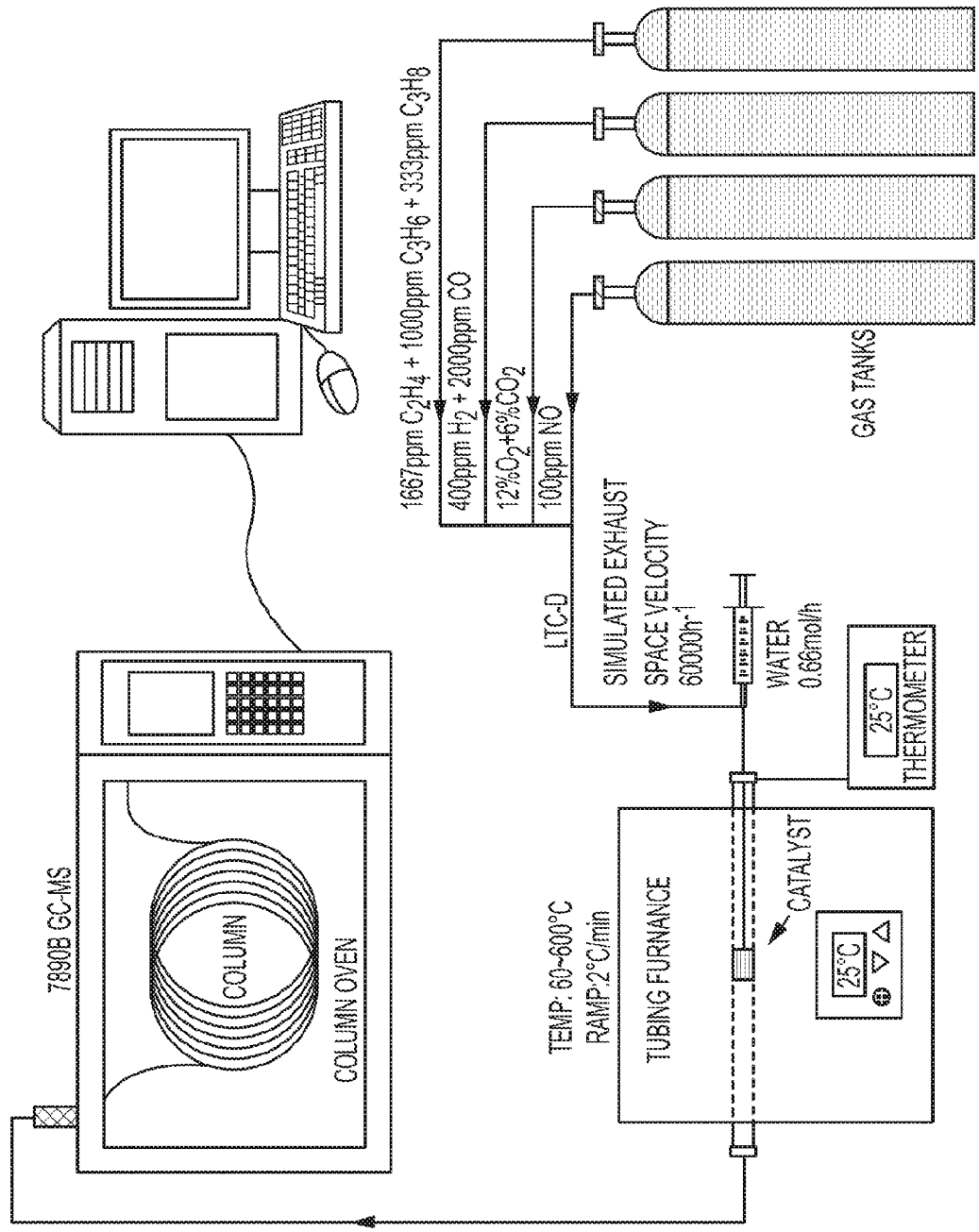
FIG. 9 is a schematic illustrating a catalytic testing system for the LTC-D simulated exhaust oxidation reactions.

The tests were conducted on an Agilent 7890 Gas chromatography (GC) system coupled with an Agilent 5977 Mass Spectroscopy Detector (MSD). The oxidation studies were carried out in a temperature range of 60-600° C. with a heating rate of 2° C./min. The dimensions of the tested sample are 0.5 cm×0.5 cm×1 cm, and the flow rate of the simulated gas fed is 250 ccm, making the space velocity to be 60000 h$^{-1}$. The schematic of the experimental setups are shown in FIG. 9. The catalytic performance of the catalysts were evaluated by calculating the conversions of different species in the simulated exhaust using the following equation.

$$\text{Conversion} = \frac{C^i_{inlet} - C^i_{outlet}}{C^i_{inlet}} \times 100\% \quad \text{(Eq. 01)}$$

where $C_{inlet}^i$ and $C_{outlet}^i$ are the concentration of component i at the inlet and outlet.

Results and Discussion

Structural and Compositional Analysis

Figure 1D:
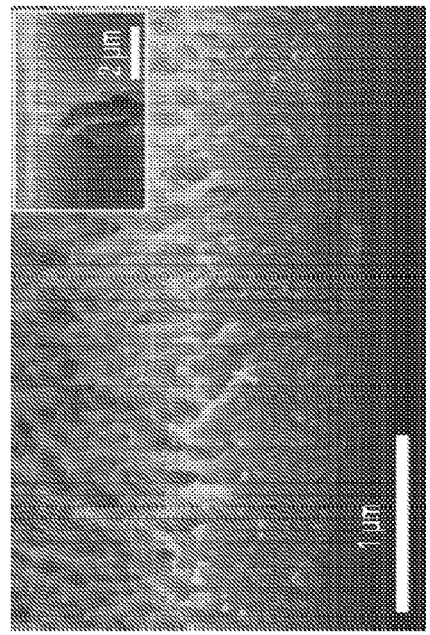
FIGS. 1C and 1D are SEM images of $TiO_2$ nano-arrays rooted cordierite monoliths from (FIG. 1C) top-view and (FIG. 1D) cross-sectional view with low magnification images inserted.
Figure 1C:
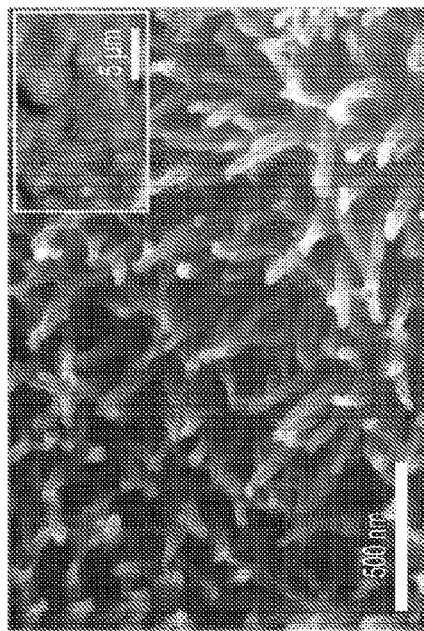

FIGS. 1A-D show a photograph and schematic illustrations, elemental distribution and general morphologies of the grown TiO$_2$ nano-arrays rooted inside the channels of commercial honeycomb monolith. The Energy-dispersive X-ray (EDX) mapping in FIG. 1B indicates that the nano-arrays are uniformly grown onto the channel surfaces, which confirms the configurations shown in the 3D schematics in FIG. 1A. FIGS. 1C and 1D reveal the more detailed morphologies of the as-synthesized nano-arrays from the top view and cross-sectional view, respectively. The macropores between adjacent nanowires shown in the top-view image not only facilitate the loading and dispersion of the catalytic materials during preparation, but also better expose the active sites and promote the gas-solid interaction by a shorter diffusion length than the traditional wash-coated particulate formed monolith catalysts.[9] The cross-sectional view in FIG. 1D demonstrates the good adherence between the grown nano-arrays and the cordierite substrate, which enhances the mechanical robustness of the final catalytic devices. Furthermore, the low magnification top-view and cross-sectional view images inserted in FIGS. 1C and 1D reveal good uniformity of the nano-array distribution on the channels.

Figure 2A:
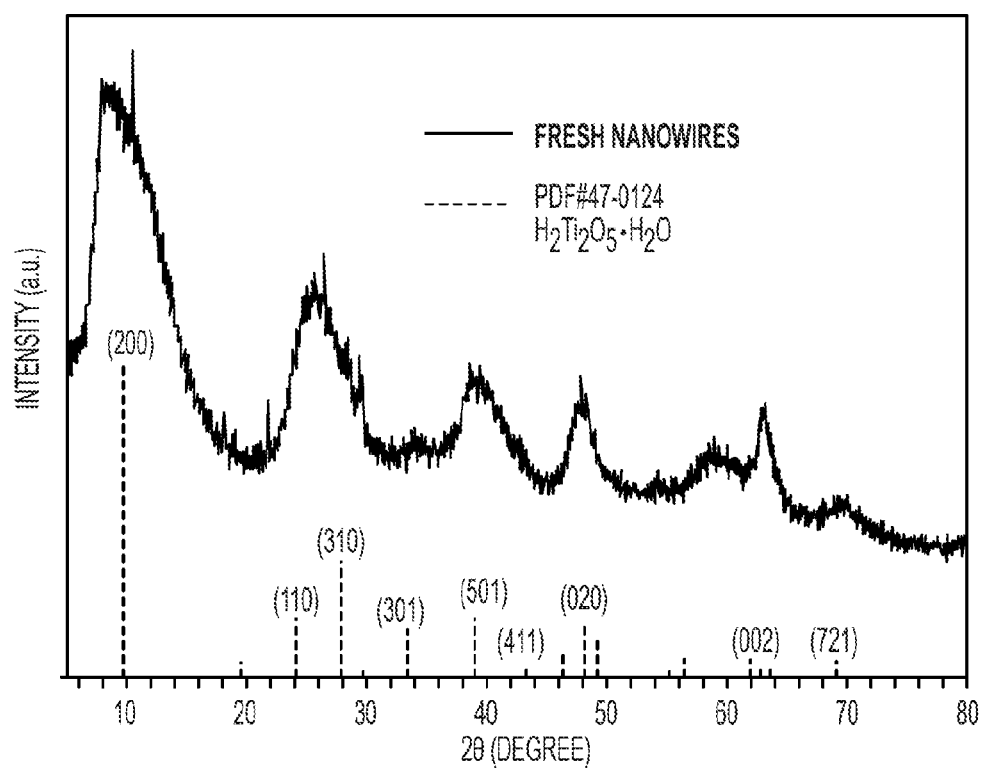
FIG. 2A is an XRD pattern of fresh nanowire powders along with diffraction peaks of hydrogen titanium oxide hydrate ($H_2Ti_2O_5 \cdot H_2O$).
Figure 2B:
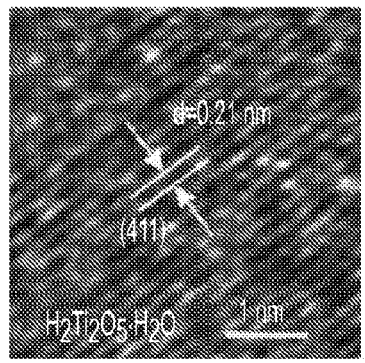
FIG. 2B is a high resolution TEM (HRTEM) image of fresh nanowires.
Figure 2C:
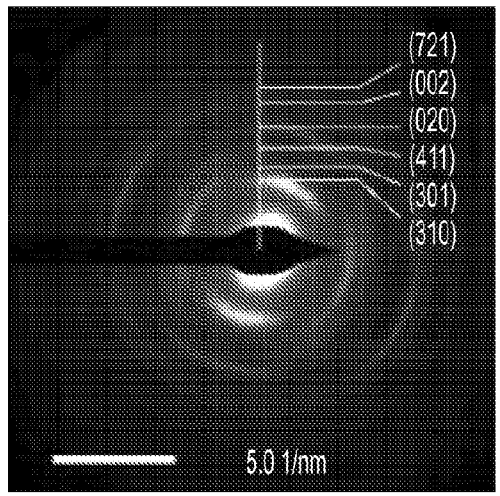
FIG. 2C is a selected area electron diffraction (SAED) patterns of fresh nanowires.
Figure 2D:
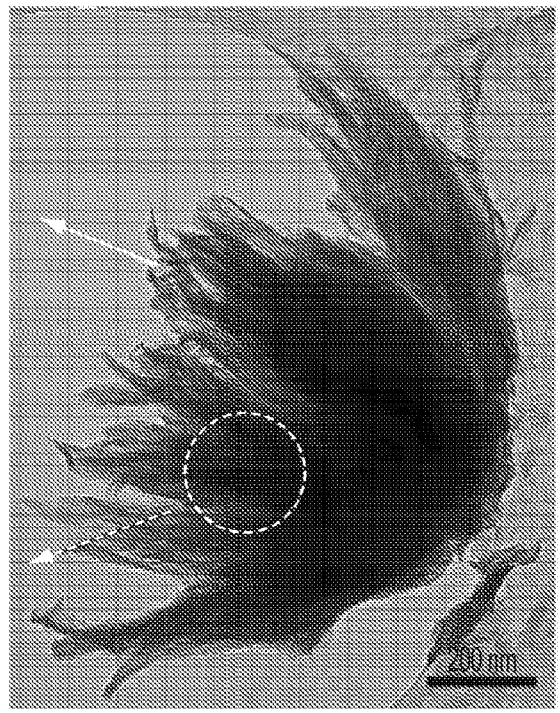
FIG. 2D is a bright field (BF) TEM image of fresh nanowires.
Figure 2E:
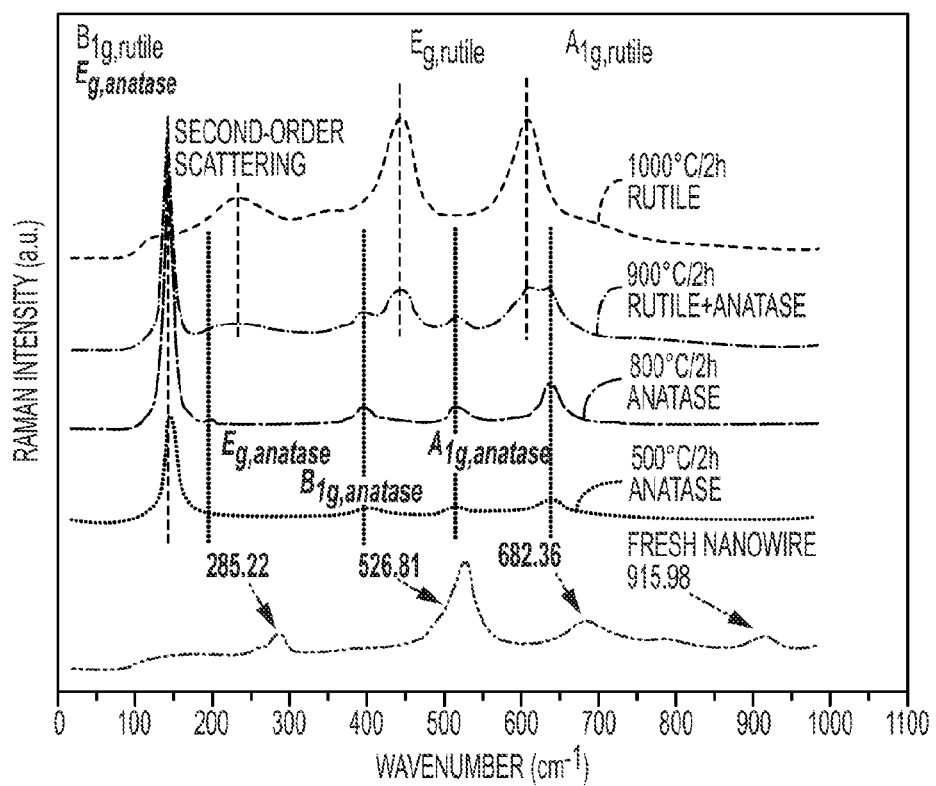
FIG. 2E is a Raman spectra of nano-arrays annealed at different temperatures.
Figure 2F:
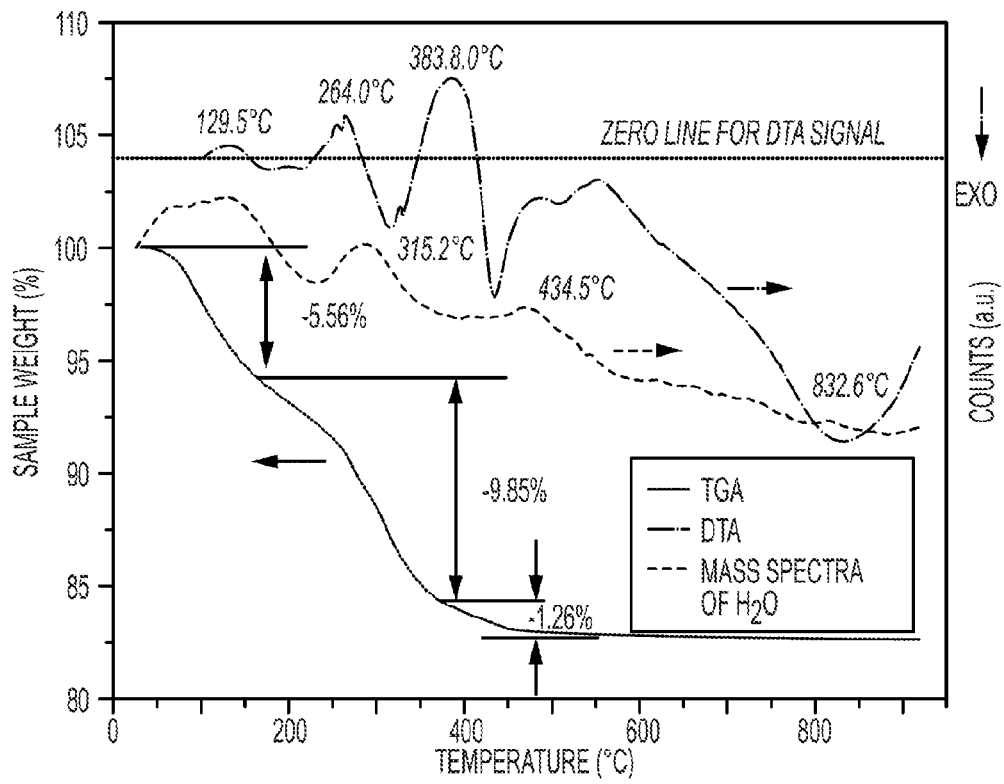
FIG. 2F is a thermogravimetric differential thermal/mass spectroscopy (TGA-DTA)/$H_2O$ Mass spectra of the fresh nanowire powders.

FIGS. 2A-F display the crystal structural, compositional and thermal stability information of the prepared nano-arrays based on the results from XRD, Raman spectra, TEM and TGA-DTA/Mass spectra. The XRD pattern of the as-synthesized nanowires is shown in FIG. 2A, and the major peaks can be indexed according to the standard diffraction peaks of hydrogen titanium oxide hydrate (H$_2$Ti$_2$O$_5$.H$_2$O, JCPDS 47-0124). The broad diffraction peaks and relatively high intensity of the background indicate the poor crystallinity of the as-synthesized nanowires. FIGS. 2B-D display the high resolution TEM (HRTEM), selected area electron diffraction (SAED) pattern, and bright field (BF) images of the as-prepared nanowires. The BF image of the nanowires in FIG. 2D confirms the morphology shown in FIGS. 1C and 1D, and the HRTEM image in FIG. 2B displays the lattice image of the {411} planes in H$_2$Ti$_2$O$_5$.H$_2$O crystals. The SAED pattern shown in FIG. 2C can be indexed according to H$_2$Ti$_2$O$_5$.H$_2$O (JCPDS 47-0124), and the relatively diffusive diffraction rings confirm the low crystallinity of the as-synthesized nanowires.

Figure 10:
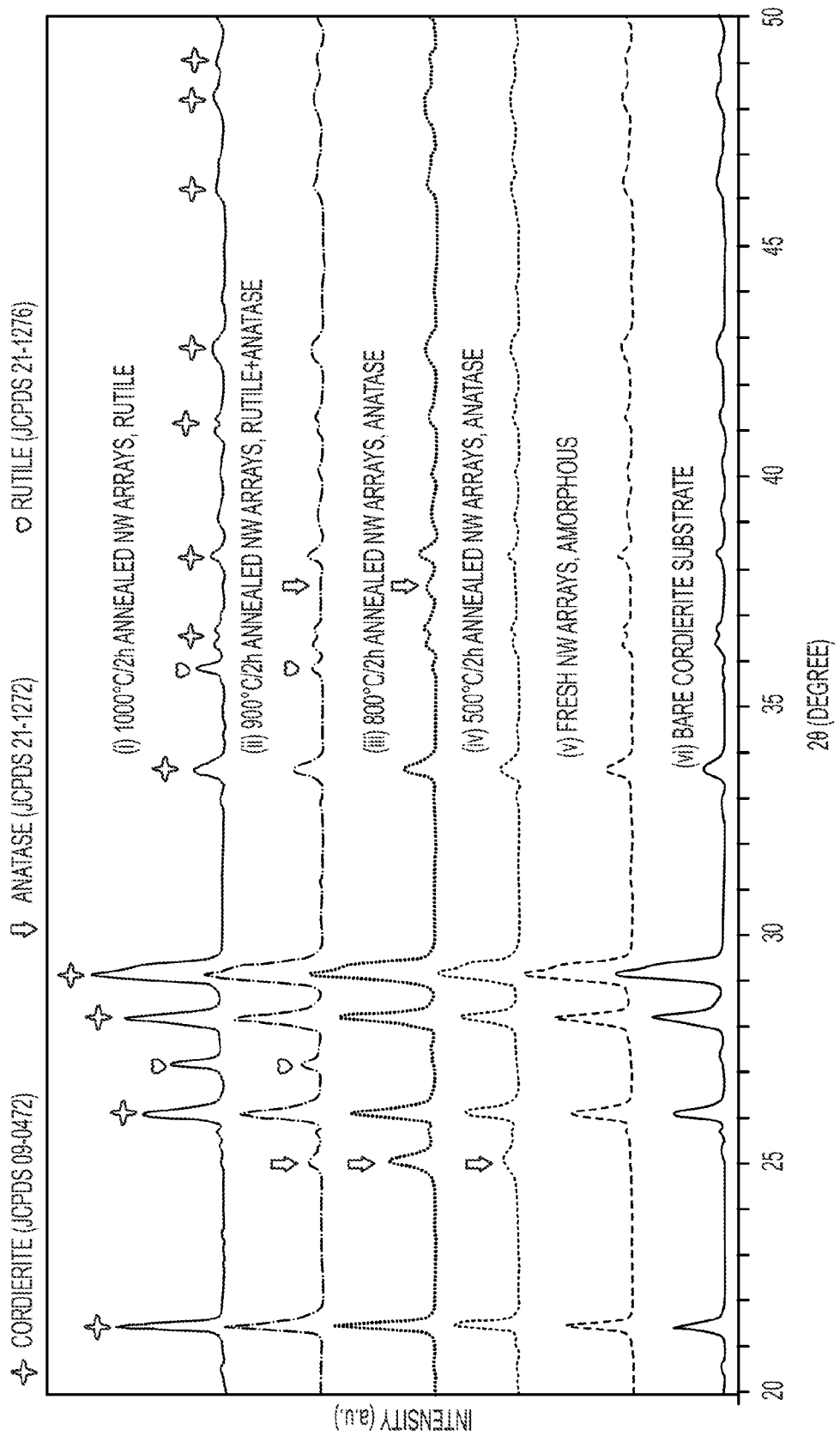
FIG. 10 is XRD patterns of $TiO_2$ nano-array rooted cordierite monoliths annealed at different temperatures.

The thermal stability and structural evolution of the as-synthesized nanowires were investigated by Raman spectra and XRD on the samples after different heat treatments. As revealed in FIG. 2E, typical Raman peaks for anatase and rutile phases were detected from the TiO$_2$ nano-array rooted monoliths annealed at 500, 800, 900 and 1000° C.[69-70] The characteristic Raman peaks at 285.22, 526.81, 682.36 and 915.98 cm$^{-1}$ are from the fresh nanowire sample containing the H$_2$Ti$_2$O$_5$.H$_2$O phase. The evolution of the Raman spectra with increasing temperature indicates that the as-synthesized nanowires maintain the H$_2$Ti$_2$O$_5$.H$_2$O structure below 100° C., and change to anatase structure after being annealed at 500° C. The Raman spectra of the 800° C. treated sample is similar to that of the 500° C. treated one, but with sharper peaks for anatase due to the enhanced crystallinity after higher temperature treatment. When the temperature increases to 900° C., rutile TiO$_2$ starts to appear, and the sample turns to a mixture of anatase and rutile TiO$_2$; the sample totally transforms into rutile TiO$_2$ after being annealed at 1000° C. The crystal structural evolution of the TiO$_2$ nano-arrays can also be revealed by the XRD patterns of the samples annealed at different temperatures, as shown in FIG. 10. The changes in microstructure morphologies of the TiO$_2$ nano-arrays with the annealing temperature are presented in the SEM and bright field TEM images in FIG. 11A-D. The results show that the nano-array structure retains below 500° C., turns rounded at 800° C., and finally lose the array-structure at 1000° C.

Figure 12A:
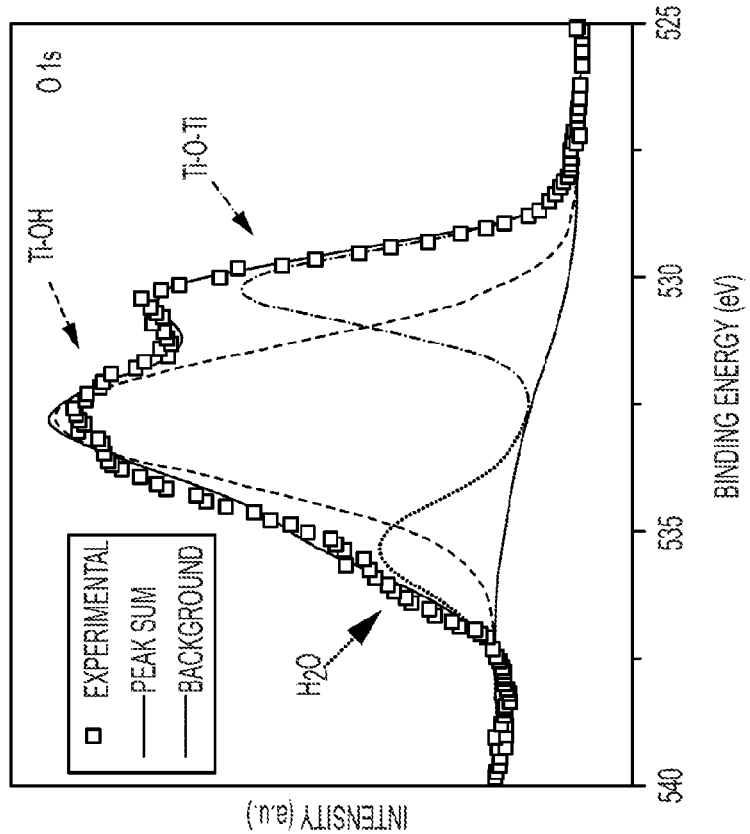
FIG. 12A is an XPS analysis, deconvoluted Ti 2p XPS spectra of fresh nanowire arrays.
Figure 12B:
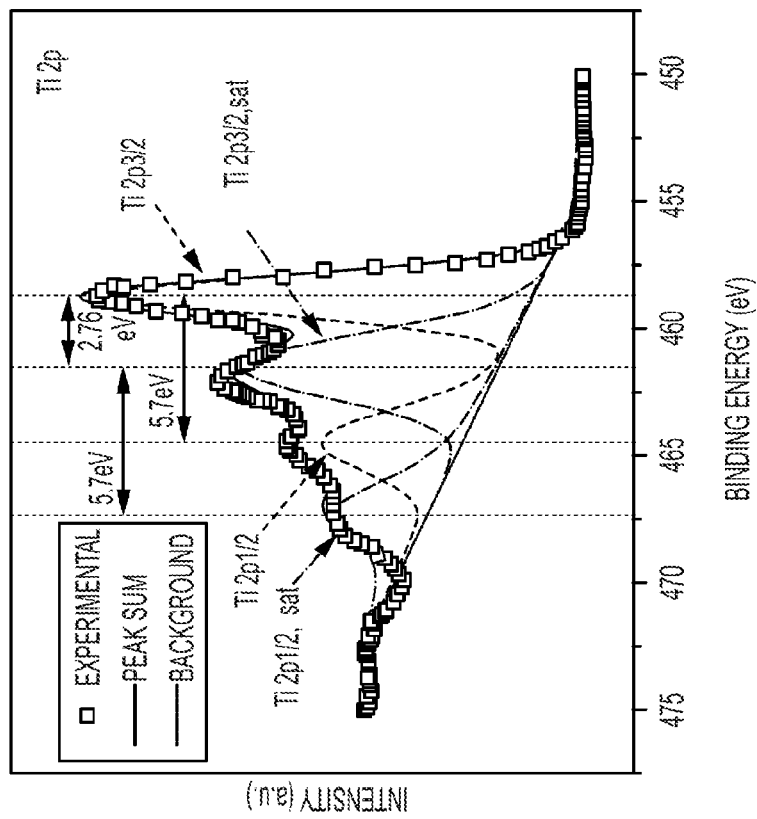
FIG. 12B is an XPS analysis, deconvoluted O 1s XPS spectra of fresh nanowire arrays. Literature information for the satellite peaks can be found in Ref. 81.

The compositional and structural evolution of the as-synthesized nanowires were further analyzed by XPS and TGA-DTA/Mass spectroscopy methods. FIGS. 12A and 12B show the results of XPS analysis from the as-synthesized nano-arrays. The deconvoluted Ti 2p spectra confirms the valence state of titanium to be Ti$^{4+}$ (Ti 2p$_{3/2}$ at 459.25 eV and 2p$_{1/2}$ at 465 eV). The deconvoluted O 1s spectra indicates the existence of three types of oxygen species, including crystal lattice oxygen (Ti—O—Ti at 529.4 eV), hydroxyl groups (OH— at 531.7 eV) and adsorbed molecular H$_2$O (at 535.2 eV).[71-73] The oxygen specie in the hydroxyl groups comes from the H$_2$Ti$_2$O$_5$.H$_2$O phase identified in FIG. 2A, and the crystal lattice oxygen is supposed to be from an amorphous titanium dioxide because no diffraction patterns can be detected in the XRD or SAED images in FIGS. 2A and 2C. The presence of three types of oxygen species was also supported by the TGA-DTA/mass spectra shown in FIG. 2F. The endothermic peak at 129.5° C. with mass loss of 5.56% and H$_2$O signal in the mass spectra is due to the desorption of physically adsorbed water; the endothermic peaks at 264 and 383.8° C. with mass loss of 9.85% and H$_2$O signal peak are due to the desorption of crystalliferous water and the start of removal of OH— groups (dehydroxylation); the final mass loss of 1.26% and the H$_2$O signal peaks in the temperature range of 350-500° C. are due to the complete decomposition of OH— groups (dehydroxylation).[74-75] Meanwhile, the phase transitions observed in the Raman spectra and XRD patterns in FIG. 2E and FIG. 10 can be supported by the DTA data. The exothermal peaks at 315.2 and 434.5° C. correspond to the structural transition from H$_2$Ti$_2$O$_5$.H$_2$O to anatase, and the exothermal peaks in the temperature range of 600-900° C. correspond to the further crystallization of anatase and structural transition from anatase to rutile. Therefore, the experimental results above indicate that the fresh nanowires are a mixture of amorphous TiO$_2$ and hydrogen titanium oxide hydrate, which transforms to anatase and then rutile when heated from room temperature to 1000° C.

Mechanism of the Growth Process

Hydrothermal synthesis is a competition between homogeneous and heterogeneous nucleation in solution.[76-77] The heterogeneous growth of nano-arrays on substrates requires a suitable reaction rate because a too vigorous reaction favors the homogeneous nucleation, making most precursors precipitate in powder form; while a too slow reaction will cancel both the homogeneous and heterogeneous nucleation. Therefore, there is a critical range between the two extremes which can favor the heterogeneous growth of nano-arrays while prohibiting the homogeneous nucleation.

Figure 3:
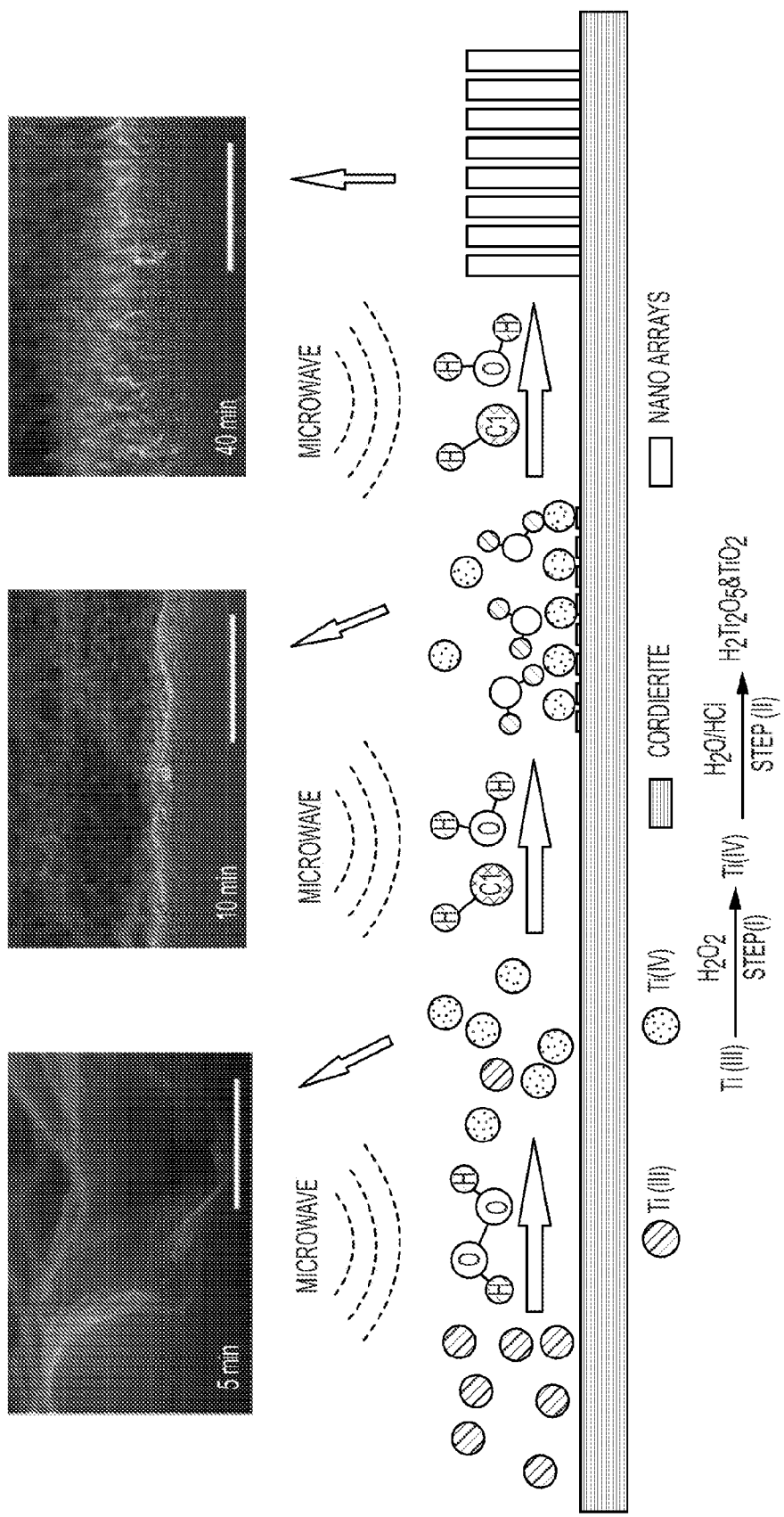
FIG. 3 is a schematic illustration showing the two-step sustained release growth process of the nano-arrays with SEM images of $TiO_2$ NW arrays taken at different reaction stages. The synthesis was carried out at 90° C. on seeded cordierite substrates using a recipe of 3 mL $TiCl_3$ (20%), 15 mL $H_2O_2$ (30%), 3.5 mL HCl (37%) and 185 mL DIW in microwave oven. Scale bars in the inserts are 1 µm.
Figure 13B:
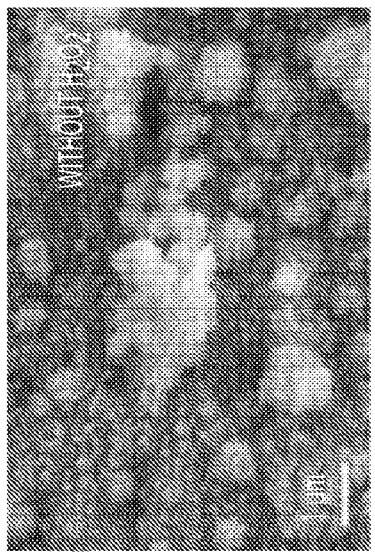
FIG. 13B is an SEM image of the nano-arrays synthesized without $H_2O_2$.
Figure 13C:
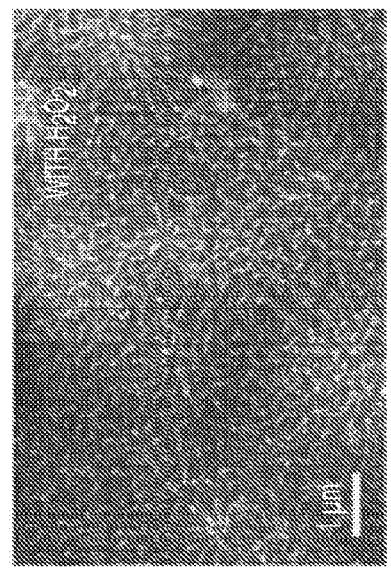
FIG. 13C is an SEM image of the nano-arrays synthesized with $H_2O_2$. The synthesis of the samples in FIGS. 13B and 13C was carried out at 90° C. on seeded cordierite substrates using 3 mL $TiCl_3$ (20%) and 3.5 mL HCl (37%) without and with 15 mL $H_2O_2$ (30%), respectively, balanced by DIW (total solution 200 mL) in microwave oven.
Figure 13A:
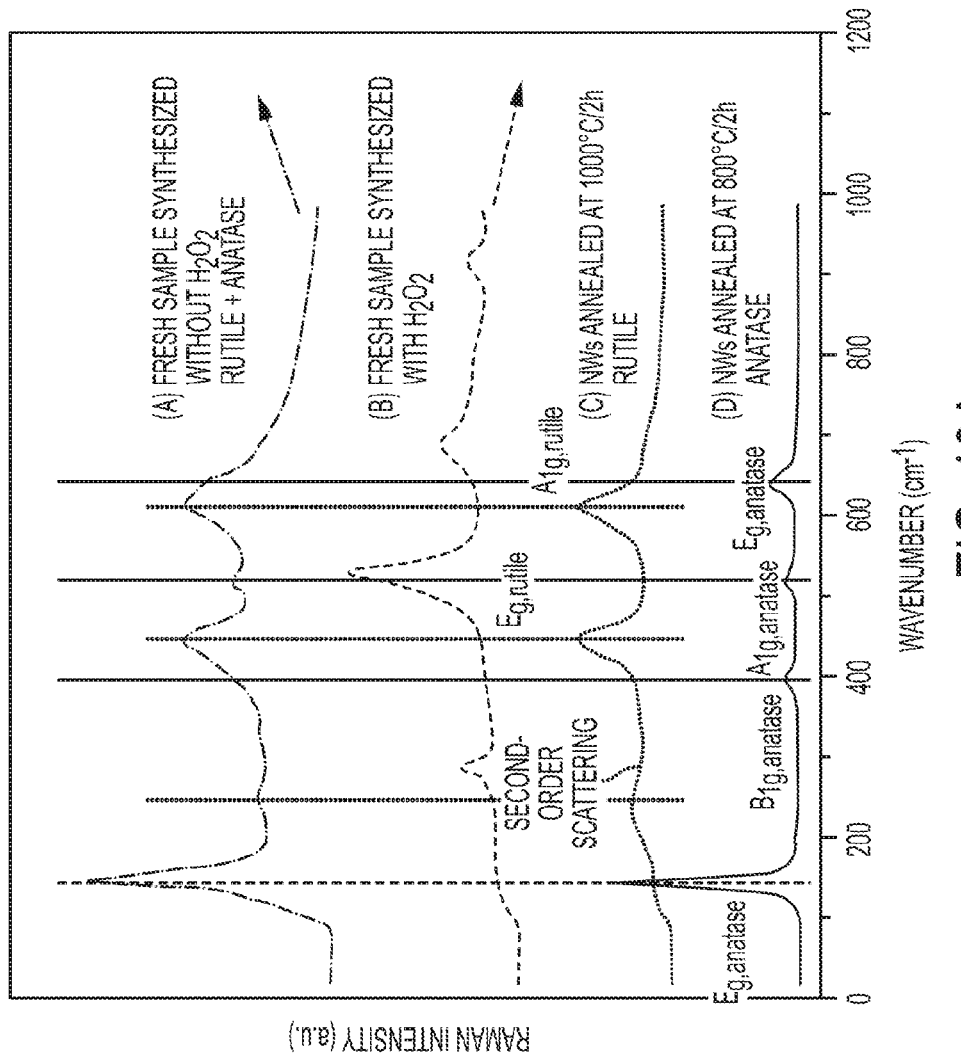
FIG. 13A is Raman spectra of nano-arrays with different treatments: nano-arrays (a) synthesized without $H_2O_2$, (b) synthesized with $H_2O_2$, (c) annealed at 1000° C. for 2 hours, and (d) annealed at 800° C. for 2 hours.
Figure 17A:
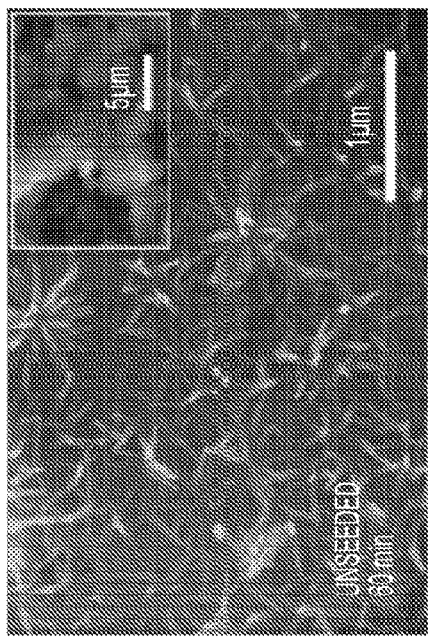
FIGS. 17A-D are SEM images of $TiO_2$ nano-arrays grown on cordierite substrates with different seeding conditions and reaction stages.
Figure 17B:
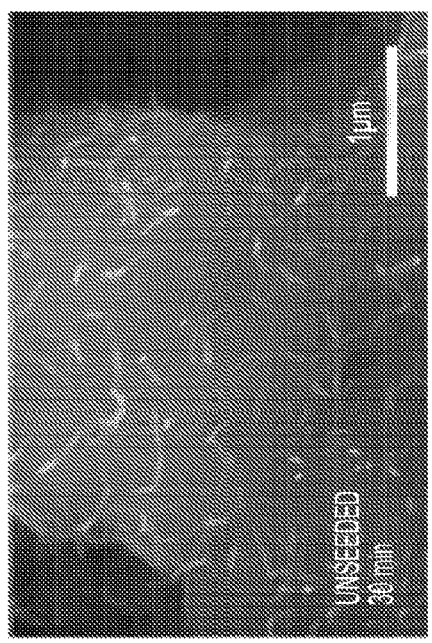
Figure 17C:
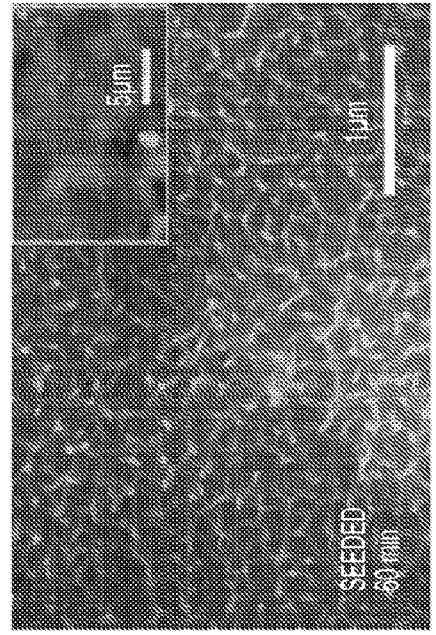
Figure 17D:
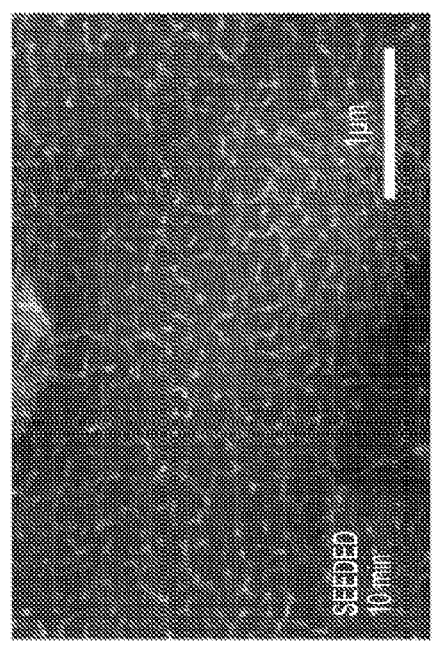

In this work, instead of using the one-step hydrolysis of $Ti^{4+}$ in autoclaves,[41-45] we used $TiCl_3$ as the titanium source, $H_2O_2$ as the oxidizer, hydrochloride acid as the acidity controller, and proposed a two-step sustained-release strategy for the synthesis of $TiO_2$ nano-arrays, as described in the schematics shown in FIG. 3. Initially, the titanium precursors exist in the form of $Ti^{3+}$, which is stable in aqueous solution; and then $Ti^{3+}$ ions are oxidized to $Ti^{4+}$ with the presence of $H_2O_2$ and microwave irradiation; subsequently, with suitable acidity and temperature, $Ti^{4+}$ can be gradually hydrolyzed to form hydrogen titanium oxide hydrate, and finally transforms into $TiO_2$. It should be noted that $H_2O_2$ plays an essential role in the growth process of the nano-arrays. With the existence of $H_2O_2$, uniform nano-arrays of $H_2Ti_2O_5 \cdot H_2O$ can be formed on the surface of the substrates. However, without the presence of $H_2O_2$, no nano-array structures but only randomly distributed precipitates can be found on the surfaces of the substrate. Furthermore, the Raman spectra of the sample synthesized without $H_2O_2$ indicates that the precipitate is a mixture of rutile and anatase, and no peaks of the $H_2Ti_2O_5 \cdot H_2O$ phase can be detected. The Raman spectra and SEM images of the samples prepared with and without $H_2O_2$ are displayed in FIG. 13A-C.

In this two-step reaction, $H_2O_2$ accelerates the reaction by oxidizing $Ti^{3+}$ to $Ti^{4+}$, and the concentration of hydrochloride acid and temperature can be used to control the hydrolysis rate of the $Ti^{4+}$ precursors. Therefore, by adjusting both positive and negative parameters, we can have greater flexibility to control the reaction rate and achieve heterogeneous growth of $TiO_2$ NW arrays at ambient temperature. This two-step sustained-release strategy may also be applicable to the heterogeneous growth of other metal oxide nano-arrays involving the oxidation and hydrolysis processes.

Effects of the Synthetic Conditions on the Growth Process

TABLE 1

Summary of the effects of initial reactant concentrations on the growth process of $TiO_2$ nano-arrays on cordierite honeycomb substrates.

| Sample [a] | Volume of reactants (mL) [b] | | | | A.L. (μm) [c] | Crack |
|---|---|---|---|---|---|---|
| | $TiCl_3$ | $H_2O_2$ | HCl | $H_2O$ | | |
| RT-1 | 1.732 | 15 | 3.694 | 186.074 | 0.68 | No |
| RT-2 | 3 | 15 | 3.5 | 185 | 0.98 | No |
| RT-3 | 4.329 | 15 | 3.296 | 183.874 | 1.18 | Yes |
| RT-4 | 6.061 | 15 | 3.031 | 182.408 | 1.16 | Yes |
| RO-1 | 3 | 0 | 3.5 | 200 | No arrays | — |
| RO-2 | 3 | 9 | 3.5 | 191 | 0.90 | No |
| RO-3 | 3 | 15 | 3.5 | 185 | 0.98 | No |
| RO-4 | 3 | 20 | 3.5 | 180 | 0.46 | No |
| RH-1 | 3 | 15 | 0 | 185.5 | 0.21 | Yes |
| RH-2 | 3 | 15 | 1.5 | 187 | 0.65 | Yes |
| RH-3 | 3 | 15 | 3.5 | 185 | 0.98 | No |
| RH-4 | 3 | 15 | 7.5 | 181 | No arrays | — |
| RH-5 | 3 | 15 | 10.5 | 178 | No arrays | — |

[a] The starting materials are seeded cordierite substrates (1 cm × 2 cm × 3 cm), and the reactions were carried out at 80° C. for 60 min under microwave irradiation.
[b] All chemicals listed were used as received without further purification.
[c] A.L. = average length of the nanowire arrays The effect of initial reactant concentration on the growth of $TiO_2$ nano-arrays is summarized in Table 1. Three comparison groups, RT-X, RO-X and RH-X (T=$TiCl_3$, O=$H_2O_2$, H=HCl, X=1~5), were designed by setting the initial concentrations of $TiCl_3$, $H_2O_2$ and HCl as variables while keeping other parameters constant, respectively. The average length of the nano-arrays and the presence of cracks in the nano-array layers are used to qualify the growth. The top-view and cross-sectional view of the $TiO_2$ nano-arrays from the three comparison groups are displayed in FIGS. 14A-H, 15A-H, and 16A-H, respectively. Generally, the increasing concentration of all three components, $TiCl_3$, $H_2O_2$ and HCl, can promote the growth of the nano-arrays at low concentrations, but prohibit or totally cancel the heterogeneous growth at higher concentrations. More specifically, the RT-X group indicated that the nano-arrays ceased to grow longer with $TiCl_3$ concentration higher than 0.50 wt. %, and higher density nano-arrays formed with smaller interspace between adjacent arrays. Cracks started to appear in such nano-array layers, which could be due to the internal stress caused by the increased hydrolysis rate. $H_2O_2$ plays an essential role in the growth of the nano-array, but higher concentration of $H_2O_2$ can also prohibit the growth of the nano-arrays, as indicated by Sample RO-4. Possible reasons can be that too much $H_2O_2$ accelerated the hydrolysis process, and promoted the homogenous rather than heterogeneous nucleation. Hydrochloride acid is used to control the reaction rate by creating a suitable acid environment. Low concentration of HCl resulted in more closely packed and shorter nano-arrays with cracks, as indicated by the samples of RH-1 and RH-2, while too much HCl can totally cancel the heterogeneous growth of nano-arrays. That is because the $Ti^{4+}$ ions hydrolyze much faster in less acid solutions, and more $Ti^{4+}$ precursors nucleate homogeneously rather than heterogeneously in the solution. This assumption is supported by the fact that more homogeneously precipitated particles were found in the reacted solutions for Sample RH-1 and RH-2. Therefore, the observations from the three comparison groups elucidate how the initial concentrations of $TiCl_3$, $H_2O_2$ and HCl effect the growth of $TiO_2$ NW arrays, which successfully supports the reaction mechanism proposed in the Mechanism of the Growth Process section. The optimized initial concentrations of the reactants are 3 mL $TiCl_3$ (20%), 15 mL $H_2O_2$ (30%), 3.5 mL hydrochloride acid (37%) in 185 mL DI water.

Figure 4A:
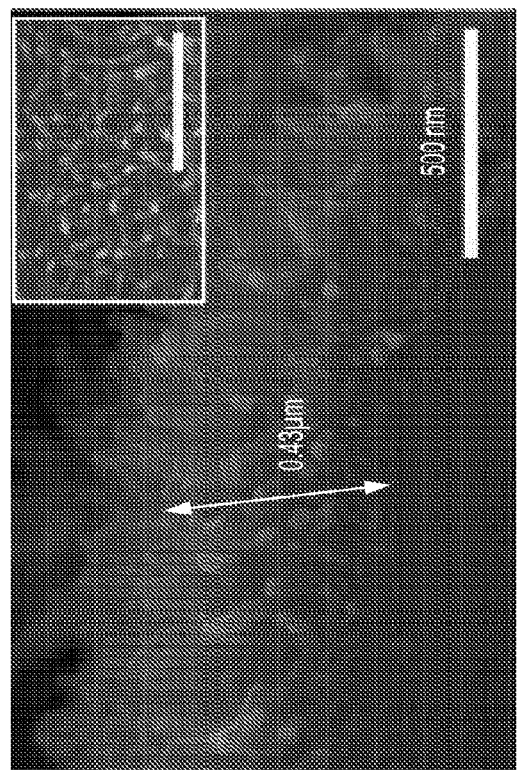
FIGS. 4A-C are SEM images of $TiO_2$ nano-arrays grown on seeded cordierite substrates with different reaction time and heating methods.
Figure 4B:
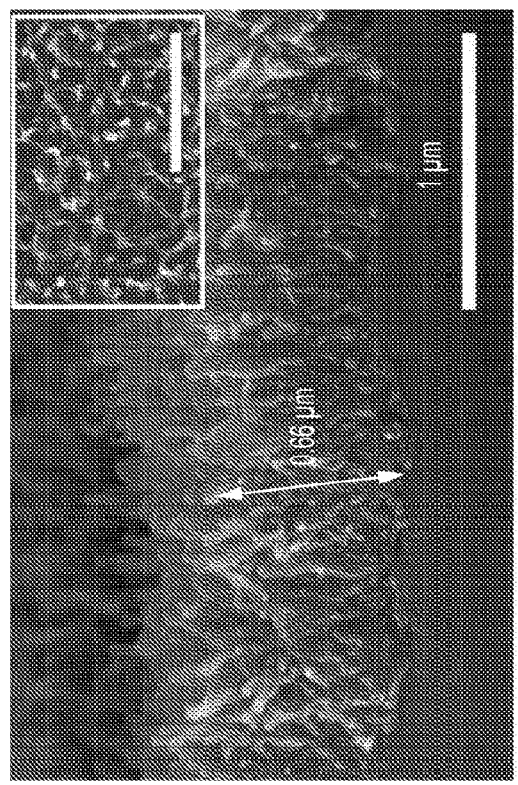
Figure 4C:
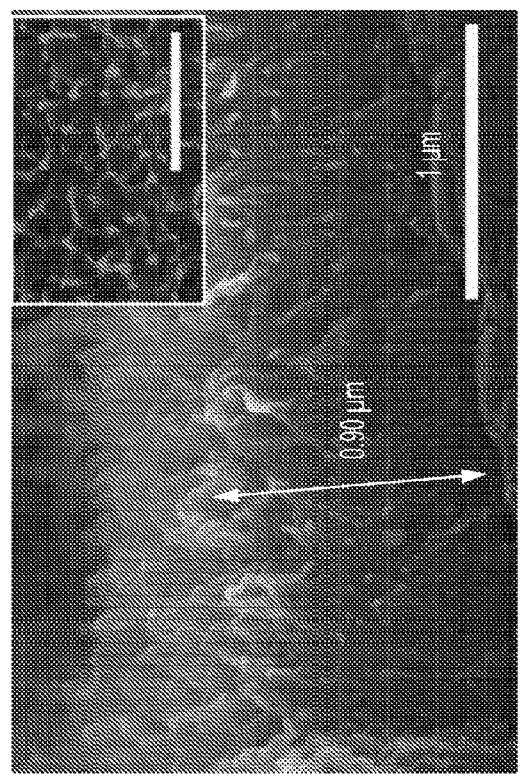
Figure 4D:
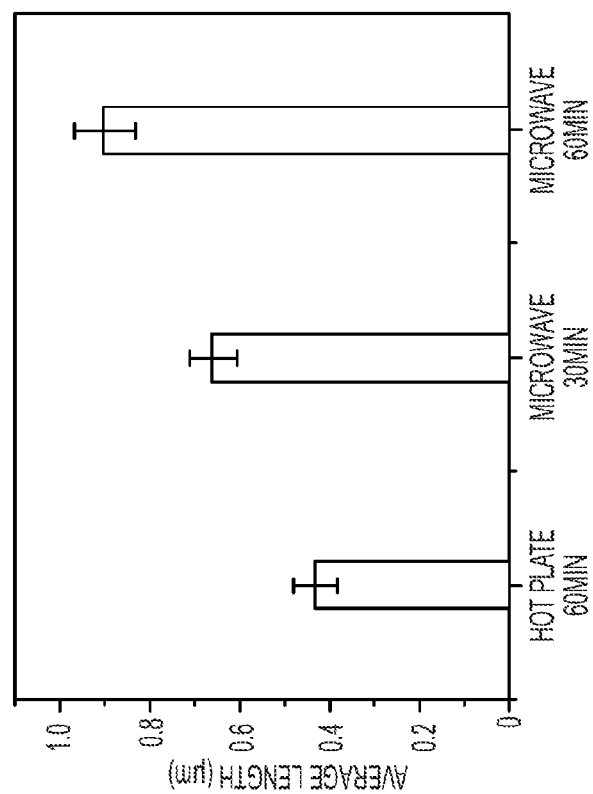
FIG. 4D is a chart showing a summary of the average length of nano-arrays using different heating methods. The reactions were carried out at 80° C. using the recipe of 3 mL $TiCl_3$ (20%), 9 mL $H_2O_2$ (30%), 3.5 mL hydrochloride acid (37%) in 191 mL DI water. Scale bars in the inserts are 1 µm.

Besides the initial reactant concentration effect, we also studied the effects of the external parameters, including the heating methods, pre-seeding layers, and reaction temperatures. The SEM images in FIGS. 4A-C characterize the morphologies of $TiO_2$ nano-arrays synthesized using hot plate and microwave as heating sources. FIGS. 4A and 4C indicate that the average length of the nano-arrays prepared by hot plate (0.43 µm) is much shorter than that prepared by microwave oven (0.90 µm), and even shorter than the nano-arrays prepared by microwave using half reaction time (0.66 µm) in FIG. 4B. The higher growth rate of the nano-arrays by microwave is due to the rapid and uniform volumetric heating of microwave irradiation, as compared with the conventional conduction heating by hot plate.[55] When heated by microwave, the temperature increases uniformly in the solution and reached the desired temperature quickly. While for the solution heated by hot plate, the temperature increases gradually through conduction, which not only is of low efficiency, but also results in a temperature gradient in the solution. The difference in the temperature of the solutions further causes the different reaction rates within the reacting volume, because the outer layer solution with higher temperatures reacts more vigorously than the inner layer solution. As such, homogeneous nucleation would be favored in the outer solution, which is evidenced by the more homogeneously precipitated particles formed in the solutions heated by hot plate. Therefore, microwave irradiation is more efficient than the conventional thermal conduction heating method for industrial level fabrication with higher production rate and material utilization efficiency.

Pre-seeding is another crucial 'parameter' for controlling the hydrothermal synthesis quality of nano-arrays. Generally, heterogeneous growth on existing seeds tends to be energetically more favorable than nucleation in homogeneous solution because the existing seeds bypass the activation energy barrier for nucleation.[76] In this work, the promotion effect of pre-seeding on the growth of nano-arrays is also significant even for growing the nanomaterials with poor crystallinity. The morphologies of samples with and without pre-seeding layers are compared in FIGS. 17A-D. For the unseeded samples, bare cordierite surfaces can still be found even after 60 min reaction. While for the sample with pre-seeding layers, a uniform nano-array layer was quickly formed on the surface of cordierite substrates in the first 10 minutes, and more ordered and uniform nano-array layers were formed after 60 min.

Figure 18A:
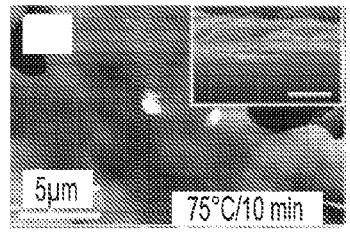
FIG. 18A-P are SEM images of the top view and cross-sectional view (inset) of $TiO_2$ nano-array series synthesized at different temperatures.
Figure 18E:
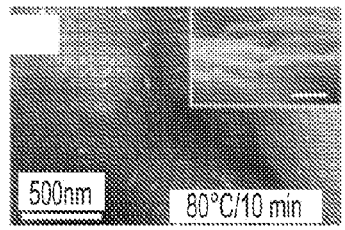
FIGS. 18E-H: 80° C.
Figure 18B:
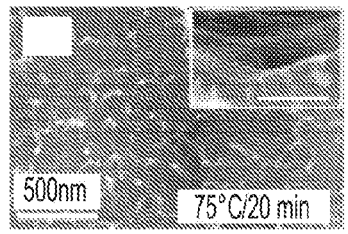
Figure 18F:
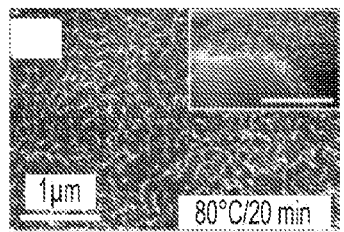
Figure 18C:
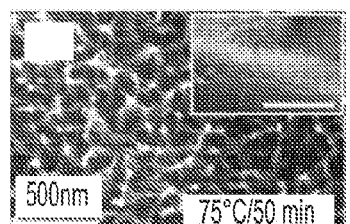
Figure 18G:
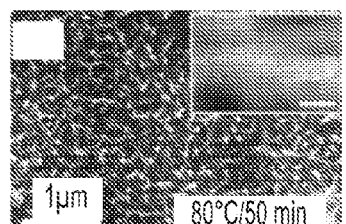
Figure 18D:
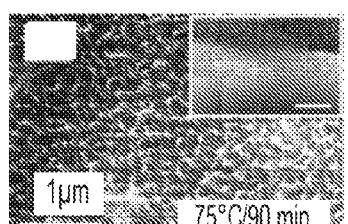
Figure 18H:
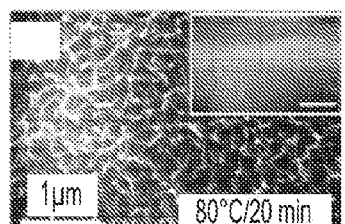
Figure 18I:
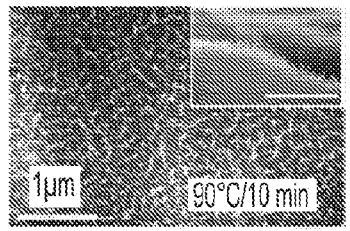
FIGS. 18I-L: 90° C.
Figure 18M:
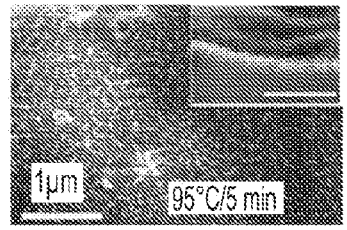
Figure 18J:
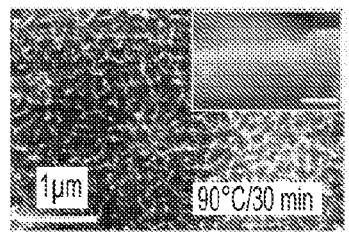
Figure 18N:
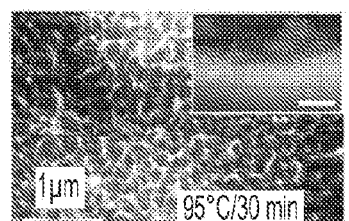
Figure 18K:
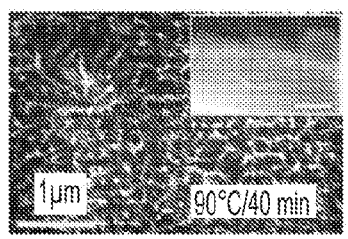
Figure 18O:
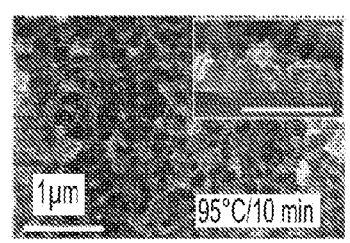
Figure 18L:
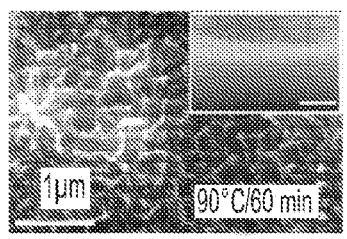
Figure 18P:
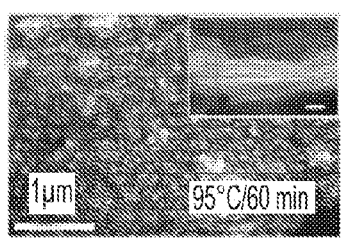
Figure 19:
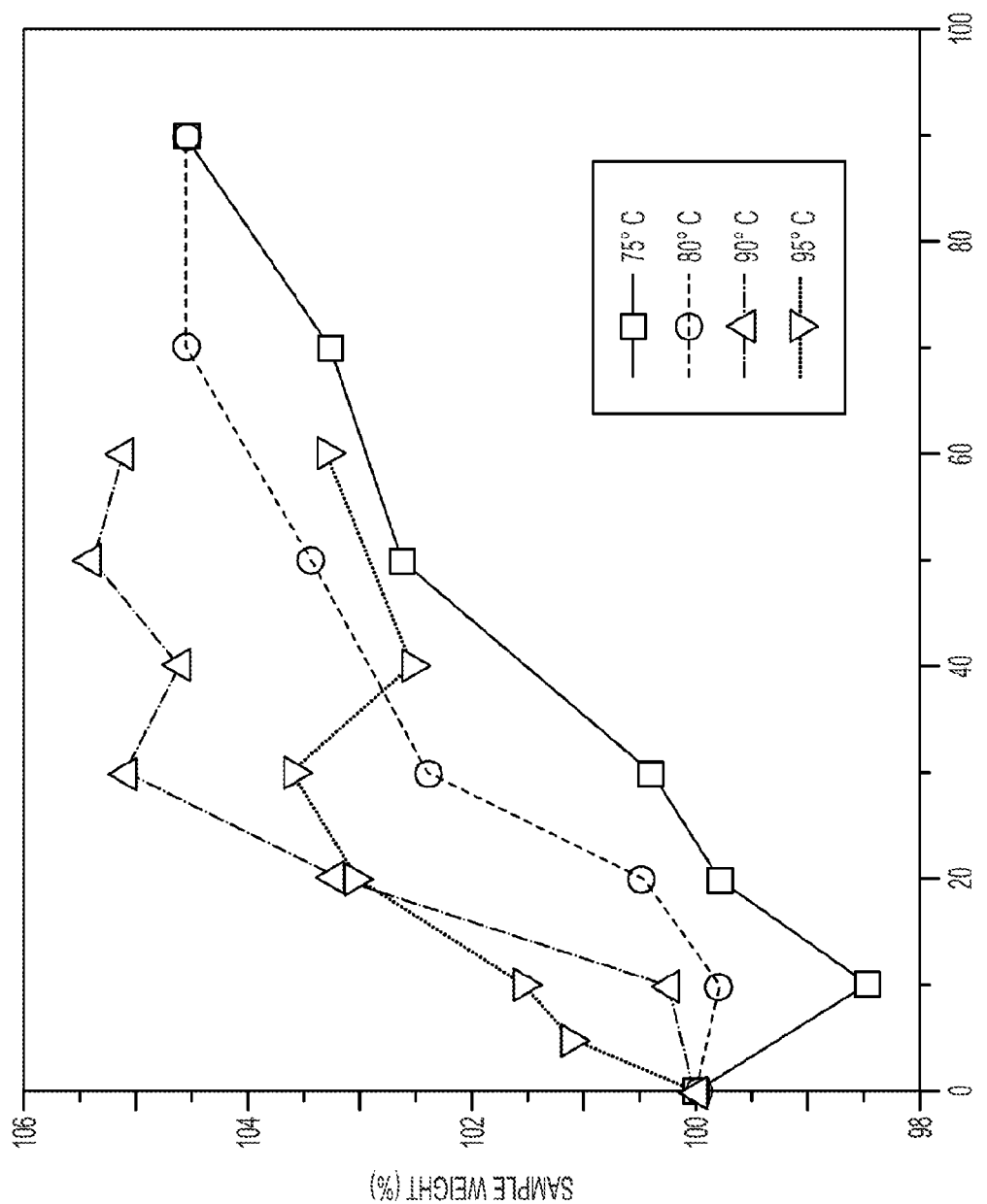
FIG. 19 is a graph showing changes of the sample weight of $TiO_2$ nano-array based monoliths along the reaction time under different temperatures.

Temperature is an important parameter for any chemical reactions, and usually has a dominant influence on the reaction rate. In this work, we studied the growth rates of the $TiO_2$ nano-arrays at the temperature of 75, 80, 90 and 95° C. FIGS. 5A and 18A-P display the evolutions of the average length and the morphology of the $TiO_2$ nano-arrays with the reaction time at different temperatures, respectively. The corresponding changes in sample weight are also presented in FIG. 19. From FIG. 5A, we can see that the nano-arrays in all four temperatures eventually tend to reach a maximum length, and the higher temperature results in higher initial growth rates and shorter time for the nano-arrays to cease the growth. For the samples synthesized at 75 and 80° C., no nano-arrays were formed in the first 10 min, indicating an incubation time for the formation of the first layers of nano-arrays at low temperatures. Meanwhile, there is weight loss in the samples synthesized at 75 and 80° C. in the first 10 minutes. That is because the cordierite substrates were corroded by the acid solution, and there was not enough $TiO_2$ precipitated onto the substrates at the beginning of growth process. For the samples synthesized at 90 and 95° C., no obvious incubation time was detected, and the average lengths of the nano-arrays increased to 0.18 and 0.21 µm in the first 10 and 5 min, respectively. The growth rates of $TiO_2$ nano-arrays in the present work were summarized and compared with the data from the literature using conventional autoclave based methods in Table 2, and the growth rate of 42 nm/min in our work is the highest among these data.

It is worthwhile looking into the 90 and 95° C. growth processes, as they led to the longest final length and the highest initial growth rate, respectively. As shown in FIG. 5B, the 90 and 95° C. growths reached the maximum length of ~0.75 µm and ~0.53 µm after 50 and 30 min, respectively. The reason for the higher initial growth rate but shorter final length in the 95° C. process might be that higher temperature promotes the process of heterogeneous growth of $TiO_2$ nano-arrays, decomposition of $H_2O_2$, and evaporation of HCl simultaneously. At the beginning, sufficient amount $H_2O_2$ and HCl sustains the two-step sustained-release growth process. As the reaction proceeds when $H_2O_2$ and HCl are consumed, homogeneous precipitation of nanoparticles becomes favored over the heterogeneous growth of nano-arrays. That is why clean and ordered nano-arrays formed at 95° C. with 30 min growth duration (FIG. 18N), while homogeneously precipitated nanoparticles were observed in the samples grown for 40 (FIG. 18O) and 60 min (FIG. 18P). Moreover, the crystal structures of the precipitates before and after the nano-arrays reaching the maximum length formed are also different. FIG. 5B displays the Raman spectra of the samples synthesized at 95° C. for 30 and 60 min, which correspond to the SEM images of the samples in FIGS. 18N and 18P, respectively. The Raman spectra and SEM images indicate that, before the nano-arrays reach the maximum length at 30 min, the nano-arrays are mainly composed of $H_2Ti_2O_5.H_2O$; after the nano-arrays reach the maximum length, homogeneous precipitated particles begin to form, and the sample becomes a mixture of $H_2Ti_2O_5.H_2O$, anatase and rutile. The change in phase composition of the precipitates agrees well with the reaction mechanism proposed in the Mechanism of the Growth Process section. Obviously, with the presence of $H_2O_2$, ordered $H_2Ti_2O_5.H_2O$ nano-arrays were formed through the two-step sustained release growth process, and when $H_2O_2$ is consumed, anatase and rutile phases precipitate instead of $H_2Ti_2O_5.H_2O$. Therefore, even though we did not obtain the longest final length from the 95° C. growth process, the initial growth rate of 42 nm/min is still promising. As we keep refreshing the solutions through continuous flow process using dedicated reactors, the concentration of reactants may be maintained, and the growth of $TiO_2$ nano-arrays can be sustained.

TABLE 2

Summary of synthetic methods and growth rate of $TiO_2$ nano-arrays.

| Ref. | Recipe[a] | Conditions | Substrates[b] | A.L. (µm)[c] | G.R. (nm/min)[d] |
|---|---|---|---|---|---|
| This work | $TiCl_3$ + $H_2O_2$ + HCl + DIW | 90° C./10 min | Cordierite monolith | 0.18 | 18 |
|  |  | 95° C./5 min |  | 0.21 | 42 |
| 13 | Ti(IV) butoxide + $TiCl_4$ + HCl + Toluene | 150° C./10 h | Cordierite monolith | 2 | 3.33 |

TABLE 2-continued

Summary of synthetic methods and growth rate of $TiO_2$ nano-arrays.

| Ref. | Recipe[a] | Conditions | Substrates[b] | A.L. (μm)[c] | G.R. (nm/min)[d] |
|---|---|---|---|---|---|
| 25 | $TiCl_3$ + NaCl + DIW | 180° C./4 h | Cordierite monolith | 0.25 | 0.83 |
| 42 | Ti(IV) butoxide + HCl + DIW | 150° C./20 h | FTO glass | 2 | 1.67 |
| 41 | Ti(IV) butoxide + $TiCl_4$ + HCl + Toluene | 180° C./2 h | FTO glass | 2.1 | 17.5 |
|  |  | 180° C./4 h |  | 3.2 | 13.33 |
|  |  | 180° C./8 h |  | 3.8 | 6.33 |
|  |  | 180° C./22 h |  | 4 | 3.00 |
| 78 | TBOT + HCl + Toluene | 180° C./3 h | FTO glass | 2 | 11.17 |
|  |  | 180° C./20 h |  | 6 | 5 |
| 79 | TTIP + ACAC + $Na_2EDTA$ + DIW | 200° C./7 h | FTO glass | 0.7 | 1.67 |
|  |  | 200° C./11 h |  | 1.1 | 1.67 |
|  |  | 200° C./20 h |  | 1.4 | 1.17 |
| 67 | $TiCl_3$ + DIW | 150° C./12 h | FTO glass | 9.6 | 13.33 |

[a]TBOT = $Ti(OC_4H_9)_4$ tetrabutyl titanate; TTIP = Titanium (IV) isopropoxide; ACAC = Acetylacetone; DIW = Deionized water;
[b]FTO = fluorine doped Tin oxide
[c]A.L. = average length of the nano-arrays
[d]G.R. = growth rate of the nano-arrays Scalable Fabrication on Commercial Monolithic Honeycomb Substrates The feasibility of hydrothermal synthesis of 1D nano-arrays onto the channeled monoliths has been demonstrated on small-sized samples in our previous reports.[8-11] However, challenges remain when scaling up the samples to industrially relevant sized substrates due to the difficulty of efficient mass transfer of precursors onto the space confined channel-surfaces. Especially when the reaction temperature is low, the reactant solution is relatively stagnant during the synthesis, resulting in less uniformly distributed nano-arrays across the channels.[8, 10, 22]

Figure 20B:
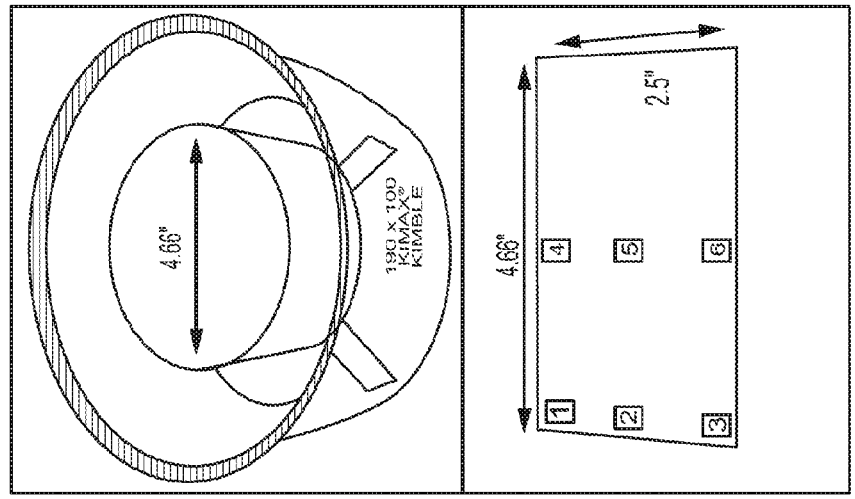
FIG. 20B is photographs of the commercial monolithic honeycomb with dimensions of 4.66" in diameter and 2.5" in length.
Figure 20A:
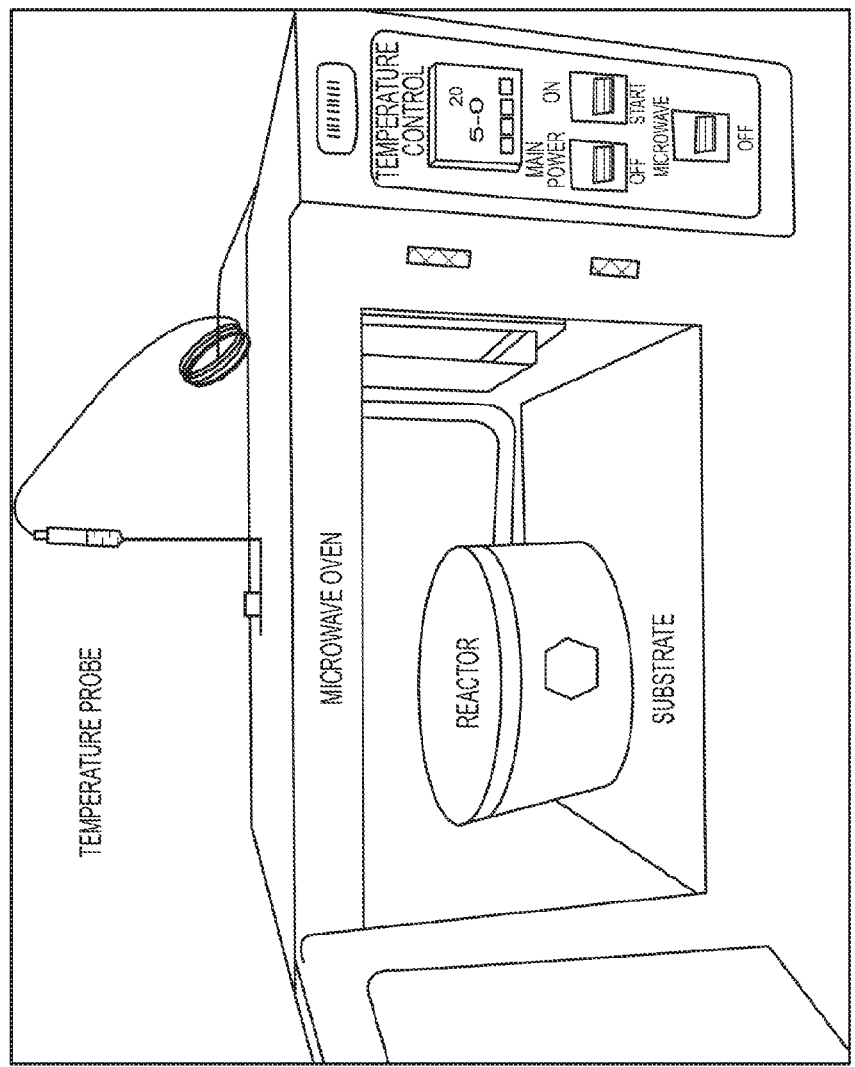
FIG. 20A is a photograph of the experimental set-up used in the present work.
Figure 20C:
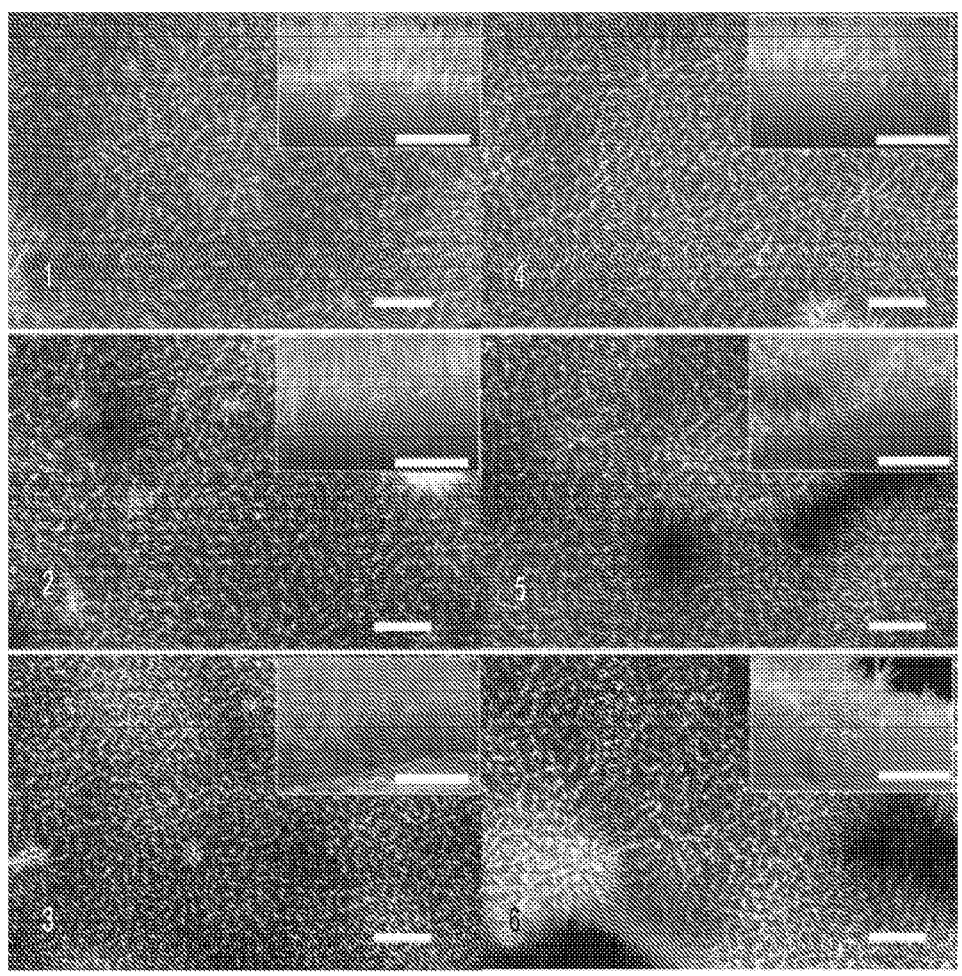
FIG. 20C is large-area SEM images of the $TiO_2$ nanowire arrays grown inside the commercial monolithic honeycomb, confirming that a uniform coverage of nanowires (~0.7 µm in length) was achieved throughout the 2.5-inch long honeycomb channels. The reactions were carried out at 80° C. using the optimized recipe. Volume of solution=8 L, reaction time: 30 min×4=2 h.

In the present study, using the robust experimental set-up shown in FIGS. 20A-B, uniform $TiO_2$ nano-arrays with an average length of ~0.7 μm were successfully integrated onto a full-size commercial honeycomb, as shown in the top views and cross-sectional views in FIG. 20C. The good uniformity of the nano-arrays can be attributed to the large amount of oxygen bubbles produced during the reaction. Microwave radiation heats the solution by alternating electromagnetic fields, in which $H_2O_2$ preferably decomposes on the substrate surfaces to release oxygen. Therefore, large amount of tiny $O_2$ bubbles keep coming out through the channels during the reaction, which greatly enhances the mass transfer through the channels, and thus fresh precursors will be continuously transferred to the surfaces and participate in the reactions. Considering the easy process as well as the low temperature and pressure requirements, this robust one-pot hydrothermal synthesis method can be very promising if integrated with industrially relevant equipment for mass production.

Application as Catalytic Converters

Figure 21:
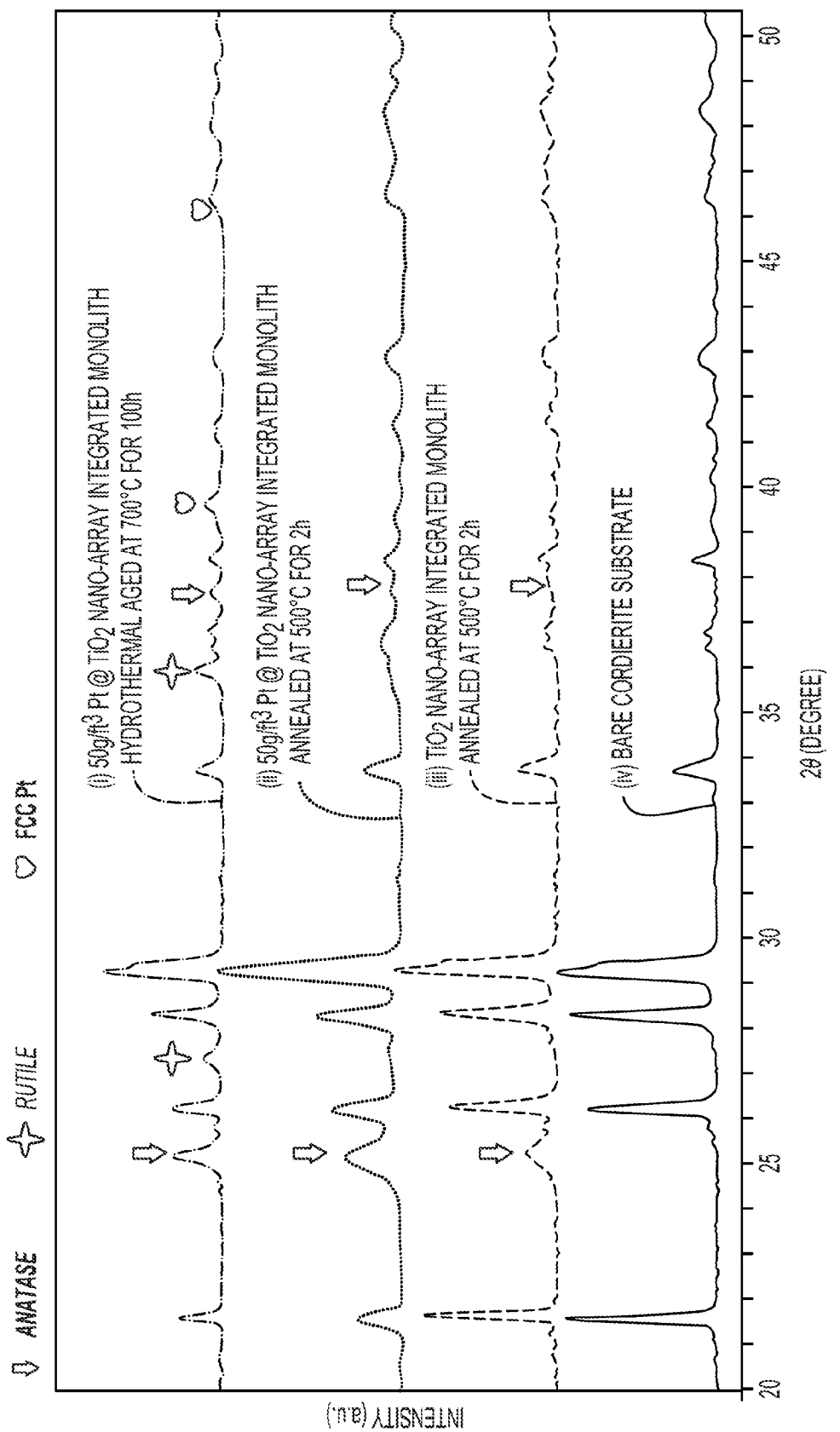
FIG. 21 is XRD patterns of the Pt@$TiO_2$ nano-array integrated monoliths before and after hydrothermal aging, and the cordierite monolith with and without $TiO_2$ nanoarrays.

The catalytic performance for LTC-D simulated exhaust oxidation over the Pt supported $TiO_2$ nano-array based monolithic catalysts and the wash-coated commercial DOC samples are summarized in FIGS. 6A-F and Table 3. With a PGM loading of 50 g/ft$^3$, the fresh Pt supported $TiO_2$ nano-array based catalyst exhibits light-off temperatures as low as ~150° C. for the oxidation of CO and HCs species (FIGS. 6A and 6B), which is comparable to the performance of the commercial DOC samples with a 120~200 g/ft$^3$ PGM loading amount.[80] After being hydrothermally aged at 700° C. for 100 hr., the Pt supported $TiO_2$ nano-array based catalyst shows a slight increase of ~50° C. in the light-off temperatures of hydrocarbon species (FIGS. 6C and 6D), which reveals the excellent hydrothermal stability of the nano-array based samples. The High Angle Annular Dark Field (HAADF) and EDX mapping images displayed in FIGS. 7A-C exhibit the uniformly dispersed Pt NPs on the $TiO_2$ NW surfaces with a size distribution of 0.5~2.5 nm. The HRTEM images inserted in FIG. 7A confirm the presence of metallic Pt (JCPDS 04-0802) and anatase $TiO_2$ (JCPDS 21-1272) in the fresh catalysts. The XRD patterns displayed in FIG. 21 indicate a phase transition from anatase (JCPDS 21-1272) to rutile (JCPDS 21-1276) in the support materials during the extended hydrothermal aging process at 700° C. Although the presence of XRD peaks for metallic Pt indicates the existence of larger Pt particles in hydrothermally aged samples, the well-maintained catalytic activity and the highly dispersed Pt NPs demonstrate the excellent hydrothermal stability with enhanced sintering resistance for $TiO_2$ nano-arrays.

TABLE 3

Summary of light-off temperatures of different components[a,b].

| Component | Fresh catalysts | | | HT aged catalysts[c] | | | Sonicated catalysts | | |
|---|---|---|---|---|---|---|---|---|---|
|  | T10 | T50 | T90 | T10 | T50 | T90 | T10 | T50 | T90 |
| Nano-array based catalysts | | | | | | | | | |
| CO | 95 | 135 | 159 | 110 | 176 | 228 | 80 | 123 | 176 |
| THC | 153 | 171 | 230 | 210 | 231 | 245 | 163 | 172 | 280 |
| $C_2H_4$ | 160 | 170 | 182 | 220 | 231 | 240 | 163 | 172 | 179 |
| $C_3H_6$ | 140 | 169 | 180 | 200 | 227 | 240 | 163 | 172 | 179 |
| $C_3H_8$ | 192 | 312 | 410 | 230 | 320 | 418 | 175 | 352 | 430 |
| Commercial DOC samples | | | | | | | | | |
| CO | 100 | 131 | 155 | 107 | 149 | 160 | 202 | 216 | 280 |
| THC | 141 | 155 | 253 | 151 | 190 | 275 | 220 | 295 | 465 |
| $C_2H_4$ | 145 | 155 | 162 | 169 | 200 | 222 | 245 | 300 | 490 |
| $C_3H_6$ | 131 | 151 | 161 | 147 | 161 | 181 | 215 | 268 | 340 |
| $C_3H_8$ | 230 | 290 | 325 | 280 | 320 | 346 | 372 | 430 | 466 |

[a]Light-off temperatures in Celsius (° C.)
[b]T10 = temperature of 10% conversion; T50 = temperature of 50% conversion; T90 = temperature of 90% conversion;
[c]HT = hydrothermally aged at 700° C. for 100 hr.

Figure 6B:
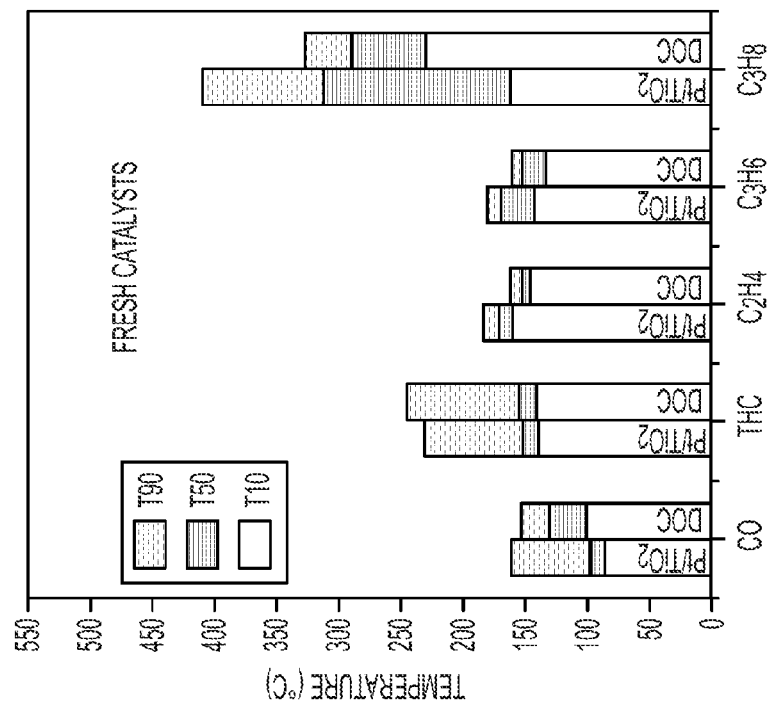
FIG. 6A-F are light-off curves for catalytic simulated gas oxidation of Pt/$TiO_2$ nano-array based monolithic catalysts and comparison with commercial DOC samples.
Figure 6A:
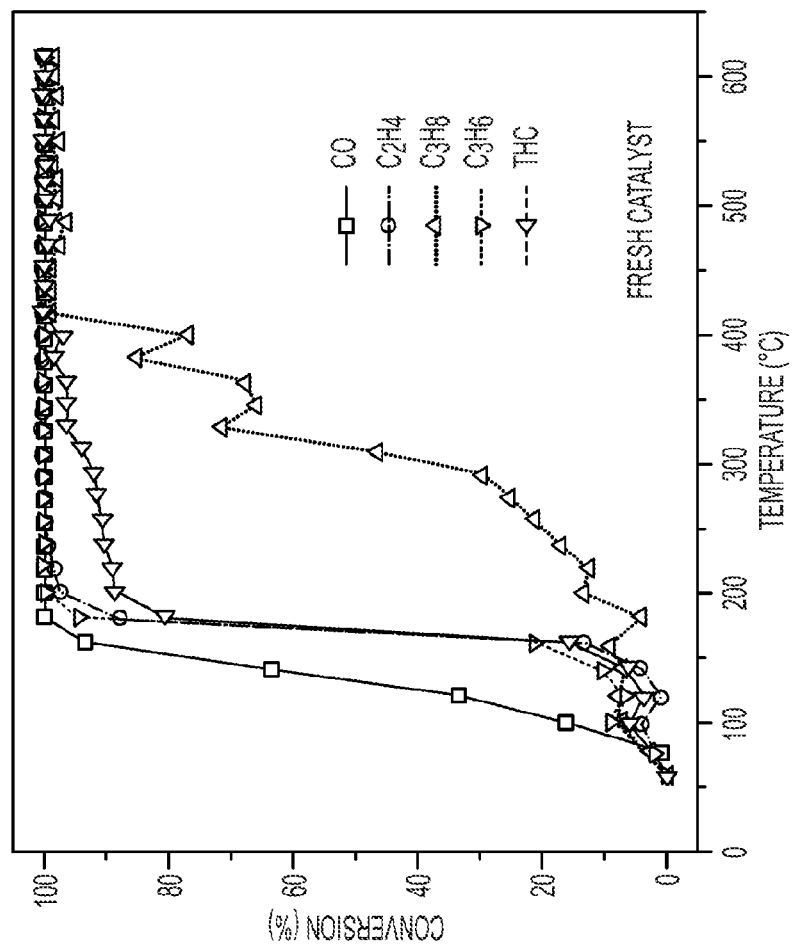
Figure 6D:
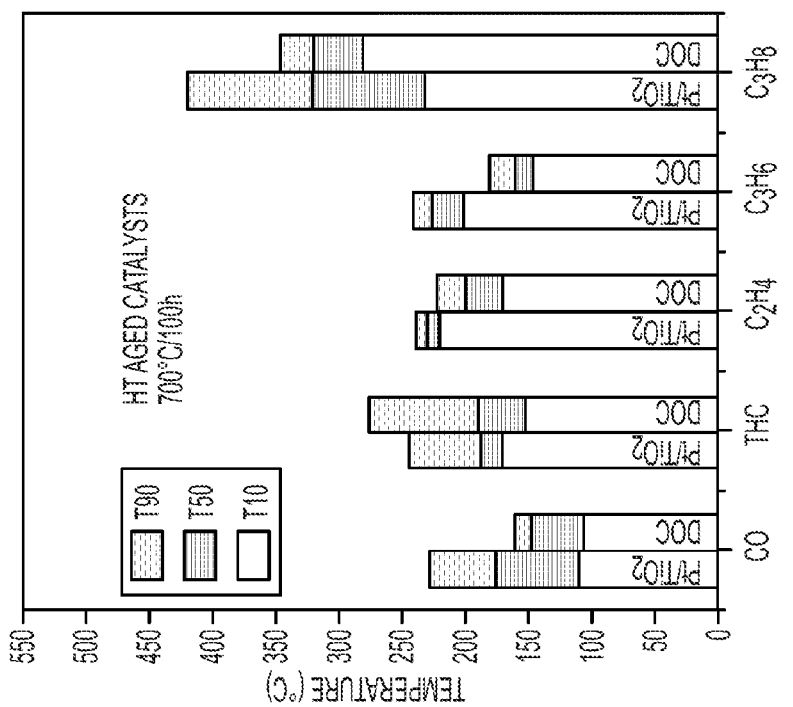
Figure 6C:
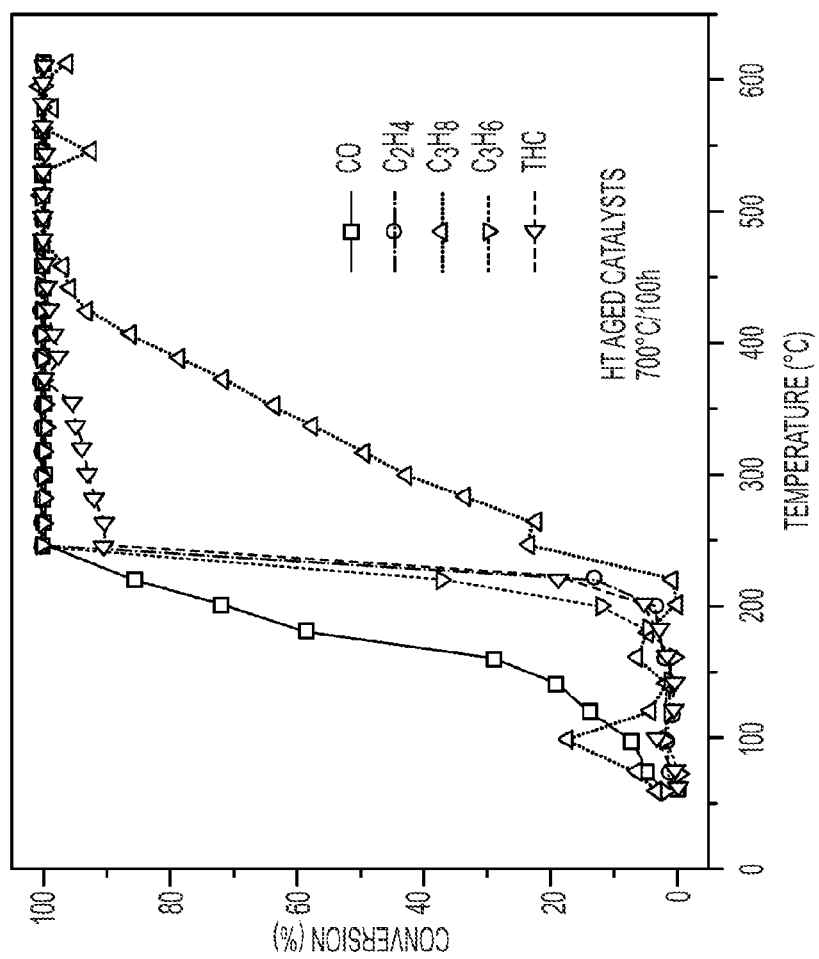
Figure 6F:
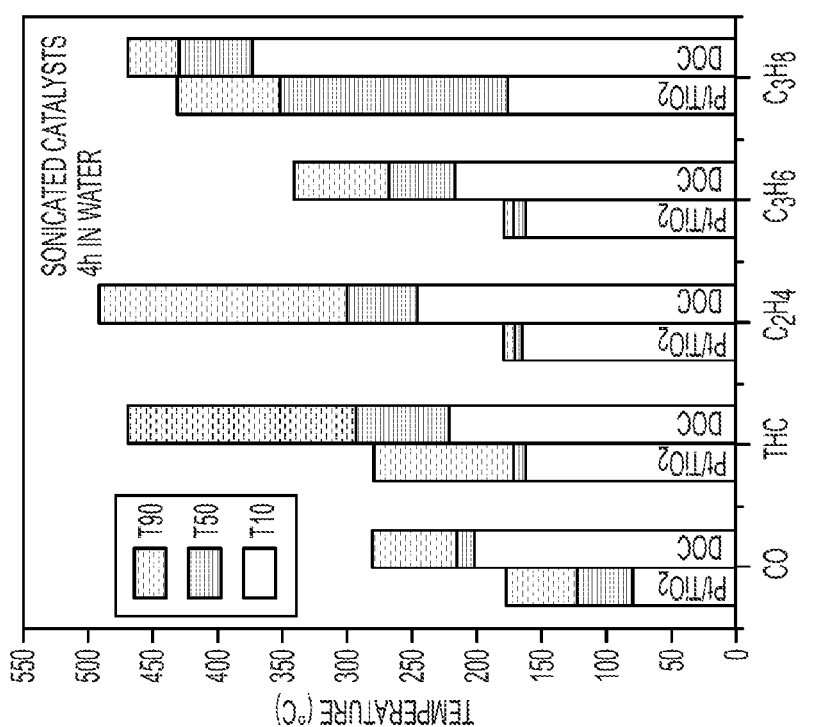
Figure 6E:
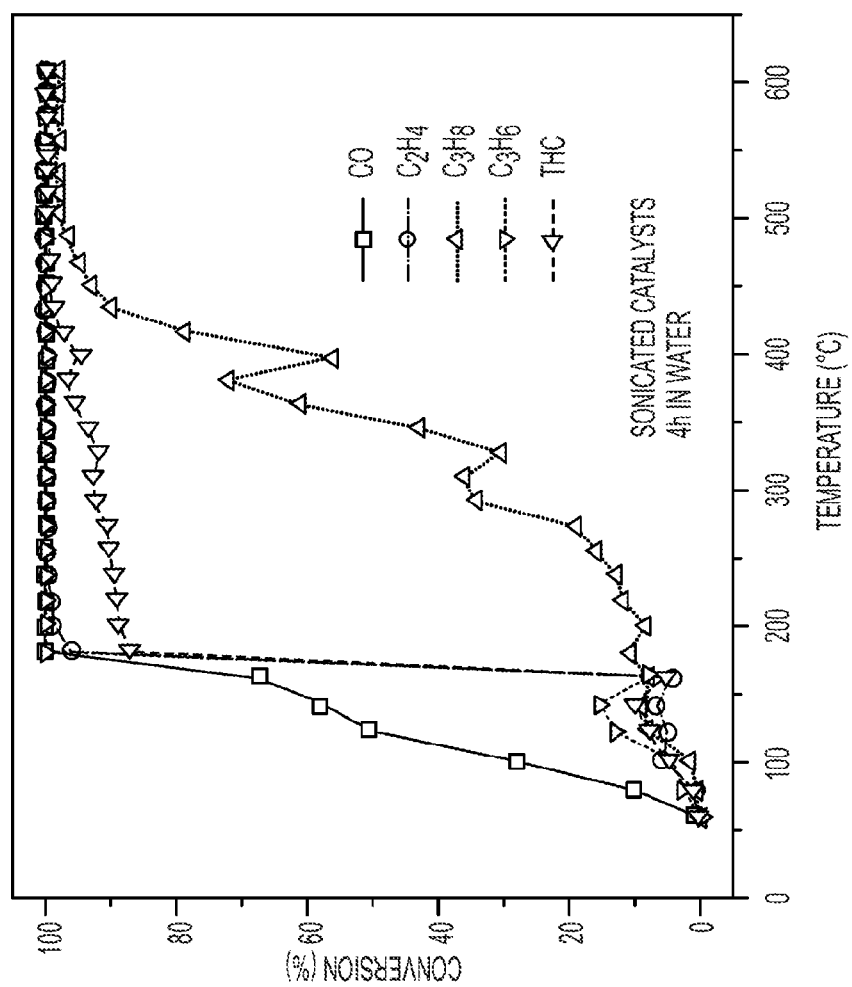
Figure 7D:
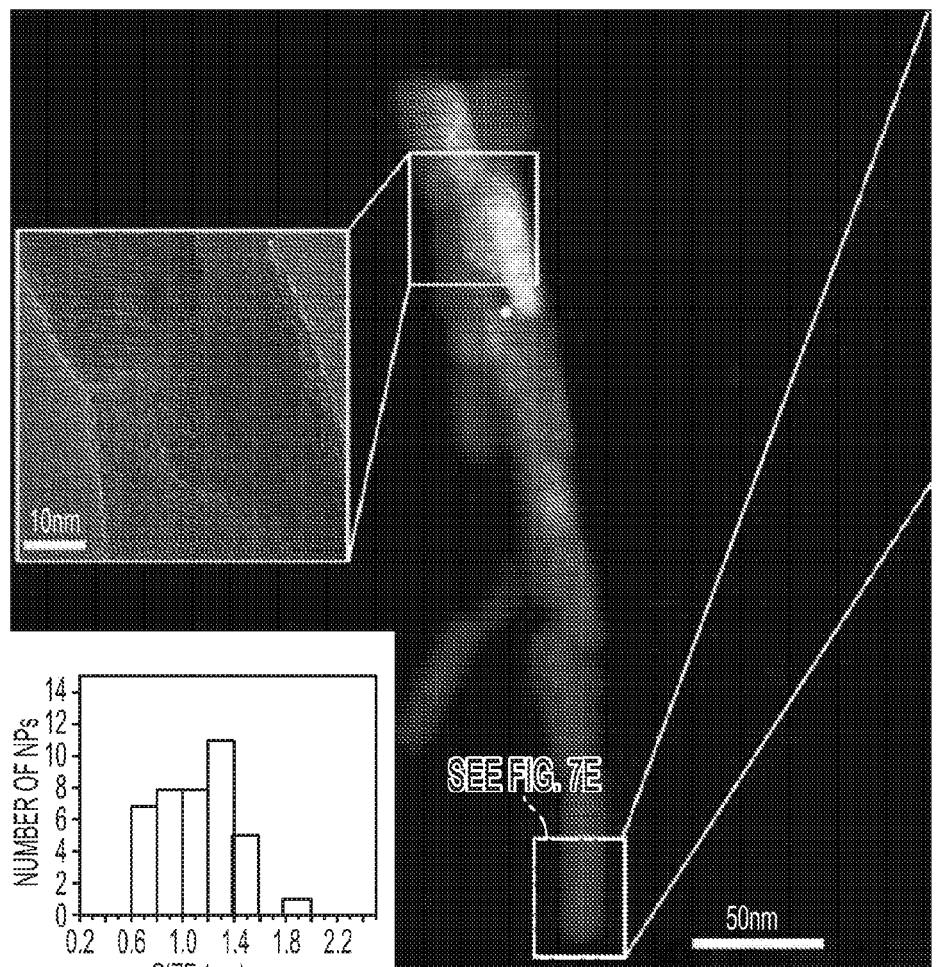
Figure 7E:
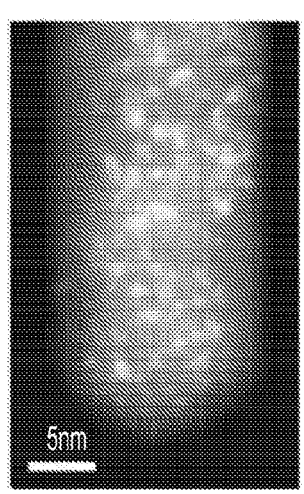
Figure 7F:
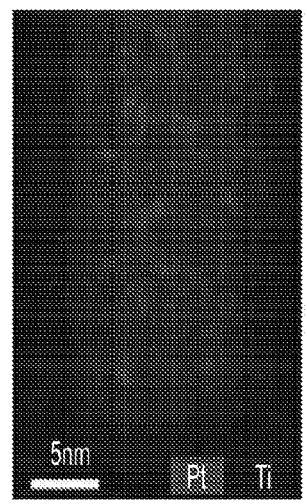

The catalytic performance of the sonicated samples are compared in FIGS. 6E and 6F, in which, no significant changes in the light-off temperatures can be observed over the nano-array based catalysts, while the commercial DOC samples showed degraded catalytic activity due to the loss of materials. The evolution of sample weights of the nano-array based monoliths and the commercial DOC samples are displayed in FIG. 8. As can be seen, there was an 8% and 11% weight loss for the fresh and hydrothermally aged commercial DOC samples, respectively. However, for the nano-array based catalysts, negligible weight loss can be observed during sonication. The excellent mechanical stability of the Pt supported $TiO_2$ nano-array based monolithic catalysts results from the good adherence between the grown nano-arrays and the cordierite substrate. Automotive catalytic converters work in the environment with continuous vibrations, so the mechanical stability is of great importance for the life cycles of the devices. The in-situ grown nano-arrays have a stronger interface with the substrates than the wash-coated layers integrated by binders, therefore, exhibit enhanced mechanical stability and extended service life compared with the wash-coated counterparts.

CONCLUSIONS

Uniform $TiO_2$ nano-arrays were successfully integrated onto the commercial monolithic substrates through a facile microwave-assisted hydrothermal method. Instead of using the conventional one-step hydrolysis hydrothermal method, a two-step sustained-release reaction strategy was designed to achieve the heterogeneous nucleation and growth of $H_2Ti_2O_5.H_2O$ nano-arrays at low temperature (<100° C.) and pressure with controllable reaction rate, which were readily converted into $TiO_2$ nano-arrays through post thermal annealing. By adjusting the initial concentrations of $TiCl_3$, $H_2O_2$ and hydrochloride acid as well as other synthetic parameters, a growth rate of 42 nm/min was achieved. When loaded with 50 g-Pt/ft$^3$, the $TiO_2$ nano-array rooted monolithic catalysts showed excellent low light-off temperatures for CO and HCs species (<150° C.) under LTC-D simulated exhaust conditions. Compared with commercial wash-coated DOC samples, prominent hydrothermal stability and improved mechanical robustness were demonstrated on the samples after hydrothermal aging at 700° C. for 100 hours and sonicated in water for 4 hours and, respectively. This approach provides a new pathway for low-temperature scalable synthesis and manufacturing of $TiO_2$ nano-array integrated catalytic reactors with good production rates and enhanced material utilization efficiency.

REFERENCES (1) Kim, C. H.; Qi, G.; Dahlberg, K.; Li, W. Science 2010, 327, 1624-1627.
(2) Whitesides, G. M.; Crabtree, G. W. Science 2007, 315, 796-798.
(3) Tomašić, V.; Jović, F. Appl. Catal., A 2006, 311, 112-121.
(4) Avila, P.; Montes, M.; Miro, E. E. Chem. Eng. J. 2005, 109, 11-36.
(5) Williams, J. L. Catal. Today 2001, 69, 3-9.
(6) Heck, R. M.; Gulati, S.; Farrauto, R. J. Chem. Eng. J. 2001, 82, 149-156.
(7) Zamaro, J. M.; Ulla, M. A.; Miró, E. E. Chem. Eng. J. 2005, 106, 25-33.
(8) Ren, Z.; Guo, Y.; Gao, P.-X. Catal. Today 2015, 258, 441-453.
(9) Guo, Y.; Ren, Z.; Xiao, W.; Liu, C.; Sharma, H.; Gao, H.; Mhadeshwar, A.; Gao, P.-X. Nano Energy 2013, 2, 873-881.
(10) Wang, S.; Ren, Z.; Guo, Y.; Gao, P.-X. CrystEngComm 2016, 18, 2980-2993.
(11) Gao, P.-X.; Shimpi, P.; Gao, H.; Liu, C.; Guo, Y.; Cai, W.; Liao, K.-T.; Wrobel, G.; Zhang, Z.; Ren, Z. Int. J. Mol. Sci. 2012, 13, 7393-7423.
(12) Du, S.; Tang, W.; Guo, Y.; Binder, A.; Kyriakidou, E. A.; Toops, T. J.; Wang, S.; Ren, Z.; Hoang, S.; Gao, P.-X. Emiss. Control Sci. Technol. 2017, 3, 18-36.
(13) Hoang, S.; Lu, X.; Tang, W.; Wang, S.; Du, S.; Nam, C.-Y.; Ding, Y.; Vinluan III, R. D.; Zheng, J.; Gao, P.-X. Catal. Today 2017.
(14) Tang, W.; Wang, S.; Xiao, W.; Du, S.; Lu, X.; Hoang, S.; Ding, J.; Gao, P.-X. Catal. Today 2017.
(15) Wang, S.; Wu, Y.; Miao, R.; Zhang, M.; Lu, X.; Zhang, B.; Kinstler, A.; Ren, Z.; Guo, Y.; Lu, T. CrystEngComm 2017, 19, 5128-5136.
(16) Weng, J.; Lu, X.; Gao, P.-X. Catalysts 2017, 7, 253.
(17) Tang, W.; Ren, Z.; Lu, X.; Wang, S.; Guo, Y.; Hoang, S.; Du, S.; Gao, P.-X. ChemCatChem 2017.
(18) Du, S.; Tang, W.; Lu, X.; Wang, S.; Guo, Y.; Gao, P. X. Adv. Mater. Interfaces 2017.
(19) Ren, Z.; Wu, Z.; Song, W.; Xiao, W.; Guo, Y.; Ding, J.; Suib, S. L.; Gao, P.-X. Appl. Catal., B 2016, 180, 150-160.
(20) Chen, S.-Y.; Song, W.; Lin, H.-J.; Wang, S.; Biswas, S.; Mollahosseini, M.; Kuo, C.-H.; Gao, P.-X.; Suib, S. L. ACS Appl. Mater. Interfaces 2016, 8, 7834-7842.
(21) Wang, S.; Ren, Z.; Song, W.; Guo, Y.; Zhang, M.; Suib, S. L.; Gao, P.-X. Catal. Today 2015, 258, Part 2, 549-555.
(22) Ren, Z.; Botu, V.; Wang, S.; Meng, Y.; Song, W.; Guo, Y.; Ramprasad, R.; Suib, S. L.; Gao, P.-X. Angew. Chem., Int. Ed. 2014, 53, 7223-7227.
(23) Xiao, W.; Guo, Y.; Ren, Z.; Wrobel, G.; Ren, Z.; Lu, T.; Gao, P.-X. Cryst. Growth Des. 2013, 13, 3657-3664.
(24) Ren, Z.; Guo, Y.; Zhang, Z.; Liu, C.; Gao, P.-X. J. Mater. Chem. A 2013, 1, 9897-9906.
(25) Guo, Y.; Liu, G.; Ren, Z.; Piyadasa, A.; Gao, P.-X. CrystEngComm 2013, 15, 8345-8352.
(26) Guo, Y.; Zhang, Z.; Ren, Z.; Gao, H.; Gao, P.-X. Catal. Today 2012, 184, 178-183.
(27) Jian, D.; Gao, P.-X.; Cai, W.; Allimi, B. S.; Pamir Alpay, S.; Ding, Y.; Wang, Z. L.; Brooks, C. J. Mater. Chem. 2009, 19, 970-975.
(28) Roy, P.; Berger, S.; Schmuki, P. Angew. Chem., Int. Ed. 2011, 50, 2904-2939.
(29) Chen, X.; Mao, S. S. Chem. Rev. 2007, 107, 2891-2959.
(30) Mor, G. K.; Varghese, O. K.; Paulose, M.; Shankar, K.; Grimes, C. A. Sol. Energy Mater. Sol. Cells 2006, 90, 2011-2075.
(31) Linsebigler, A. L.; Lu, G.; Yates Jr, J. T. Chem. Rev. 1995, 95, 735-758.
(32) Lee, J.-C.; Kim, T. G.; Lee, W.; Han, S.-H.; Sung, Y.-M. Cryst. Growth Des. 2009, 9, 4519-4523.
(33) Borras, A.; Sanchez-Valencia, J. R.; Widmer, R.; Rico, V. J.; Justo, A.; Gonzalez-Elipe, A. R. Cryst. Growth Des. 2009, 9, 2868-2876.
(34) In, S.-I.; Almtoft, K. P.; Lee, H.-S.; Andersen, I. H.; Qin, D.; Bao, N.; Grimes, C. Bull. Korean Chem. Soc. 2012, 33, 1989-1992.
(35) Shin, Y.; Lee, S. Nano Lett. 2008, 8, 3171-3173.
(36) Mi, Y.; Wen, L.; Xu, R.; Wang, Z.; Cao, D.; Fang, Y.; Lei, Y. Adv. Energy Mater. 2016, 6.
(37) Xu, Y.; Zhou, M.; Wen, L.; Wang, C.; Zhao, H.; Mi, Y.; Liang, L.; Fu, Q.; Wu, M.; Lei, Y. Chem. Mater. 2015, 27, 4274-4280.
(38) Chen, C.; Chen, Y.; Korotcov, A.; Huang, Y.; Tsai, D.; Tiong, K. Nanotechnology 2008, 19, 075611.

(39) Wu, J.-J.; Yu, C.-C. J. Phys. Chem. B 2004, 108, 3377-3379.
(40) Krishnamoorthy, T.; Thavasi, V.; Ramakrishna, S. Energy Environ. Sci. 2011, 4, 2807-2812.
(41) Feng, X.; Shankar, K.; Varghese, O. K.; Paulose, M.; Latempa, T. J.; Grimes, C. A. Nano Lett. 2008, 8, 3781-3786.
(42) Liu, B.; Aydil, E. S. J. Am. Chem. Soc. 2009, 131, 3985-3990.
(43) Kandiel, T. A.; Dillert, R.; Feldhoff, A.; Bahnemann, D. W. J. Phys. Chem. C 2010, 114, 4909-4915.
(44) Buonsanti, R.; Carlino, E.; Giannini, C.; Altamura, D.; De Marco, L.; Giannuzzi, R.; Manca, M.; Gigli, G.; Cozzoli, P. D. J. Am. Chem. Soc. 2011, 133, 19216-19239.
(45) Cho, I. S.; Chen, Z.; Forman, A. J.; Kim, D. R.; Rao, P. M.; Jaramillo, T. F.; Zheng, X. Nano Lett. 2011, 11, 4978-4984.
(46) Gupta, S.; Tripathi, M. Open Chem. 2012, 10, 279-294.
(47) Malekshahi Byranvand, M.; Nemati Kharat, A.; Fatholahi, L.; Malekshahi Beiranvand, Z. J. Nanostruct. 2013, 3, 1-9.
(48) Yan, J.; Wei, T.; Qiao, W.; Shao, B.; Zhao, Q.; Zhang, L.; Fan, Z. Electrochim. Acta 2010, 55, 6973-6978.
(49) Baghbanzadeh, M.; Carbone, L.; Cozzoli, P. D.; Kappe, C. O. Angew. Chem., Int. Ed. 2011, 50, 11312-11359.
(50) Tsuji, M.; Hashimoto, M.; Nishizawa, Y.; Kubokawa, M.; Tsuji, T. Chem. Eur. J. 2005, 11, 440-452.
(51) Zhu, Y. J.; Wang, W. W.; Qi, R. J.; Hu, X. L. Angew. Chem. 2004, 116, 1434-1438.
(52) Sundaresan, S. G.; Davydov, A. V.; Vaudin, M. D.; Levin, I.; Maslar, J. E.; Tian, Y.-L.; Rao, M. V. Chem. Mater. 2007, 19, 5531-5537.
(53) Mao, X.; Yang, X.; Wu, J.; Tian, W.; Rutledge, G. C.; Hatton, T. A. Chem. Mater. 2015, 27, 4574-4585.
(54) Toulemon, D.; Pichon, B. P.; Leuvrey, C. d.; Zafeiratos, S.; Papaefthimiou, V.; Cattoën, X.; Bégin-Colin, S. Chem. Mater. 2013, 25, 2849-2854.
(55) Horikoshi, S.; Serpone, N., Microwaves in nanoparticle synthesis: fundamentals and applications. John Wiley & Sons: 2013.
(56) Wang, H.-E.; Zheng, L.-X.; Liu, C.-P.; Liu, Y.-K.; Luan, C.-Y.; Cheng, H.; Li, Y. Y.; Martinu, L.; Zapien, J. A.; Bello, I. J. Phys. Chem. C 2011, 115, 10419-10425.
(57) Parmar, K.; Ramasamy, E.; Lee, J.; Lee, J. S. Chem Commun 2011, 47, 8572-8574.
(58) Huang, C.-H.; Yang, Y.-T.; Doong, R.-A. Microporous Mesoporous Mater. 2011, 142, 473-480.
(59) Zhang, P.; Yin, S.; Sato, T. Appl. Catal., B 2009, 89, 118-122.
(60) Ribbens, S.; Meynen, V.; Van Tendeloo, G.; Ke, X.; Mertens, M.; Maes, B.; Cool, P.; Vansant, E. Microporous Mesoporous Mater. 2008, 114, 401-409.
(61) Ding, K.; Miao, Z.; Liu, Z.; Zhang, Z.; Han, B.; An, G.; Miao, S.; Xie, Y. J. Am. Chem. Soc. 2007, 129, 6362-6363.
(62) Wilson, G. J.; Matijasevich, A. S.; Mitchell, D. R.; Schulz, J. C.; Will, G. D. Langmuir 2006, 22, 2016-2027.
(63) Hart, J.; Cervini, R.; Cheng, Y.-B.; Simon, G.; Spiccia, L. Sol. Energy Mater. Sol. Cells 2004, 84, 135-143.
(64) Shen, P.-S.; Tseng, C.-M.; Kuo, T.-C.; Shih, C.-K.; Li, M.-H.; Chen, P. Solar Energy 2015, 120, 345-356.
(65) He, Z.; Liu, J.; Miao, J.; Liu, B.; Tan, T. T. Y. J. Mater. Chem. C 2014, 2, 1381-1385.
(66) Xue, B.; Sun, T.; Mao, F.; Sun, L.-C.; Yang, W.; Xu, Z.-D.; Zhang, X. Mater. Res. Bull. 2011, 46, 1524-1529.
(67) Wang, X.; Liu, Y.; Zhou, X.; Li, B.; Wang, H.; Zhao, W.; Huang, H.; Liang, C.; Yu, X.; Liu, Z. J. Mater. Chem. 2012, 22, 17531-17538.
(68) Aftertreatment Protocols for Catalyst Characterization and Performance Evaluation: Low Temperature Oxidation Catalyst Test Protocol. http://cleers.org/ltat-protocols.
(69) Lei, Y.; Zhang, L.; Fan, J. Phys. Chem. Lett. 2001, 338, 231-236.
(70) Porto, S.; Fleury, P.; Damen, T. Phys. Rev. 1967, 154, 522.
(71) Benkoula, S.; Sublemontier, O.; Patanen, M.; Nicolas, C.; Sirotti, F.; Naitabdi, A.; Gaie-Levrel, F.; Antonsson, E.; Aureau, D.; Ouf, F.-X. Sci. Rep. 2015, 5, 15088.
(72) Umrao, S.; Abraham, S.; Theil, F.; Pandey, S.; Ciobota, V.; Shukla, P.; Rupp, C. J.; Chakraborty, S.; Ahuja, R.; Popp, J. RSC Adv. 2014, 4, 59890-59901.
(73) Molina, C.; Dahmouche, K.; Hammer, P.; Bermudez, V. d. Z.; Carlos, L. D.; Ferrari, M.; Montagna, M.; Gonçalves, R. R.; Oliveira, L.; Edwards, H. J. Braz. Chem. Soc. 2006, 17, 443-452.
(74) Paunović, P.; Grozdanov, A.; Češnovar, A.; Makreski, P.; Gentile, G.; Ranguelov, B.; Fidančevska, E. J. Eng. Mater. Technol. 2015, 137, 021003.
(75) Tang, A.; Deng, Y.; Jin, J.; Yang, H. Sci. World J. 2012, 2012.
(76) Xu, S.; Wang, Z. L. Nano Res. 2011, 4, 1013-1098.
(77) Vayssieres, L.; Keis, K.; Lindquist, S.-E.; Hagfeldt, A. J. Phys. Chem. B 2001, 105, 3350-3352.
(78) Liao, Y.; Que, W.; Jia, Q.; He, Y.; Zhang, J.; Zhong, P. J. Mater. Chem. 2012, 22, 7937-7944.
(79) Zhong, D.; Cai, B.; Wang, X.; Yang, Z.; Xing, Y.; Miao, S.; Zhang, W.-H.; Li, C. Nano Energy 2015, 11, 409-418.
(80) Majewski, W.; Khair, M., Commercial DOC Technologies. Revision: 2011.
(81) Oku, M.; Matsuta, H.; Wagatsuma, K.; Waseda, Y.; Kohiki, S., J. Electron Spectrosc. Relat. Phenom. 1999, 105 (2), 211-218.

Example #2

Materials and Methods

The mesoporous $TiO_2$ nano-array was integrated onto cordierite honeycomb monolith via a solvothermal synthesis using titanium (IV) butoxide as Ti precursor and butanone as nonpolar solvent. Pt was loaded on to the $TiO_2$ nano-array/cordierite using Na-promoted wet incipient impregnation. The Pt/$TiO_2$ nanoarrays were calcined at 500° C. for 4 hours with a ramping rate of 2° C. min$^{-1}$. The DOC activity of the Pt/$TiO_2$ nanoarray/cordierite honeycomb monolith was evaluated using the protocol developed by the ACEC tech team for conventional diesel combustion at a space velocity of 60,000 h$^{-1}$. The composition of the simulated exhaust is 500 ppm CO, 389 ppm $C_2H_6$, 156 ppm $C_3H_6$, 52 ppm $C_3H_8$, 200 ppm NO, 100 ppm $H_2$, 6% $CO_2$, 6% $H_2O$, 12% $O_2$, and balance $N_2$. The BET surface area of the catalysts was measured on Micromeritics ASAP P2020 Automatic Chemisorption Analyzer.

Figure 22A:
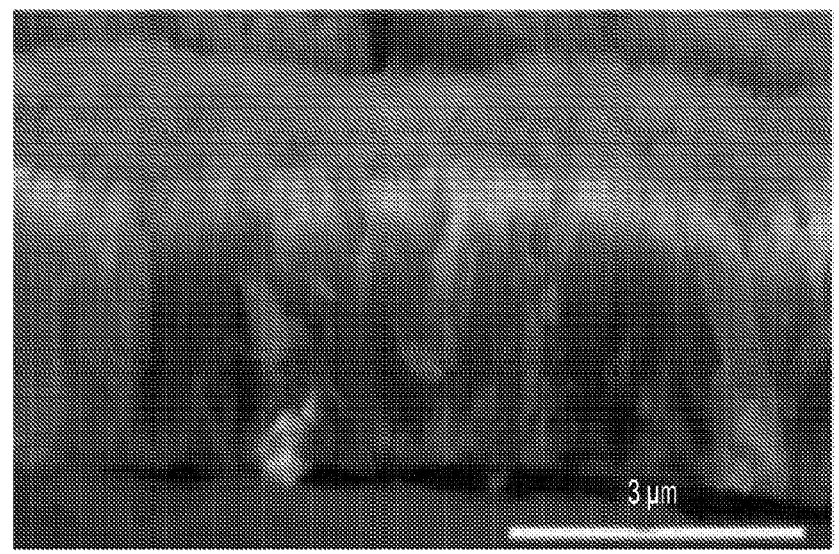
FIG. 22A is an SEM image of a $TiO_2$ nanowire array (NA).
Figure 22B:
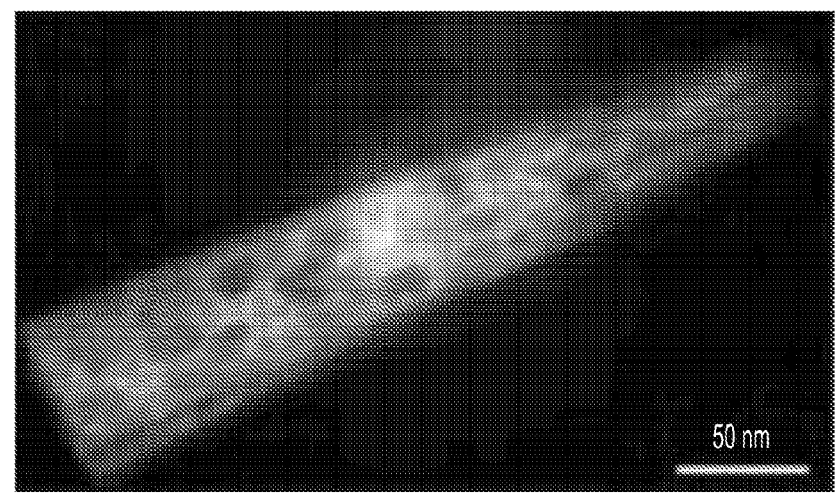
FIG. 22B is a HAADF STEM image of a $TiO_2$ nanowire array. The array of dark spots indicates the unique mesoporosity of the $TiO_2$ nanowire.
Figures 22C, 22D:
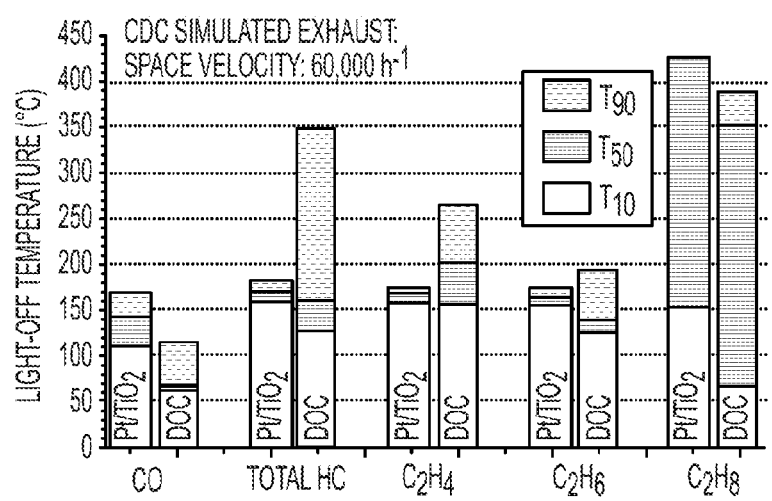
FIG. 22C is a table summarizing BET surface area of $TiO_2$ and Pt/$TiO_2$ surface area; HT aged Pt/$TiO_2$ sample were prepared by aging Pt/$TiO_2$ at 650° C. in a flow of 10% $H_2O$ in air for 100 hours.
FIG. 22D is a chart of light-off temperature of Pt/$TiO_2$ nanoarrays in CDC simulated exhaust. A commercial DOC catalyst based on Pt—Pd/$Al_2O_3$—$ZrO_2$ washcoat was used as a benchmark.
Figure 23A:
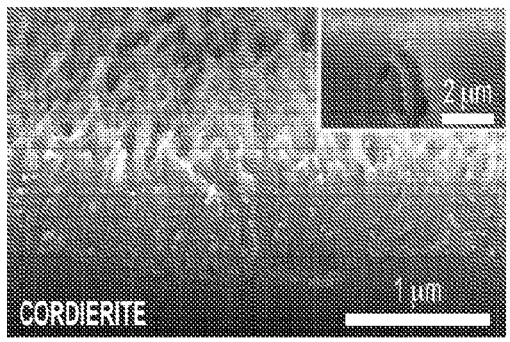
FIGS. 23A-F are SEM images of the $TiO_2$ nano-arrays integrated onto various substrate surfaces.
Figure 23B:
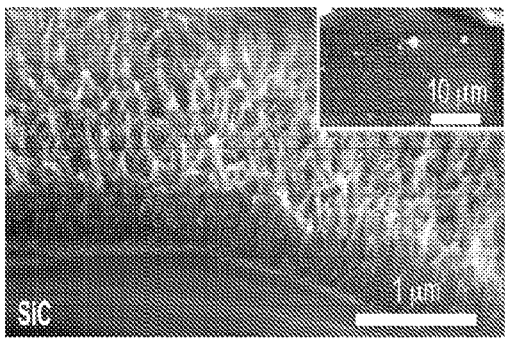
Figure 23C:
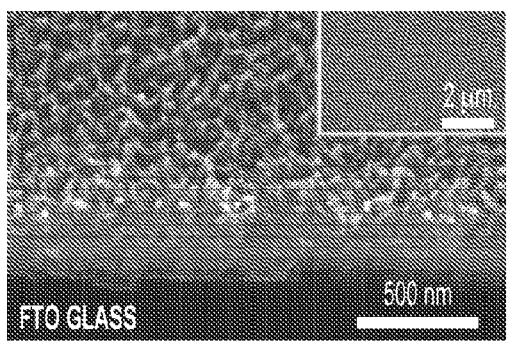
Figure 23D:
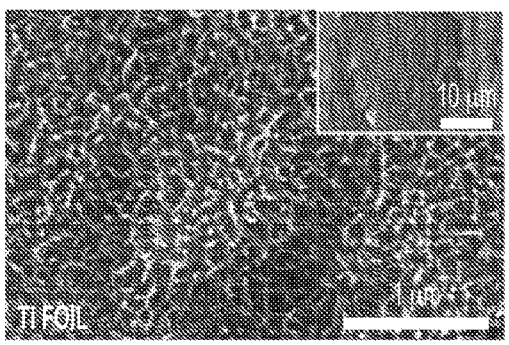
Figure 23E:
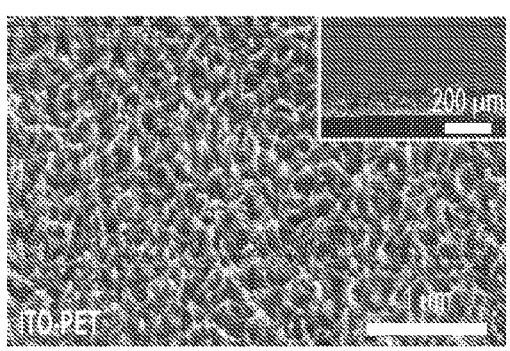
Figure 23F:
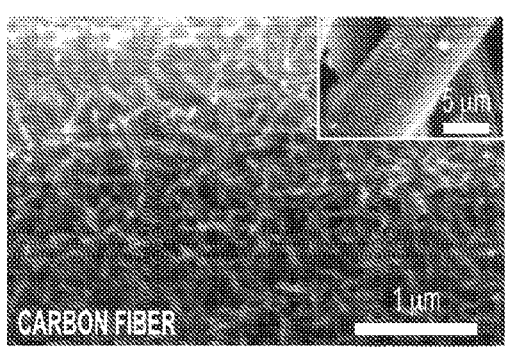
Figure 24A:
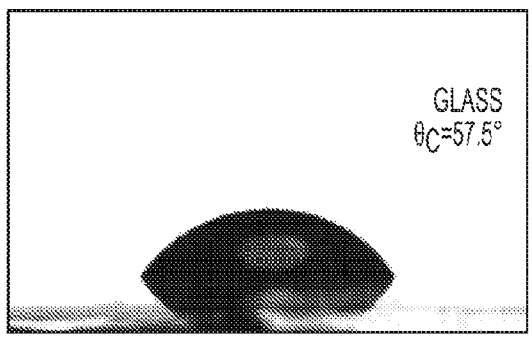
FIGS. 24A-H are photographs of water contact angles on various pristine substrate surfaces and the corresponding nanoarrays rooted surfaces.
Figure 24B:
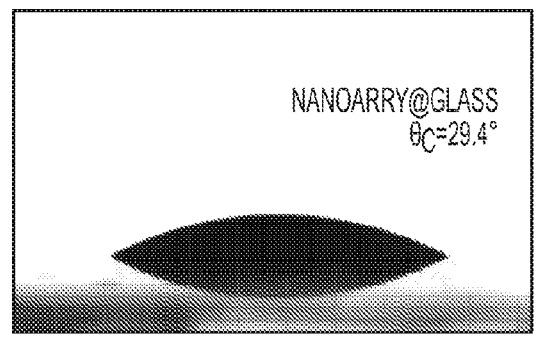
Figure 24C:
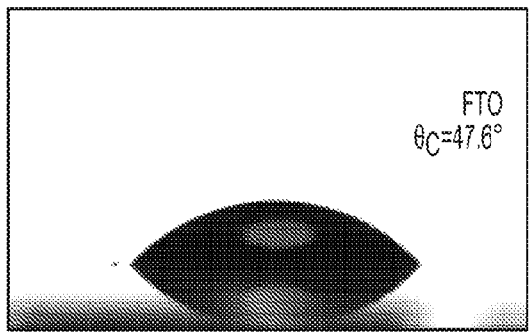
Figure 24D:
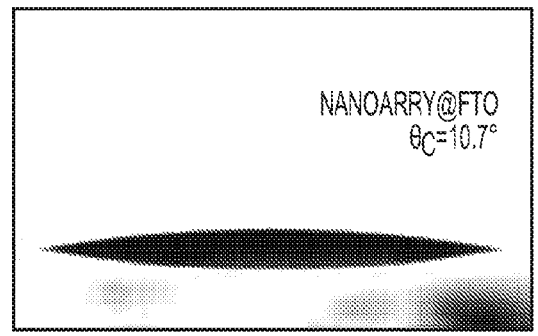
Figure 24E:
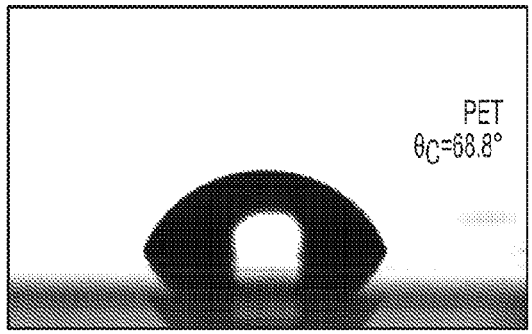
Figure 24F:
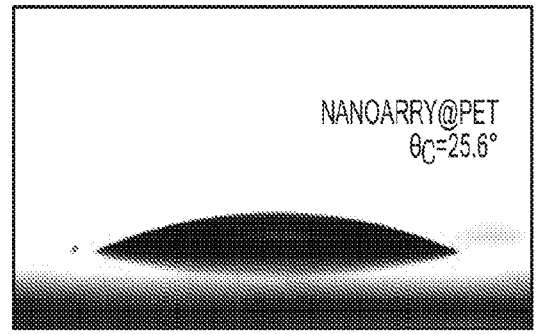
Figure 24G:
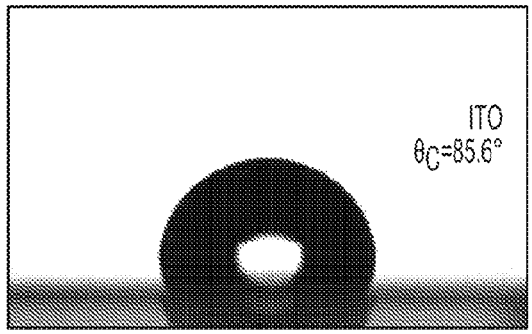
Figure 24H:
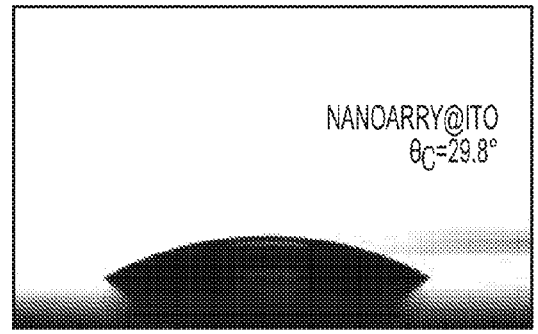

Results and Discussion $TiO_2$ nanowires with diameters of ~50-150 nm were uniformly grown on the monolith wall with a thickness of ~3-4 µm (FIG. 22A). Each nanowire is composed of several smaller nanowires, forming a unique mesoporous structure. The high annual angular dark field (HAADF) scanning transmission electron microscopy (STEM) image of the nanowire reveal an array of voids with diameters ranging from 3-30 nm on the nanowire (FIG. 22B). This unique mesoporous structure might explain the exceptionally high surface area of the $TiO_2$ nanoarray/cordierite substrate. The BET surface area of the fresh $TiO_2$/cordierite sample can reach 92.3 $m^2$ $g^{-1}$. However, after the Pt impregnation process, the surface area reduced significantly, to 7.7 $m^2$ $g^{-1}$. The Pt/$TiO_2$ nanoarray has high thermal stability. Significant morphological changes in the Pt/$TiO_2$ sample were not observed after the hydrothermal aging process at 650° C. for 100 hours, although the BET surface area was decreased slightly to 6.1 $m^2$ $g^{-1}$. The light-off temperatures for the Pt/$TiO_2$ nanoarray sample with a Pt loading of 0.71 g $L^{-1}$ for CO and hydrocarbons in CDC simulated exhaust conditions, indicating an exceptional DOC activity. The temperature $T_{90}$ for both CO and HCs approaches the 170° C. in the CDC simulated exhaust test, significantly lower than that of a commercial DOC catalyst while using much fewer catalyst materials. The enhanced reactivity of the Pt/$TiO_2$ nanoarray might be explained by the unique mesoporous nano-array structure that enhancing gas-solid interaction, metal-support electronic interaction.

Significance

The Pt supported $TiO_2$ nanoarray catalyst has excellent low-temperature activity for CO and hydrocarbon combustion.

Example #3

With the optimized recipe and experimental conditions, $TiO_2$ nano-arrays were also successfully integrated onto various solid surfaces of different materials, including 3D SiC monoliths, 2D FTO glass, ITO coated PET film and Ti metal foil as well as 1D carbon fibers (FIGS. 23A-F).

The versatility of this facile hydrothermal method was demonstrated in two aspects. On the one hand, growing nano-arrays onto 3D monolithic substrates is more challenging than onto the 2D planar substrates due to the difficulty in mass transfer of the precursors through the space confined channels. In this work, the mass transfer was enhanced by the large amount of $O_2$ bubbles created during the reaction, indicating the feasibility of applying this method on different substrates with complex geometric structures.

On the other hand, this method has been applied on a wide range of substrate materials from hard ceramic surfaces to flexible polymer films, metal foils and carbon fibers. Practically, this versatile synthetic method shall to be suitable for the fast integration of $TiO_2$ nano-arrays on solid materials that can withstand the oxidizing and acidic conditions. Therefore, this facile microwave-assisted hydrothermal method shows potential applications on various substrate surfaces for different applications.

Integrating uniform nanostructure array coatings on solid substrate can significantly change the surface properties of the substrates. This facile hydrothermal method can provide an easy way to alternate the surface properties of different solid substrates with low temperature and high production rate.

One of the important surface properties of solid substrate materials is the wettability. The wettability of various pristine substrate surfaces and the corresponding nanoarrays rooted surfaces. As shown in FIGS. 24A-H, compared with the water contact angles of the pristine surfaces, the nano-array rooted surfaces show much smaller contact angles. That is because of the hydrophilic nature of the nanoarrays. Such features are highly favorable for the applications in aqueous or humid environment.

Figure 25A:
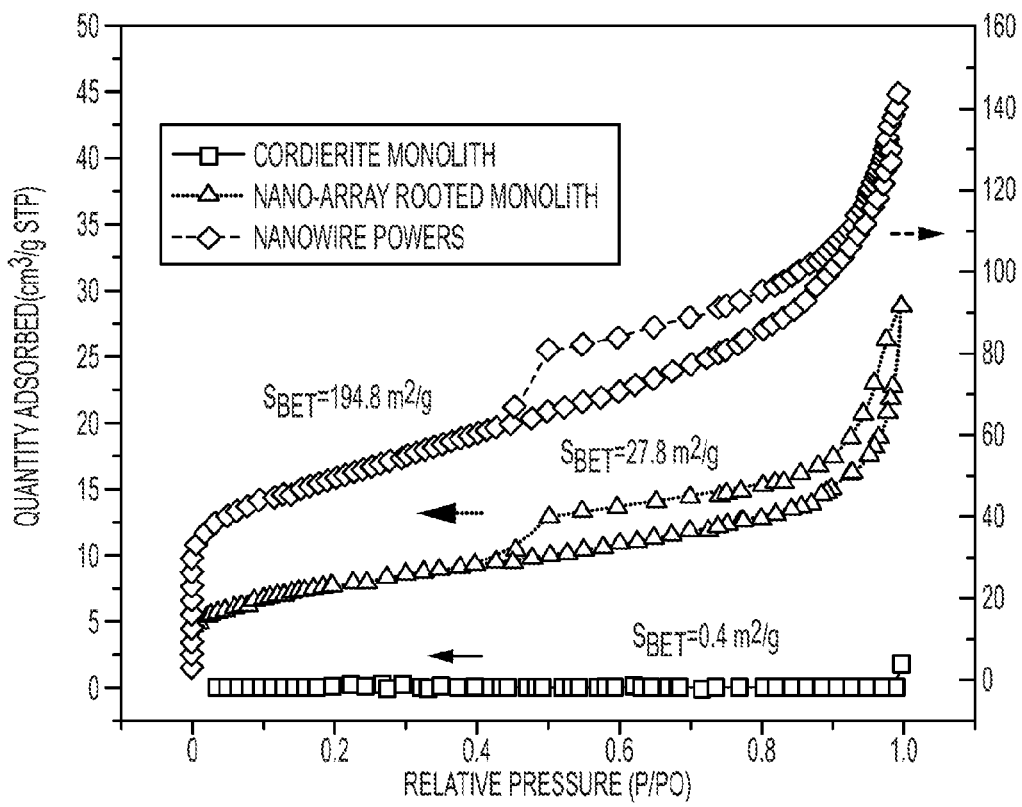
FIG. 25A is BET $N_2$ adsorption-desorption isotherms of bare cordierite monolith, nano-array rooted monolith and nanowire powders.
Figure 25B:
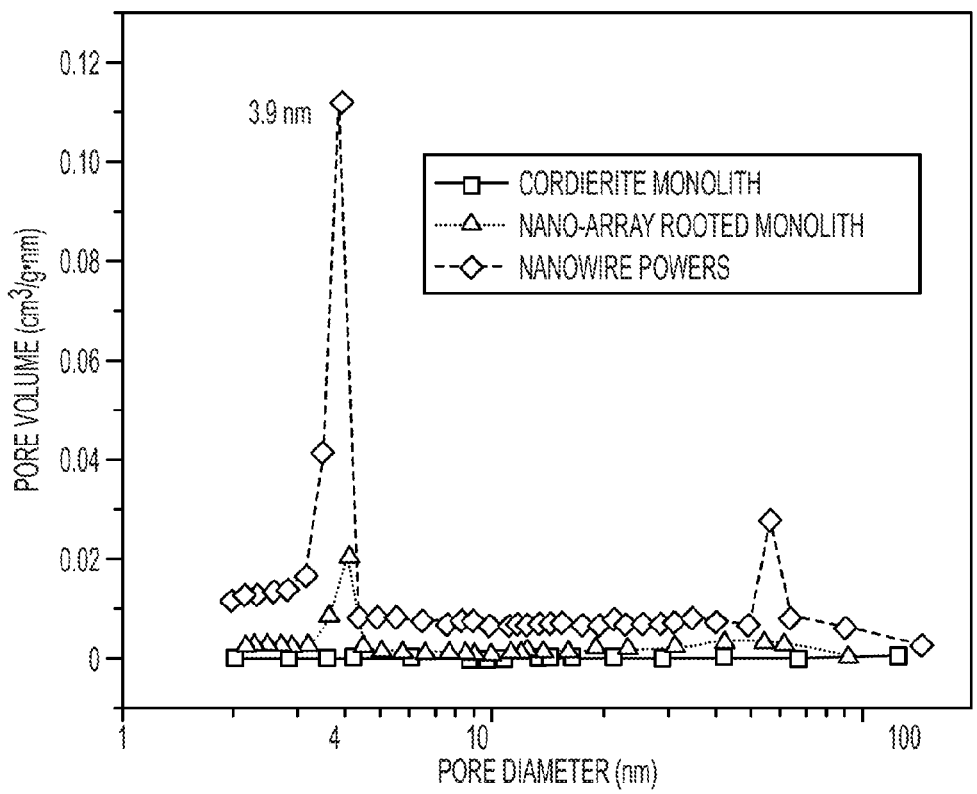
FIG. 25B is pore size distribution of bare cordierite monolith, nano-array rooted monolith and nanowire powders.

Another important surface property is the specific surface area. FIGS. 25A and 25B show the BET $N_2$ adsorption-desorption isotherms (FIG. 25A) and pore size distribution of bare cordierite monolith, nano-array rooted monolith and nanowire powders (FIG. 25B). As can be seen, the as-synthesized nano-wire powders exhibit very high specific surface area of 194 $m^2$/g (red line in FIG. 25A). When integrated on cordierite monolith, the specific surface are of the monolith increases from 0.4 $m^2$/g (black line in FIG. 25A) to 27.8 $m^2$/g (black line in FIG. 25A). FIG. 25B shows similar pore size distribution between the nanowire powders and the nano-array rooted monolith, indicating that the high surface area mainly comes from the nano-array coating layers. The high surface area is important for the catalyst supporting materials such as cordierite to promote the catalytic reactions in gaseous environment.

INCORPORATION BY REFERENCE; EQUIVALENTS

The teachings of all patents, published applications and references cited herein are incorporated by reference in their entirety.

While the invention has been described with reference to example embodiments, it will be understood by those skilled in the art that various changes may be made and equivalents may be substituted for the elements thereof without departing from the scope of the invention. In addition, many modifications may be made to adapt the teaching of the invention to particular use, application, manufacturing conditions, use conditions, composition, medium, size, and/or materials without departing from the essential scope and spirit of the invention. Therefore, it is intended that the invention not be limited to the particular embodiments and best mode contemplated for carrying out this invention as described herein.

While various aspects and embodiments have been disclosed herein, other aspects and embodiments will be apparent to those skilled in the art. The various aspects and embodiments disclosed herein are for purposes of illustration and are not intended to be limiting of the true scope of the invention disclosed herein. It is also to be understood that the terminology used herein is for the purpose of describing particular embodiments only, and is not intended to be limiting. Since many modifications, variations, and changes in detail can be made to the described examples, it is intended that all matters in the preceding description and shown in the accompanying figures be interpreted as illustrative and not in a limiting sense.

Chemical compounds are described using standard nomenclature. For example, any position not substituted by any indicated group is understood to have its valency filled by a bond as indicated, or a by hydrogen atom.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and words of a similar nature in the context of describing the improvements disclosed herein (especially in the context of the following claims) are to be construed to cover both the singular and the plural, unless otherwise indicated herein or clearly contradicted by context. Further, it should further be noted that the terms "first," "second," and the like herein do not denote any order, quantity, or relative importance, but rather are used to distinguish one element from another. The modifier "about" used in connection with a quantity is inclusive of the stated value and has the meaning dictated by the context (e.g., it includes, at a minimum the degree of error associated with measurement of the particular quantity).

All methods described herein can be performed in any suitable order unless otherwise indicated herein or otherwise clearly contradicted by context. The use of any and all examples, or exemplary language (e.g., "such as"), is intended merely to better illustrate the invention and does not pose a limitation on the scope of the invention or any embodiments unless otherwise claimed.

What is claimed is:

1. A method of making a hydrogen titanate nanowire array, the method comprising: contacting a substrate with a solvent comprising a titanium (III) precursor, an acid, and an oxidant while microwave heating the solvent, thereby forming a hydrogen titanate nanowire array.

2. The method of claim 1, wherein the substrate comprises a cordierite honeycomb monolith.

3. The method of claim 1, wherein the solvent is a polar solvent.

4. The method of claim 1, wherein the solvent is a protic solvent.

5. The method of claim 1, wherein the solvent is water.

6. The method of claim 1, wherein the titanium (III) precursor is $TiCl_3$.

7. The method of claim 1, wherein the titanium (III) precursor is $Ti_2(SO_4)_3$.

8. The method of claim 1, wherein the titanium (III) precursor is a titanium (III) alkoxide.

9. The method of claim 1, wherein the acid is hydrochloric acid (HCl).

10. The method of claim 9, wherein the acid is from about 25 wt. % to about 40 wt. % HCl.

11. The method of claim 1, wherein the acid is sulfuric acid ($H_2SO_4$).

12. The method of claim 1, wherein the oxidant is hydrogen peroxide.

13. The method of claim 12, wherein the hydrogen peroxide is from about 20 wt. % to about 40 wt. % in water.

14. The method of claim 1, wherein the solvent is heated by microwave heating to a temperature from about 75° C. to about 95° C.

15. The method of claim 1, wherein the solvent is heated by microwave heating for a duration from about 10 minutes to about 180 minutes.

16. The method of claim 1, further comprising annealing the hydrogen titanate nanowire array to form a TiO2 nanowire array.

17. The method of claim 16, wherein annealing is performed at a temperature from about 300° C. to about 800° C.

18. The method of claim 1, wherein the solvent is a second solvent, the method further comprising contacting the substrate with a first solvent comprising a titanium (IV) precursor and a first acid prior to contacting the substrate with the second solvent.

19. The method of claim 18, further comprising sonicating while contacting the substrate with the first solvent.

20. The method of claim 18, wherein the titanium (IV) precursor comprises one or more of titanium (IV) isopropoxide, titanium (IV) n-butoxide, and titanium (IV) chloride.

21. The method of claim 20, wherein the titanium (IV) precursor comprises titanium (IV) isopropoxide.

22. The method of claim 18, wherein the first solvent is a polar solvent.

23. The method of claim 18, wherein the first solvent is a protic solvent.

24. The method of claim 18, wherein the first solvent is an alcohol.

25. The method of claim 18, wherein the first solvent is ethanol.

26. The method of claim 18, wherein the first acid is $HNO_3$.

27. The method of claim 18, further comprising drying the substrate after contacting the substrate with the first solvent, and subsequently contacting the substrate with the first solvent prior to contacting the substrate with the second solvent.

28. The method of claim 18, further comprising annealing the substrate after contacting the substrate with the first solvent and prior to contacting the substrate with the second solvent.

29. The method of claim 16, further comprising loading a platinum group metal onto the titanium dioxide ($TiO_2$) nanowire array, the method further comprising:
   contacting the $TiO_2$ nanowire array with a third solvent comprising a platinum group metal precursor, wherein the platinum group metal precursor comprises one or more of platinum, palladium, and rhodium;
   drying the $TiO_2$ nanowire array;
   calcining the $TiO_2$ nanowire array; and
   annealing the $TiO_2$ nanowire array in the presence of hydrogen.

30. The method of claim 29, wherein the platinum group metal precursor comprises platinum.

31. The method of claim 30, where the platinum is platinum (II).

32. The method of claim 29, wherein the platinum group metal precursor comprises tetraammineplatinum (II) nitrate.

33. The method of claim 29, further comprising sonicating while contacting the $TiO_2$ nanowire array with the third solvent.

34. The method of claim 29, further comprising contacting the $TiO_2$ nanowire array with a third solvent, drying the $TiO_2$ nanowire array, and calcining the $TiO_2$ nanowire array a plurality of times prior to annealing the $TiO_2$ nanowire array.

35. The method of claim 1, wherein the hydrogen titanate nanowire array comprises $H_2Ti_2O_5 \cdot H_2O$.

* * * * *